(12) United States Patent
Baselmans et al.

(10) Patent No.: US 10,996,567 B2
(45) Date of Patent: May 4, 2021

(54) LITHOGRAPHIC APPARATUS AND METHOD

(71) Applicant: ASML Netherlands B.V., Veldhoven (NL)

(72) Inventors: Johannes Jacobus Matheus Baselmans, Oirschot (NL); Bart Smeets, Bilzen (BE); Cristina Ioana Toma, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/622,250

(22) PCT Filed: May 31, 2018

(86) PCT No.: PCT/EP2018/064330
§ 371 (c)(1),
(2) Date: Dec. 12, 2019

(87) PCT Pub. No.: WO2018/228820
PCT Pub. Date: Dec. 20, 2018

(65) Prior Publication Data
US 2020/0117093 A1 Apr. 16, 2020

(30) Foreign Application Priority Data
Jun. 14, 2017 (EP) .................................... 17175902

(51) Int. Cl.
*G03F 7/20* (2006.01)
(52) U.S. Cl.
CPC .................................. *G03F 7/706* (2013.01)

(58) Field of Classification Search
CPC ....... G03F 7/705; G03F 7/706; G03F 7/70491
(Continued)

(56) References Cited

U.S. PATENT DOCUMENTS 9,261,402 B2  2/2016  Baselmans
9,588,438 B2  3/2017  Hsu et al.
(Continued)

FOREIGN PATENT DOCUMENTS

JP   2003-318090 A   11/2003
JP   2010-113352 A    5/2010
(Continued)

OTHER PUBLICATIONS

International Search Report and Written Opinion of the International Searching Authority directed to related International Patent Application No. PCT/EP2018/064330, dated Sep. 17, 2018; 8 pages.
(Continued)

*Primary Examiner* — Hung Nguyen
(74) *Attorney, Agent, or Firm* — Sterne, Kessler, Goldstein & Fox P.L.L.C.

(57) ABSTRACT

A method for quantifying the effect of pupil function variations on a lithographic effect within a lithographic apparatus is disclosed. The method comprises: determining a discrete, two-dimensional sensitivity map in a pupil plane of the lithographic apparatus, wherein the lithographic effect is given by the inner product of said sensitivity map with a discrete, two-dimensional pupil function variation map of a radiation beam in the pupil plane. The pupil plane of a lithographic apparatus generally refers to the exit pupil of a
(Continued)

projection system of the lithographic apparatus. Pupil function variations may comprise: relative phase variations within the pupil plane and/or relative intensity variations within the pupil plane.

16 Claims, 27 Drawing Sheets

(58) Field of Classification Search
USPC .......................................................... 355/77
See application file for complete search history.

(56) References Cited

U.S. PATENT DOCUMENTS

| | | | |
|---|---|---|---|
| 9,645,509 | B2 | 5/2017 | Cao et al. |
| 9,934,346 | B2 | 4/2018 | Hansen |
| 2005/0091013 | A1 | 4/2005 | Gallatin et al. |
| 2008/0273180 | A1* | 11/2008 | Roux .................. G03F 7/70308 355/30 |
| 2009/0225293 | A1 | 9/2009 | Shigenobu et al. |
| 2016/0274462 | A1* | 9/2016 | Borges Nicolau .... G03F 7/2026 |
| 2017/0038692 | A1* | 2/2017 | Hsu ..................... G03F 7/70125 |

FOREIGN PATENT DOCUMENTS

| | | |
|---|---|---|
| JP | 2012-104821 A | 5/2012 |
| JP | 2013-145880 A | 7/2013 |
| WO | WO 2016/086056 A1 | 6/2016 |

OTHER PUBLICATIONS

International Preliminary Report on Patentability directed to related International Patent Application No. PCT/EP2018/064330, dated Dec. 17, 2019; 6 pages.

Hart B., "Quantifying wavefront measurement variation with standard deviation maps," SPIE, Optical Engineering, vol. 50, No. 5, May 2011; 7 pages.

Wang et al., "Zernike wavefront sensor (ZWFS) development for Low Order Wavefront Sensing (LOWFS)," SPIE, Space Telescopes and Instrumentation 2016: Optical, Infrared, and Millimeter Wave , vol. 9904, Jul. 29, 2016; pp. 1-9.

Notice of Reasons for Rejection directed to related Japanese Patent Application No. 2019-564125, dated Nov. 13, 2020; 9 pages.

\* cited by examiner

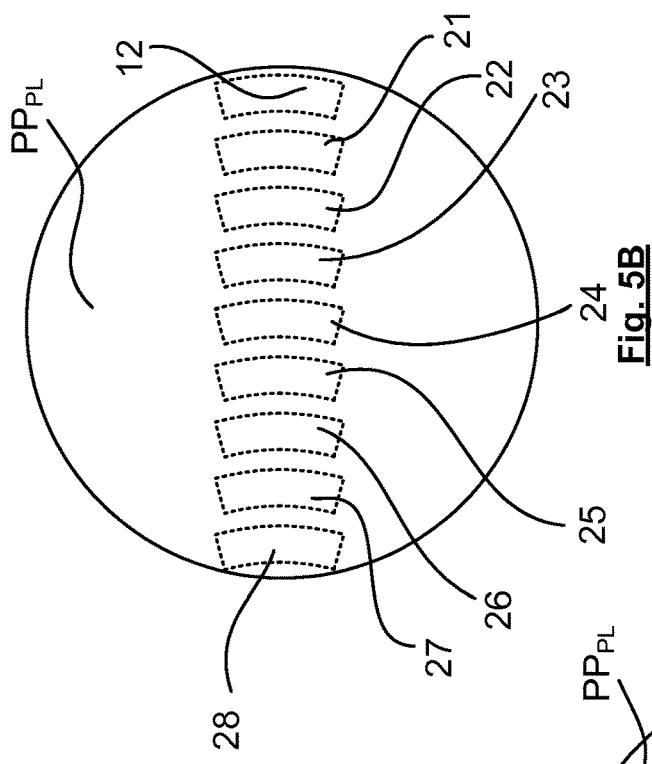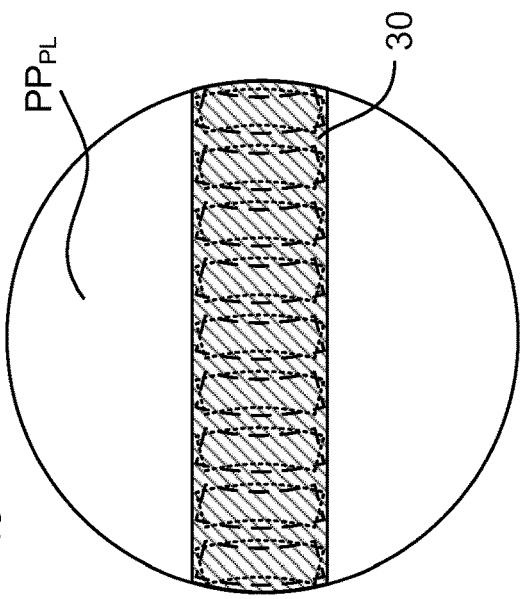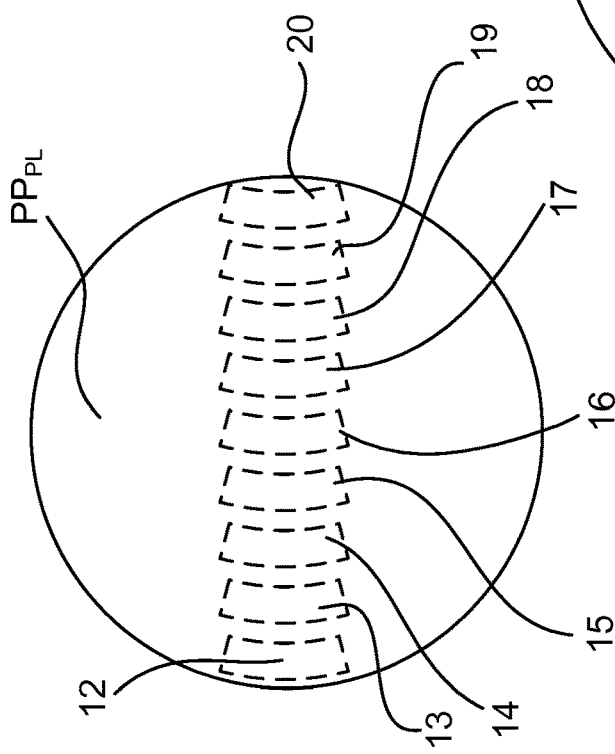

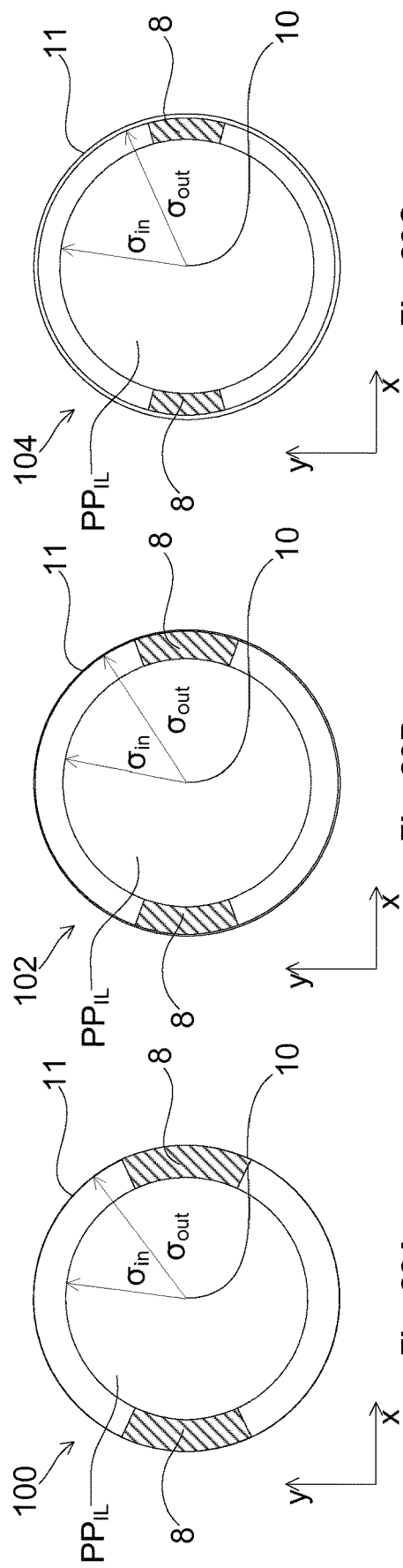

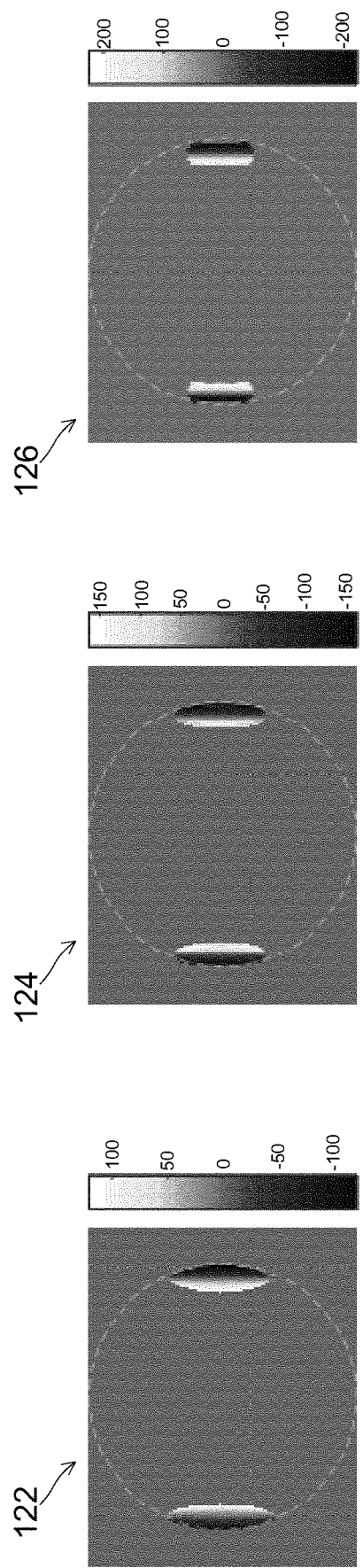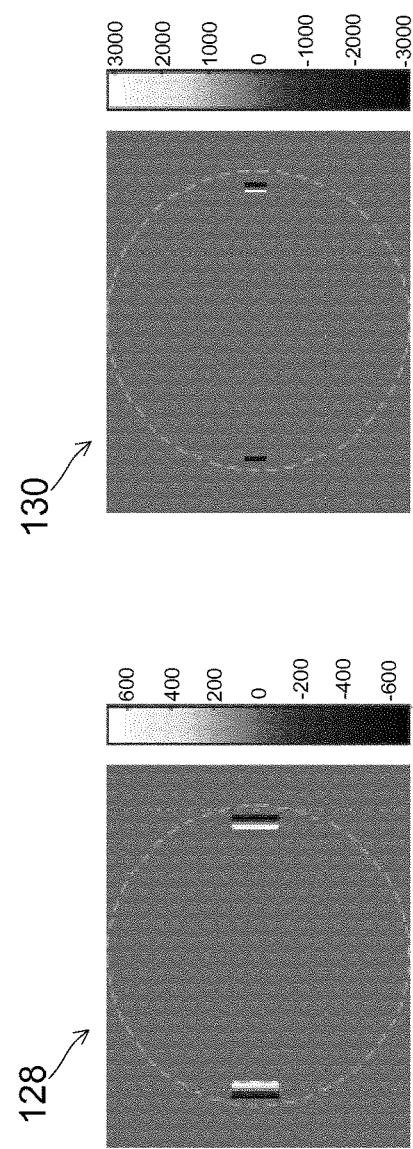
Fig. 27A  Fig. 27B  Fig. 27C  Fig. 27D  Fig. 27E

LITHOGRAPHIC APPARATUS AND METHOD

CROSS-REFERENCE TO RELATED APPLICATIONS

This applications claims priority of EP 17175902.0 which was filed on 14 Jun. 2017 and which is incorporated herein in its entirety by reference.

FIELD

The present invention relates to a method for quantifying the effect of an aberration on a lithographic quantity within a lithographic apparatus.

BACKGROUND

A lithographic apparatus is a machine that applies a desired pattern onto a target region of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target region (e.g. comprising part of, one or several dies) on a substrate (e.g. a silicon wafer) that has a layer of radiation-sensitive material (resist). In general, a single substrate will contain a network of adjacent target regions that are successively exposed. Known lithographic apparatus include so-called steppers, in which each target region is irradiated by exposing an entire pattern onto the target region in one go, and so-called scanners, in which each target region is irradiated by scanning the pattern through the beam in a given direction (the "scanning"-direction) while synchronously scanning the substrate parallel or anti parallel to this direction.

For a perfect optical system that focuses radiation from each point in an object plane to a point in an image plane the wavefront of the radiation may be perfectly spherical as it approaches the image plane. Real optical systems introduce aberrations which result in distortion of this spherical wavefront. Such aberrations result in various lithographic effects (for example, offset and focus errors) or errors in the image formed on a wafer. It is desirable to be able to control such lithographic effects (i.e. to be able to quantify them and at least partially correct for them)

It is desirable to provide a methods and apparatus for quantifying and controlling the effects of aberrations that at least partially address one or more of the problems of the prior art, whether identified herein or elsewhere.

SUMMARY

According to a first aspect of the invention, there is provided a method for quantifying the effect of pupil function variations on a lithographic effect within a lithographic apparatus, the method comprising: determining a discrete, two-dimensional sensitivity map in a pupil plane of the lithographic apparatus, wherein the lithographic effect is given by the inner product of said sensitivity map with a discrete, two-dimensional pupil function variation map of a radiation beam in the pupil plane.

It will be appreciated that a map in a pupil plane of the lithographic apparatus is intended to mean a two dimensional function, distribution or mapping in said pupil plane. It will be further appreciated that the inner product of two such maps may be given by the product of the two maps integrated or summed over the pupil plane. It will be appreciated that a discrete, two-dimensional map comprises a two-dimensional array of pixels. For two discrete, two-dimensional maps in the pupil plane the inner product is given by the sum over all pixels of the product of the two maps.

It will be appreciated by the skilled person that, in this context, the pupil plane of a lithographic apparatus generally refers to the exit pupil of a projection system of the lithographic apparatus. This is the image of a physical stop or aperture (located within the projection system) on the image side of the projection system (i.e. the wafer side). This pupil plane is a Fourier transform plane of an image plane of the lithographic apparatus in which an image is formed. It will be further appreciated by the skilled person that the intensity (or, equivalently, the electric field strength) distribution of radiation in the illumination pupil plane (also known as the pupil shape) characterizes the angular distribution of the light cone at the wafer level (i.e. in the image plane). The pupil plane is also a Fourier transform plane of an object plane of the lithographic apparatus and the distribution of Electric field strength of the radiation in the pupil plane is related to a Fourier transform of an object (for example a mask) disposed in the object plane. In particular, the distribution of Electric field strength of the radiation in the projection system pupil plane (i.e. the angular distribution of radiation at wafer level) is given by a convolution of: (a) the distribution of Electric field strength of the radiation in the illumination pupil plane (i.e. the angular distribution of radiation at object level) and (b) a Fourier transform of the object (for example a reticle).

Pupil function variations may comprise: relative phase variations within the pupil plane and/or relative intensity variations within the pupil plane. Relative phase variations within the pupil plane may be referred to as aberrations. For such embodiments, the pupil function variation map may be referred to as a wavefront aberration map or a relative phase map. Relative intensity variations within the pupil plane may be referred to as apodization. For such embodiments, the pupil function variation map may be referred to as an apodization map or a relative intensity map.

For a perfect optical system that focuses radiation from each point in an object plane to a point in an image plane the wavefront of the radiation may be perfectly spherical. Any aberrations introduced by a real optical system will result in distortion of this spherical wavefront. Such aberrations result in various lithographic effects (for example, offset and focus errors) or errors in the image formed on a wafer. Similarly, relative intensity variations introduced by a real optical system can result in various lithographic effects such as, for example, a change of the critical dimension.

It is known to represent the distortions of the wavefront of light approaching a point in the focal plane of a real optical system from a spherical wavefront as a wavefront aberration map in the pupil plane. This wavefront aberration map may be expressed as a linear combination of a complete set of basis functions. A particularly convenient set is the Zernike polynomials, which form a set of orthogonal polynomials defined on a unit circle. The wavefront aberration map may then be characterized by a set of coefficients in such an expansion, which may be referred to as Zernike coefficients.

The wavefront aberration map at the wafer level (i.e. in the image plane) may be measured using an interferometer comprising a diffraction grating on the image plane and a detector arranged to detect an interference pattern in a plane that is conjugate to a pupil plane of the projection system.

Some lithographic effects scale linearly with the Zernike coefficients which characterize the wavefront aberration map. Such lithographic effects include, for example, overlay errors, defocus and some imaging asymmetries (for example left-right asymmetries and top-bottom asymmetries). Therefore, in prior art techniques these lithographic effects may be expressed as a sum (over Zernike orders) of the product of each Zernike coefficient in the wavefront aberration map expansion with a sensitivity coefficient. That is, the lithographic effect is represented as a sum of the Zernike coefficients, each weighted by a sensitivity coefficient. In such a prior art arrangement the set of sensitivity coefficients therefore characterizes how each Zernike coefficient contributes to the lithographic effect.

In such prior art arrangements, such a set of sensitivity coefficients is used to determine the effect of aberrations on a lithographic quantity. However, in practice this approach suffers from a form of truncation error because only a finite number of Zernike orders are taken into account. In principle such truncation errors can be significant, particularly for processes which use illumination modes which are highly localized in the pupil plane of the illuminator such as, for example, multipole illumination modes. This is because a large number of higher order Zernike polynomials may be necessary to adequately describe the sensitivity or impact of such illumination modes.

Similarly, variations in the transmission across the pupil plane of the projection system can be represented as a relative intensity map, which can also be measured using a sensor at the wafer level (i.e. in the image plane). A method and apparatus for determining such a relative intensity properties (also referred to as apodization properties) of a projection system is described in U.S. Pat. No. 9,261,402B2, which is hereby incorporated in its entirety by reference.

The method according to the first embodiment is particularly advantageous because it provides a novel method for factorizing the effect of aberrations or apodization on the lithographic effect into two parts: (a) the sensitivity map, which contains process dependent information that characterizes how a wavefront aberration or apodization contributes to a specific lithographic effect; and (b) the pupil function variation map (for example a wavefront aberration map or a relative intensity map), which contains information relating the to the aberrations or apodization introduced by the projection system. In particular, it allows this factorization in such a way that the two parts (the sensitivity map and the pupil function variation map) are both maps in the pupil plane. The wavefront aberration map or relative intensity map describes the departures from a perfect spherical wavefront or uniform transmission as a function of illumination angle (i.e. position in the pupil plane). The sensitivity map describes how such wavefront aberrations or apodizations contribute to the lithographic effect.

The sensitivity map may be determined as an all orders (Zernike) analytical calculation. With such an arrangement, the sensitivity map does not suffer from truncation errors.

The determination of the sensitivity map in the pupil plane may comprise the determination of a plurality of pixels. The determination of a pixel of the plurality of pixels may comprise: determining an image that results from that pixel of the pupil function variation map having a non-nominal value and all other pixels having nominal values; determining the lithographic effect from the determined image; and determining the pixel based on the determined lithographic effect and the non-nominal value. It will be appreciated that a nominal value of each pixel may be a value that would be expected in the absence of pupil function variations (for example in the absence of aberrations or apodization). It will also be appreciated that the pupil function variation map may be a relative phase map (for aberrations) or relative intensity map (for apodization). For a relative phase map, the nominal value of each pixel may be zero. For a relative intensity map the nominal value may also be zero (although for an absolute intensity or attenuation map the nominal value may be 1). Determining an image that results from that pixel of the pupil function variation map having a non-nominal value and all other pixels having nominal values may be considered to be determining an image that results from that pixel having an aberration (or apodization) and all other pixels having no aberrations (or apodization).

The determined image is an image that would be formed on a surface of a substrate (for example in a photoresist). The determined image may be referred to as an aerial image. It will however be appreciated that any reference to an "aerial image" may include images that are formed either in air of in any other medium (in particular, for example, water if the method is being applied to a lithographic apparatus with uses immersion lithography).

The sensitivity map may be calculated with the same resolution as a wavefront aberration map (or relative intensity map) of the lithographic apparatus. The wavefront aberration map and relative intensity map of the lithographic apparatus may have, for example, of the order of 10,000 pixels.

Therefore, in principle a full calculation of a sensitivity map for a given process and a given lithographic effect may be computationally intensive, which may limit the usefulness of the method. However, as will be explained further below, some embodiments of the method employ steps that significantly speed up these calculations and which therefore increase the usefulness of the method.

Prior to determination of the plurality of pixels the method may comprise: determining a plurality of partial images that result from pixels of the pupil function variation map having nominal values, wherein the image with no pupil function variations is given be a sum of the partial images; and storing the plurality of partial images such that they can be used during determination of the plurality of pixels.

Generally, an image is given by a sum of partial images. This sum may be a coherent sum, an incoherent sum or a combination of both. For example, subsets of the partial images may be summed coherently and then each of these coherent sums may be summed incoherently.

Each partial image may relate to a specific value of illumination angle, polarization and diffraction order.

The determination of a pixel of the plurality of pixels comprises determining an image, each image being given by a sum of partial images. There may be a large number of pixels, the determination of each one comprising the determination of an image which in turn is determined from a sum of a large number of partial images. Therefore, storing the plurality of partial images such that they can be used during determination of the plurality of pixels may result in a significant reduction in the computation time for the sensitivity map.

The method may further comprise determining the total image with no pupil function variations and storing this prior to determination of the plurality of pixels.

The determination of one of the plurality of pixels may comprise: for each of a first set of the partial images to which that pixel contributes, determining a non-nominal partial image that results from that pixel having a non-nominal value and all other pixels having nominal values; and determining the image that results from that pixel having a non-nominal value and all other pixels having nominal values as being the sum of all non-nominal partial images and all of a second set of the partial images to which that pixel does not contribute.

Particularly at high resolution with a large number of pixels, the fraction of all of the partial images to which a given pixel contributes can be small. That is, the first set of the partial images is smaller than the second set of the partial images. Therefore, the majority of the calculation of a given image for the determination of a pixel of the sensitivity map contains elements which are common to that of the images for the determination of several other pixels of the sensitivity map.

The determination of the image that results from a pixel having a non-nominal value and all other pixels having nominal values may comprise: from the stored total image: subtracting each of the first set of the nominal partial images; and adding each of the non-nominal partial images that result from that pixel having a non-nominal value and all other pixels having nominal values.

The sensitivity map may be determined only for a portion of pupil plane which contributes to an image formed by the lithographic apparatus.

Advantageously, this avoids unnecessarily calculating pixels of the sensitivity map which do not contribute to an image. This results in a further reduction in the computation time for determining the sensitivity map. The portion of the pupil plane which contributes to an image formed by the lithographic apparatus may be determined based on an illumination mode and a pattern on a mask that is to be imaged.

The sensitivity map in a first portion of the pupil plane may be determined and the sensitivity map in a second portion of the pupil plane may be determined from the sensitivity map in the first portion of the pupil plane.

According to a second aspect of the invention, there is provided a method for quantifying the effect of an aberration on a lithographic quantity within a lithographic apparatus, the method comprising: determining a discrete, two-dimensional sensitivity map in a pupil plane of the lithographic apparatus, wherein the lithographic effect is given by the inner product of said sensitivity map with a discrete, two-dimensional wavefront aberration map of a radiation beam in the pupil plane.

It will be appreciated that a map in a pupil plane of the lithographic apparatus is intended to mean a two dimensional function, distribution or mapping in said pupil plane. It will be further appreciated that the inner product of two such maps may be given by the product of the two maps integrated or summed over the pupil plane. It will be appreciated that a discrete, two-dimensional map comprises a two-dimensional array of pixels. For two discrete, two-dimensional maps in the pupil plane the inner product is given by the sum over all pixels of the product of the two maps.

It will be appreciated by the skilled person that, in this context, the pupil plane of a lithographic apparatus generally refers to the exit pupil of a projection system of the lithographic apparatus. This is the image of a physical stop or aperture (located within the projection system) on the image side of the projection system (i.e. the wafer side). This pupil plane is a Fourier transform plane of an image plane of the lithographic apparatus in which an image is formed. It will be further appreciated by the skilled person that the intensity (or, equivalently, the electric field strength) distribution of radiation in the illumination pupil plane (also known as the pupil shape) characterizes the angular distribution of the light cone at the wafer level (i.e. in the image plane). The pupil plane is also a Fourier transform plane of an object plane of the lithographic apparatus and the distribution of Electric field strength of the radiation in the pupil plane is related to a Fourier transform of an object (for example a mask) disposed in the object plane. In particular, the distribution of Electric field strength of the radiation in the projection system pupil plane (i.e. the angular distribution of radiation at wafer level) is given by a convolution of: (a) the distribution of Electric field strength of the radiation in the illumination pupil plane (i.e. the angular distribution of radiation at object level) and (b) a Fourier transform of the object (for example a reticle).

For a perfect optical system that focuses radiation from each point in an object plane to a point in an image plane the wavefront of the radiation may be perfectly spherical. Any aberrations introduced by a real optical system will result in distortion of this spherical wavefront. Such aberrations result in various lithographic effects (for example, offset and focus errors) or errors in the image formed on a wafer.

It is known to represent the distortions of the wavefront of light approaching a point in the focal plane of a real optical system from a spherical wavefront as a wavefront aberration map in the pupil plane. This wavefront aberration map may be expressed as a linear combination of a complete set of basis functions. A particularly convenient set is the Zernike polynomials, which form a set of orthogonal polynomials defined on a unit circle. The wavefront aberration map may then be characterized by a set of coefficients in such an expansion, which may be referred to as Zernike coefficients.

The wavefront aberration map at the wafer level (i.e. in the image plane) may be measured using an interferometer comprising a diffraction grating on the image plane and a detector arranged to detect an interference pattern in a plane that is conjugate to a pupil plane of the projection system.

Some lithographic effects scale linearly with the Zernike coefficients which characterize the wavefront aberration map. Such lithographic effects include, for example, overlay errors, defocus and some imaging asymmetries (for example left-right asymmetries and top-bottom asymmetries). Therefore, in prior art techniques these lithographic effects may be expressed as a sum (over Zernike orders) of the product of each Zernike coefficient in the wavefront aberration map expansion with a sensitivity coefficient. That is, the lithographic effect is represented as a sum of the Zernike coefficients, each weighted by a sensitivity coefficient. In such a prior art arrangement the set of sensitivity coefficients therefore characterizes how each Zernike coefficient contributes to the lithographic effect.

In such prior art arrangements, such a set of sensitivity coefficients is used to determine the effect of aberrations on a lithographic quantity. However, in practice this approach suffers from a form of truncation error because only a finite number of Zernike orders are taken into account. In principle such truncation errors can be significant, particularly for processes which use illumination modes which are highly localized in the pupil plane of the illuminator such as, for example, multipole illumination modes. This is because a large number of higher order Zernike polynomials may be necessary to adequately describe the sensitivity or impact of such illumination modes.

The method according to the first embodiment is particularly advantageous because it provides a novel method for factorizing the effect of aberrations on the lithographic quantity into two parts: (a) the sensitivity map, which contains process dependent information that characterizes how a wavefront aberration contributes to a specific lithographic effect; and (b) the wavefront aberration map, which contains information relating the to the aberrations introduced by the projection system. In particular, it allows this factorization in such a way that the two parts (the sensitivity map and the wavefront) are both maps in the pupil plane. The wavefront aberration map describes the departures from a perfect spherical wavefront as a function of illumination angle (i.e. position in the pupil plane). The sensitivity map describes how such wavefront aberrations contribute to the lithographic effect.

The sensitivity map may be determined as an all orders (Zernike) analytical calculation. With such an arrangement, the sensitivity map does not suffer from truncation errors.

The determination of the sensitivity map in the pupil plane may comprise the determination of a plurality of pixels. The determination of a pixel of the plurality of pixels may comprise: determining an image that results from that pixel having an aberration and all other pixels having no aberrations; determining the lithographic effect from the determined image; and determining the pixel based on the determined lithographic effect and the aberration.

The determined image is an image that would be formed on a surface of a substrate (for example in a photoresist). The determined image may be referred to as an aerial image. It will however be appreciated that any reference to an "aerial image" may include images that are formed either in air of in any other medium (in particular, for example, water if the method is being applied to a lithographic apparatus with uses immersion lithography).

The sensitivity map may be calculated with the same resolution as a wavefront aberration map of the lithographic apparatus. The wavefront aberration map of the lithographic apparatus may have, for example, of the order of 10,000 pixels.

Therefore, in principle a full calculation of a sensitivity map for a given process and a given lithographic effect may be computationally intensive, which may limit the usefulness of the method. However, as will be explained further below, some embodiments of the method employ steps that significantly speed up these calculations and which therefore increase the usefulness of the method.

Prior to determination of the plurality of pixels the method may comprise: determining a plurality of partial images that result from pixels having no aberrations, wherein the image with no aberrations is given be a sum of the partial images; and storing the plurality of partial images such that they can be used during determination of the plurality of pixels.

Generally, an image is given by a sum of partial images. This sum may be a coherent sum, an incoherent sum or a combination of both. For example, subsets of the partial images may be summed coherently and then each of these coherent sums may be summed incoherently.

Each partial image may relate to a specific value of illumination angle, polarization and diffraction order.

The determination of a pixel of the plurality of pixels comprises determining an image, each image being given by a sum of partial images. There may be a large number of pixels, the determination of each one comprising the determination of an image which in turn is determined from a sum of a large number of partial images. Therefore, storing the plurality of partial images such that they can be used during determination of the plurality of pixels may result in a significant reduction in the computation time for the sensitivity map.

The method may further comprise determining the total image with no aberrations and storing this prior to determination of the plurality of pixels.

The determination of one of the plurality of pixels may comprise: for each of a first set of the partial images to which that pixel contributes, determining an aberrated partial image that results from that pixel having an aberration and all other pixels having no aberrations; and determining the image that results from that pixel having an aberration and all other pixels having no aberrations as being the sum of all aberrated partial images and all of a second set of the partial images to which that pixel does not contribute.

Particularly at high resolution with a large number of pixels, the fraction of all of the partial images to which a given pixel contributes can be small. That is, the first set of the partial images is smaller than the second set of the partial images. Therefore, the majority of the calculation of a given image for the determination of a pixel of the sensitivity map contains elements which are common to that of the images for the determination of several other pixels of the sensitivity map.

The determination of the image that results from a pixel having an aberration and all other pixels having no aberrations may comprise: from the stored total image: subtracting each of the first set of the unaberrated partial images; and adding each of the aberrated partial images that result from that pixel having an aberration and all other pixels having no aberrations.

The sensitivity map may be determined only for a portion of pupil plane which contributes to an image formed by the lithographic apparatus.

Advantageously, this avoids unnecessarily calculating pixels of the sensitivity map which do not contribute to an image. This results in a further reduction in the computation time for determining the sensitivity map. The portion of the pupil plane which contributes to an image formed by the lithographic apparatus may be determined based on an illumination mode and a pattern on a mask that is to be imaged.

The sensitivity map in a first portion of the pupil plane may be determined and the sensitivity map in a second portion of the pupil plane may be determined from the sensitivity map in the first portion of the pupil plane.

According to a third aspect of the invention there is provided a method of selecting one or more parameters of a lithographic process in dependence on the sensitivity map determined using the method of the first or second aspects of the invention.

The sensitivity map is dependent on all of the parameters of a lithographic process, including, for example, an illumination mode and a reticle pattern. By selecting one or more parameters of a lithographic process in dependence on the sensitivity map it is possible to tune or optimize said one or more parameters such that the lithographic process is more sensitive to one or more types of aberrations and less sensitive to one or more other types of aberrations.

The method may comprise selecting the one or more parameters of for the lithographic process such that a desired or target sensitivity map is achieved.

The one or more parameters of the lithographic process may comprise an illumination mode. For example, a rotationally symmetric illumination mode may be selected, such that the intensity of radiation in an illuminator pupil plane is only dependent on a radial coordinate.

Additionally or alternatively, the one or more parameters of the lithographic process may comprise a reticle pattern.

The method may be an iterative one. For example, the method may comprise: choosing an initial set of values of the one or more parameters of the lithographic process (for example an initial illumination mode) and determining the sensitivity map for said initial set of values. If the sensitivity map is a desired or target sensitivity map (or is within a tolerance thereof) then the current set of values of the one or more parameters of the lithographic process is selected. Otherwise, the set of values of the one or more parameters of the lithographic process is changed and the sensitivity map for the new set of values is determined and compared to the desired or target sensitivity map. The process may be repeated until the sensitivity map is the desired or target sensitivity map (or is within a tolerance thereof) and then the current set of values (which may, for example, correspond to a current illumination mode) is selected.

The method may use a non-linear least squares procedure which involves the minimization of a merit function from a starting condition, the merit function having a set of tuneable parameters. An example of a suitable algorithm is the Levenberg-Marquardt algorithm although it will be appreciated that other embodiments may use different algorithms.

The lowest order Zernike contributions to the wavefront aberration map (Zernike coefficients $Z_2$, $Z_3$ and $Z_4$) are the most difficult to measure since they relate to the position of an image plane. As a result, these aberrations are typically not measured by a wavefront sensor, but by a resist exposure technique. In order to measure these lowest order Zernike contributions to the wavefront aberration map ($Z_2$, $Z_3$ and $Z_4$) a mask is imaged onto a plurality of target regions C of a substrate W (a resist covered wafer).

The one or more parameters of the lithographic process (for example the illumination mode and/or reticle pattern) may be selected such that for a selected lithographic effect the sensitivity map is substantially sensitive to only one or more Zernike contributions to be measured.

The lithographic effect may be a shift of a plane of best focus relative to a nominal image plane (both a lateral position in the x and y directions and an axial position in the z direction). The Zernike contributions to be measured may be the lowest order Zernike contributions to the wavefront aberration map ($Z_2$, $Z_3$ and $Z_4$).

According to a fourth aspect of the invention there is provided a method of determining one or more aberrations, the method comprising: forming an image of a patterning device on at least one target region of a resist covered substrate; processing the substrate; and inspecting the image formed on the at least one target region and determining the one or more aberrations therefrom, wherein the image of the patterning device is formed using one or more parameters of a lithographic process selected using the method according to the second third of the invention.

The aberrations may be the lowest order Zernike contributions to the wavefront aberration map, i.e. Zernike coefficients $Z_2$, $Z_3$ and $Z_4$.

The patterning device may comprise one or more diffraction gratings. Processing the substrate may involve selectively removing (e.g. by developing the resist) either regions which have or have not been cured by the exposure.

For determining Zernike coefficients $Z_2$ and $Z_3$, one or more target regions may be imaged and the lateral position (i.e. in the x and y directions) of the plane of best focus relative to a nominal image plane can be determined. From this, the Zernike contributions $Z_2$ and $Z_3$ can be determined. For example, each image can be inspected (for example using a scanning electron microscope or overlay metrology) and the quality of each image can be assessed (for example by comparison to the image of the mask).

For determining Zernike coefficient $Z_4$, a plurality of target regions may be imaged with the substrate being disposed at a range of different z positions. The axial position (i.e. in the z direction) of the plane of best focus relative to a nominal image plane can be determined and, from this, the Zernike contribution $Z_4$ can be determined. The plane of best focus may be determined as a plane that maximises the contrast of an image of a grating structure.

According to a fifth aspect of the invention there is provided a lithographic method of forming an image of a patterning device on a substrate, wherein one or more aberrations determined using the method of the fourth aspect of the invention are at least partially corrected for.

According to a sixth aspect of the invention there is provided a lithographic apparatus configured to carry out the method of the first, second or third aspects of the invention.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5A shows the regions in the projection system pupil plane which receive radiation from a first one of the poles of the dipole illumination mode of FIG. 3A when imaging the pattern shown in FIG. 4A;

FIG. 5B shows the regions in the projection system pupil plane which receive radiation from a second one of the poles of the dipole illumination mode of FIG. 3A when imaging the pattern shown in FIG. 4A;

FIG. 5C shows the regions in the projection system pupil plane which receive radiation when imaging the pattern shown in FIG. 4A with the dipole illumination mode of FIG. 3A;

FIGS. 23A to 23E show the intensity distribution for five different dipole illumination modes of the lithographic apparatus shown in FIG. 1;

FIGS. 27A-27E show the sensitivity maps for the shift in the z direction of plane of best focus relative to a nominal image plane for the pattern shown in FIG. 22A when imaged using the illumination modes shown in FIGS. 23A-23E respectively;

DETAILED DESCRIPTION

Figure 1:
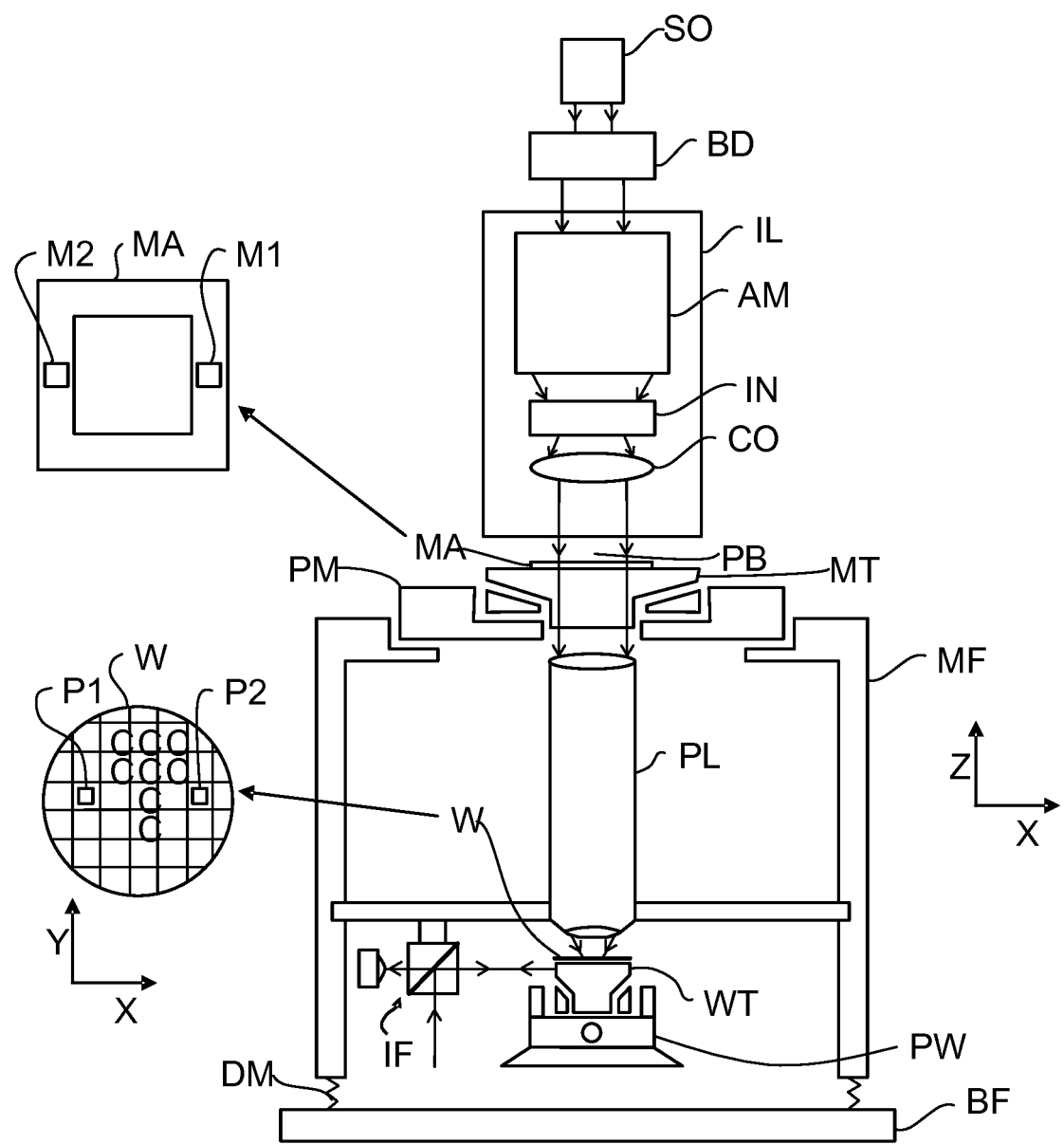
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target region", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target region of the substrate. It should be noted that the pattern imparted to the radiation beam may not exactly correspond to the desired pattern in the target region of the substrate. Generally, the pattern imparted to the radiation beam will correspond to a particular functional layer in a device being created in the target region, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. In particular, it holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a radiation beam PB (e.g. UV radiation or EUV radiation).
a support structure (e.g. a mask table) MT to support a patterning device (e.g. a mask) MA and connected to first positioning device PM to accurately position the patterning device with respect to item PL;
a substrate table (e.g. a wafer table) WT for holding a substrate (e.g. a resist coated wafer) W and connected to second positioning device PW for accurately positioning the substrate with respect to item PL; and
a projection system (e.g. a refractive projection lens) PL configured to image a pattern imparted to the radiation beam PB by patterning device MA onto a target region C (e.g. comprising one or more dies) of the substrate W.

As here depicted, the apparatus is of a transmissive type (e.g. employing a transmissive mask). Alternatively, the apparatus may be of a reflective type, e.g. employing a programmable mirror array of a type as referred to above or a reflective reticle.

The illuminator IL receives a beam of radiation from a radiation source SO. The source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source SO may be integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target region C of the substrate W. With the aid of the second positioning device PW and position sensor IF (e.g. an interferometric device), the substrate table WT can be moved accurately, e.g. so as to position different target regions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As explained above, the projection system PL is configured to image a pattern imparted to the radiation beam by the patterning device MA onto a target region C (e.g. comprising one or more dies) of the substrate W. Therefore the projection system PL forms an image of the patterning device MA on the substrate W. As radiation propagates through an optical system comprising optics with optical power (i.e. focusing and/or diverging optics) such as, for example, the lithographic apparatus, it undergoes various transformations in shape and intensity distribution as now described with reference to FIG. 2, which will be understood to be schematic.

Figure 2:
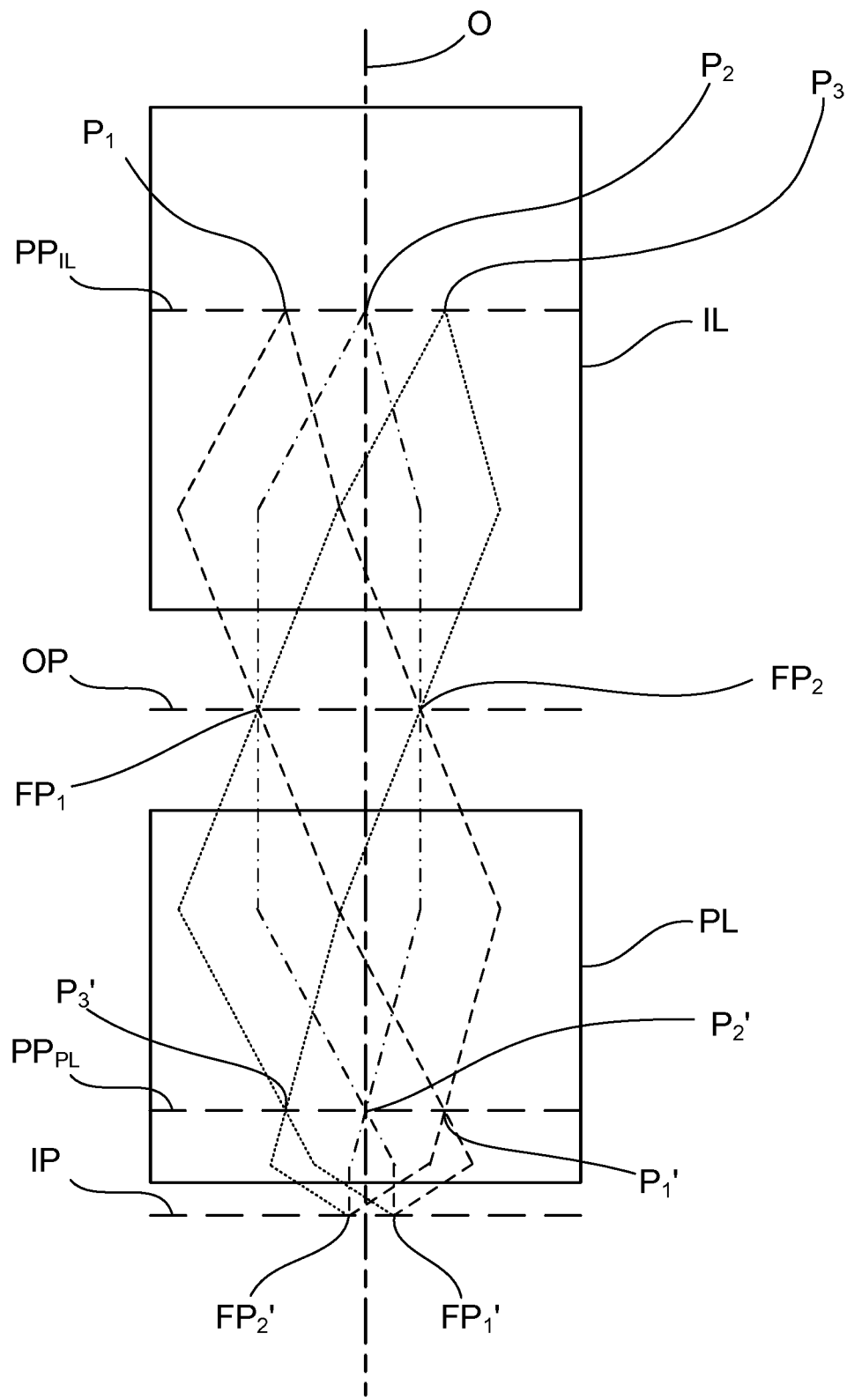
FIG. 2 is a schematic representation of the illumination system and projection system of the lithographic apparatus of FIG. 1, showing the locations of two field planes and two pupil planes.

The pattering device MA may be considered to be disposed in an object plane OP of the projection system PL and the substrate W may be considered to be disposed in an image plane IP of the projection system PL. In the context of such a lithographic apparatus, the object plane OP of the projection system PL (where the patterning device MA is disposed), the image plane IP of the projection system PL (where the substrate W is disposed) and any planes conjugate thereto may be referred to as field planes of the lithographic apparatus. It will be appreciated that within an optical system (e.g. a lithographic apparatus) two planes are conjugate if each point within the first plane P is imaged onto a point in the second plane P'. Two field points $FP_1$ and $FP_2$ in the object plane OP are shown in FIG. 2, along with three rays of radiation that pass through each of these points. Also shown are the conjugate field points $FP_1'$ and $FP_2'$ in the image plane IP (field point $FP_1'$ in the image plane IP is conjugate to $FP_1$ in the object plane OP and field point $FP_2'$ in the image plane IP is conjugate to $FP_2$ in the object plane OP). The example shown in FIG. 2 depicts a projection system PL which forms an inverted image of the object and applies a reduction factor of 4 to the radiation beam PB, forming an image with features that are smaller than corresponding features on the patterning device MA.

It will be appreciated that the lithographic apparatus comprises optics with optical power (i.e. focusing and/or diverging optics) in order to form an image in the image plane IP of an object in the object plane OP. Within such an optical system, between each pair of field planes it is possible to define a pupil plane which is a Fourier transform plane of a preceding field plane and a successive field plane.

The distribution of the Electric field within each such pupil plane is related to a Fourier transform of an object disposed in a preceding field plane. It will be appreciated that the quality of such a pupil plane will depend on the optical design of the system and that such a pupil plane may even be curved. Two such pupil planes are shown in FIG. 2: an illuminator pupil plane $PP_{IL}$ and a projection system pupil plane $PP_{PL}$. The illuminator pupil plane $PP_{IL}$ and the projection system pupil plane $PP_{PL}$ (and any other pupil planes) are mutually conjugate planes.

The projection system pupil plane $PP_{PL}$ may be referred to as the exit pupil of the projection system PL of the lithographic apparatus. This is the image of a physical stop or aperture (located within the projection system PL) on the image side of the projection system PL (i.e. the wafer side). Similarly, the illuminator pupil plane $PP_{IL}$ may be referred to as the exit pupil of the illuminator IL.

Note that each point in a field plane maps onto the entire successive pupil plane and vice versa. In particular, each field point (in either the object plane OP or the image plane IP) receives radiation at a range of angles. Each angle corresponds to a different point in the pupil plane. Therefore, as can be seen a plurality of parallel rays of radiation at a field plane map onto a single point in a successive (or preceding) pupil plane. In FIG. 2, rays of radiation which illuminate the field points $FP_1$, $FP_2$, $FP_1'$, $FP_2'$ normal to the field plane OP, IP (these rays are shown as dot-dashed lines) map onto a point $P_2$, $P_2'$ in the center of each pupil plane $PP_{IL}$, $PP_{PL}$ respectively. For each pair of conjugate field points $FP_1$, $FP_2$, $FP_1'$, $FP_2'$ two other parallel rays of radiation are shown (as dotted and dashed lines), which map onto two different pairs of conjugate points $P_1$, $P_1'$ and $P_3$, $P_3'$ in each pupil plane $PP_{IL}$, $PP_{PL}$ respectively.

Note that although each of points $P_1'$, $P_2'$ and $P_3'$ in the projection system pupil plane $PP_{PL}$ is conjugate to point $P_1$, $P_2$ and $P_3$ in the illuminator pupil plane $PP_{IL}$ respectively, diffraction from a mask in the object plane will, in general, cause radiation from a given point in the illuminator pupil plane $PP_{IL}$ to map into a plurality of points in the projection system pupil plane $PP_{PL}$. The zeroth order diffraction beam for a given point in the illuminator pupil plane $PP_{IL}$ will be imaged onto a conjugate point in the projection system pupil plane $PP_{PL}$. Higher order diffraction beams will be imaged onto different parts of the projection system pupil plane $PP_{PL}$ or may fall outside of the numerical aperture of the projection system PL such that they do not contribute to the image formed in the image plane IP.

The intensity (or, equivalently, the electric field strength) distribution of radiation in the illuminator pupil plane $PP_{IL}$ may be referred to as the illumination mode or pupil fill and characterizes the angular distribution of the light cone at the mask level (i.e. in the object plane OP). Similarly, the intensity (or, equivalently, the electric field strength) distribution of radiation in the projection system pupil plane $PP_{PL}$ characterizes the angular distribution of the light cone at the wafer level (i.e. in the image plane IP).

As explained above, the illuminator IL may alter the intensity distribution of the beam in the illuminator pupil plane $PP_{IL}$. The illuminator may be arranged to limit the radial extent of the radiation beam such that the intensity distribution is non-zero within an annular region in the illuminator pupil plane $PP_{IL}$. Additionally or alternatively, the illuminator IL may also be operable to limit the distribution of the beam in the illuminator pupil plane $PP_{IL}$ such that the intensity distribution is non-zero in a plurality of equally spaced sectors in the illuminator pupil plane $PP_{IL}$.

The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in the illuminator pupil plane $PP_{IL}$ can be adjusted. By convention, the radial coordinate 6 of a point in the illuminator pupil plane $PP_{IL}$ or the projection system pupil plane $PP_{PL}$ is typically normalised by the numerical aperture NA of the projections system PL (such that a circle of radius σ=1 corresponds to the region of the pupil plane which can physically be captured by the projection system PL and imaged onto the image plane IP). The illuminator IL may also be operable to vary the angular distribution of the beam. For example, the illuminator IL may be operable to alter the number, and angular extent, of sectors in the illuminator pupil plane $PP_{IL}$ wherein the intensity distribution is non-zero. By adjusting the intensity distribution of the beam in illuminator pupil plane $PP_{IL}$ of the illuminator IL, different illumination modes may be achieved.

Figure 3A:
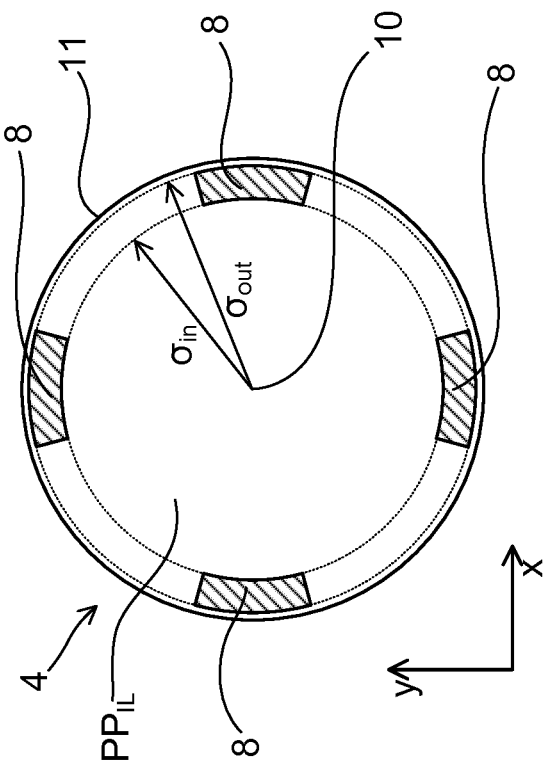
FIG. 3A shows the intensity distribution for a dipole illumination mode of the lithographic apparatus shown in FIG. 1.
Figure 3B:
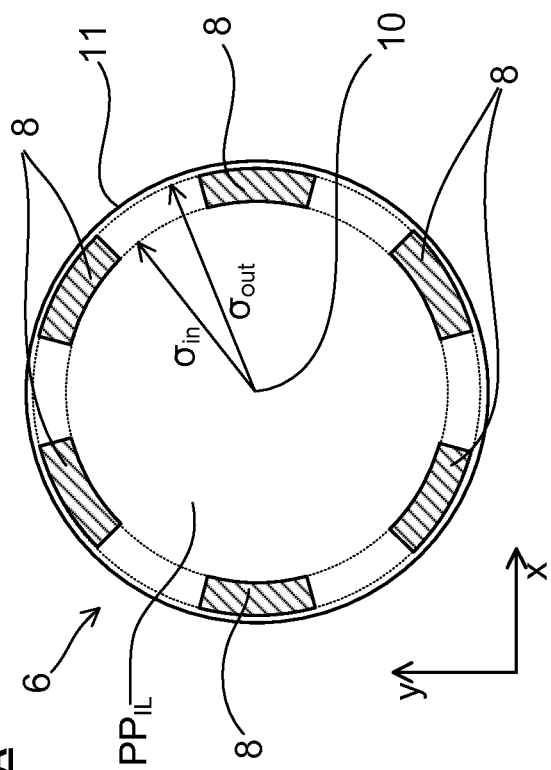
FIG. 3B shows the intensity distribution for a quadrupole illumination mode of the lithographic apparatus shown in FIG. 1.
Figure 3C:
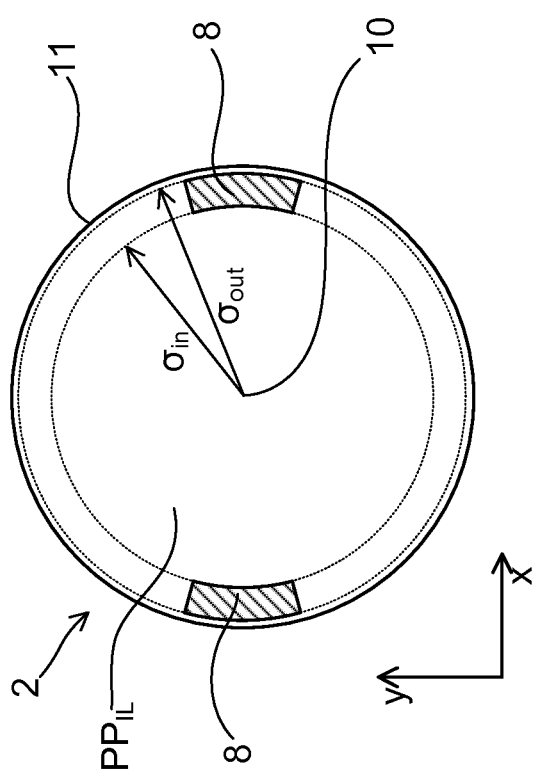
FIG. 3C shows an intensity distribution for a hexapole illumination mode.

In some embodiments, by limiting the radial and angular extent of the intensity distribution in the illuminator pupil plane $PP_{IL}$ of the illuminator IL, the intensity distribution may have a multi-pole distribution such as, for example, a dipole, quadrupole or hexapole distribution (see FIGS. 3A-3C respectively).

For example, the illumination mode may be a dipole distribution 2 as shown in FIG. 3A, a quadrupole distribution 4 as shown in FIG. 3B, or a hexapole distribution 6 as shown in FIG. 3C. Also shown in FIGS. 3A-3C is a circle 11 which represents the limit of what can physically be captured by the projection system PL and imaged onto the image plane IP (this represents the numerical aperture NA, or the sine of the maximum angle that can be captured by the projection system PL). In coordinates that are normalised by the numerical aperture NA of the projection system PL, circle 11 has a radius σ=1.

The dipole distribution 2 comprises two diametrically opposed pole regions 8 where the intensity is non-zero. Each pole region 8 is generally of the form of a sector of an annulus, defined by the intersection of an annulus and two diametrically opposed sectors of a circle. The annulus is defined by two concentric circles of radii $σ_n$ and $σ_{out}$ (commonly referred to as σ-inner and σ-outer respectively). In this example, each pole 8 subtends an angle at the centre 10 of the illuminator pupil plane $PP_{IL}$ of approximately 30°. Each pole 8 has a σ-inner of 0.83 and a σ-outer of 0.97 such that the average radial position of each pole is approximately 0.9. A line that bisects the two opposing pole regions 8 is generally in the x direction. With this illumination mode the radiation may be linearly polarized in the y direction.

The quadrupole distribution 4 comprises a first dipole distribution similar to that shown in FIG. 3A and a second dipole distribution rotated relative to the first by π/2 radians but otherwise identical to it. Therefore the quadrupole distribution 4 comprises four pole regions 8 where the intensity is non-zero. Radiation in each pole region may be linearly polarized in a direction generally perpendicular to a line that bisects it. This polarization mode may be referred to as XY polarization and can achieve good results in contrast in the image formed on the substrate W.

The hexapole distribution 6 comprises six poles 8 generally evenly distributed around a circle. Each of the poles 8 is similar to those of the dipole distribution 2 and the quadrupole distribution 4. Radiation in each pole may be linearly polarized in a direction generally perpendicular to a line that bisects it. This polarization mode may be referred to as TE polarization. Hexapole illumination with TE polarization may for example be used when forming an image of an array or holes or an array of blocks. It will be appreciated that the hexapole distribution 6 shown in FIG. 3C, with the six poles generally evenly distributed about a circle, is only one embodiment of a hexapole illumination mode. Multipole illumination modes wherein the poles are not evenly distributed about a circle are also common and may be better for printing certain patterns. In general multipole illumination modes comprise one or more pairs of diametrically opposed pole regions where the intensity is non-zero.

A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across the illuminator pupil plane $PP_{IL}$ of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across the illuminator pupil plane $PP_{IL}$ of the illuminator IL. The polarization direction of radiation may be different in different regions in the illuminator pupil plane $PP_{IL}$ of the illuminator IL. The polarization state of the radiation may be chosen in dependence on the illumination mode. For multi-pole illumination modes the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarised states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO.

The shape and intensity distribution of the conditioned beam of radiation PB are defined by optics of the illuminator IL. In a scan mode, the conditioned radiation beam PB may be generally rectangular in cross section (in the field planes) such that it forms a band of radiation on the patterning device MA and on the substrate W. The band of radiation may be referred to as an exposure slit (or slit). The slit may have a longer dimension (which may be referred to as its length) and a shorter dimension (which may be referred to as its width). The width of the slit may correspond to a scanning direction and the length of the slit may correspond to a non-scanning direction. In scan mode, the length of the slit limits the extent in the non-scanning direction of the target region C that can be exposed during in a single dynamic exposure. In contrast, the extent in the scanning direction of the target region C that can be exposed during in a single dynamic exposure is determined by the length of the scanning motion.

The illuminator IL may comprise a plurality of movable fingers. Each movable finger may be independently movable between at least a retracted position wherein it is not disposed in the path of the radiation beam and an inserted position wherein it partially blocks the radiation beam. By moving the fingers, the shape and/or the intensity distribution of the slit can be adjusted. The fingers may be not in a field plane and the field may be in the penumbra of the fingers such that the fingers do not sharply cut off the radiation beam PB. Movement of the fingers between their retracted and inserted positions may be in a direction perpendicular to the length of the slit. The fingers may be arranged in pairs, each pair comprising one finger on each side of the slit. The pairs of fingers may be arranged along the length of the slit. The pairs of fingers may be used to apply a different level of attenuation of the radiation beam PB along the length of the slit.

The illuminator IL may comprise two blades (not shown). Each of the two blades may be generally parallel to the length of the slit, the two blades being disposed on opposite sides of the slit. Each blade may be independently movable between a retracted position wherein it is not disposed in the path of the radiation beam and an inserted position wherein it partially blocks the radiation beam. Furthermore, the blades are either disposed in the plane of the patterning device MA or in a conjugate field plane (with appropriate focusing optics disposed between said conjugate field plane and the patterning device MA). By moving the blades into the path of the radiation beam, the profile of the radiation beam PB can be truncated thus limiting the extent of the field of radiation beam PB in a scanning direction. Therefore, the masking blades of the illuminator serve as a field stop for the lithographic apparatus.

For a perfect optical system that focuses radiation from each point in an object plane OP to a point in an image plane IP the wavefront of the radiation may be perfectly spherical as it approaches the IP. Any aberrations introduced by a real optical system (for example the projection system PL) will result in distortion of this spherical wavefront. Such aberrations result in various lithographic effects, for example offset and displacement errors or deformations in the image formed on a wafer W.

A two-dimensional wavefront aberration map of a radiation beam in the pupil plane $PP_{PL}$ may be determined in a conventional manner. For example, the relative phase of the radiation in the pupil plane $PP_{PL}$ may be determined by projecting radiation, for example from a point-like source in the object plane OP of the projection system PL (i.e. the plane of the mask MA), through the projection system PL and using a shearing interferometer to measure a wavefront (i.e. a locus of points with the same phase). Shearing interferometers are common path interferometers and therefore, advantageously, no secondary reference beam is required to measure the wavefront. The shearing interferometer may comprise a diffraction grating, for example a two dimensional grid, in the image plane IP of the projection system (i.e. the substrate table WT) and a detector arranged to detect an interference pattern in a plane that is conjugate to the pupil plane $PP_{PL}$ of the projection system PL. The interference pattern is related to the derivative of the phase of the radiation with respect to a coordinate in the pupil plane $PP_{PL}$ in the shearing direction. The detector may comprise an array of sensing elements such as, for example, charge coupled devices (CCDs). In one embodiment, the diffraction grating is sequentially scanned in two perpendicular directions, which may coincide with axes of a co-ordinate system of the projection system PL (x and y) or may be at an angle such as, for example, 45 degrees to these axes. Scanning may be performed over an integer number of grating periods, for example one grating period. The scanning averages out phase variations in one direction, allowing phase variations in the other direction to be reconstructed. This allows the wavefront to be determined as a function of both directions. The projection system PL of a state of the art lithographic apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined.

It is known to represent the distortions of the wavefront of light approaching a point in an image plane of a real optical system (for example projection system PL) from a spherical wavefront as a wavefront aberration map in the pupil plane. This wavefront aberration map may be expressed as a linear combination of a complete set of basis functions. A particularly convenient set is the Zernike polynomials, which form a set of orthogonal polynomials defined on a unit circle. Accordingly, the wavefront aberration W(x,y) map may be expressed as:

$$W(x,y)=\Sigma_n Z_n \cdot z_n(x,y), \quad (1)$$

where x and y are coordinates in the pupil plane, $z_n(x,y)$ is the nth Zernike polynomial and $Z_n$ is a coefficient. It will be appreciated that in the following, Zernike polynomials and coefficients are labelled with an index which is commonly referred to as a Noll index. Therefore, $z_n(x,y)$ is the Zernike polynomial having a Noll index of n and $Z_n$ is a coefficient having a Noll index of n. The wavefront aberration map may then be characterized by the set of coefficients $Z_n$ in such an expansion, which may be referred to as Zernike coefficients. It will be appreciated that only a finite number of Zernike orders are taken into account.

Some lithographic effects scale linearly with the Zernike coefficients which characterize the wavefront aberration map. Such lithographic effects include, for example, overlay errors, defocus and some imaging asymmetries (for example left-right asymmetries and top-bottom asymmetries). Therefore, in prior art techniques these lithographic effects may be expressed as a sum (over Zernike orders) of the product of each Zernike coefficient in the wavefront aberration map expansion with a sensitivity coefficient, that is:

$$L=\Sigma_n S_n \cdot Z_n, \quad (2)$$

where L is the lithographic effect (for example overlay) and $S_n$ is the nth sensitivity coefficient. That is, the lithographic effect L is represented as a sum of the Zernike coefficients $Z_n$, each weighted by a sensitivity coefficient $S_n$. In such a prior art arrangement the set of sensitivity coefficients therefore characterizes how each Zernike coefficient contributes to the lithographic effect L.

Therefore, in such prior art arrangements, a set of sensitivity coefficients $S_n$ is used to determine the effect of aberrations on a lithographic quantity L. The sensitivities $S_n$ may be calculated for a specific lithographic process using a commercial lithographic simulator. However, this prior art approach suffers from a form of truncation error because only a finite number of Zernike orders are taken into account. In principle such truncation errors can be significant, particularly for processes which use illumination modes which are highly localized in the pupil plane of the illuminator $PP_{IL}$ such as, for example, multipole illumination modes (see FIGS. 3A-3C). This is because a large number of higher order Zernike polynomials may be necessary to adequately describe the sensitivity of such illumination modes. Furthermore, evaluating more Zernike polynomials on a discrete grid (i.e. a two dimensional array of pixels in the pupil plane) is challenging since it becomes numerically unstable.

Embodiments of the present invention relate to the quantification of the effect of an aberration on a lithographic quantity within a lithographic apparatus. In particular, this involves the determination of a discrete, two-dimensional sensitivity map in a pupil plane $PP_{PL}$ of the lithographic apparatus, wherein the lithographic effect is given by the inner product of said sensitivity map with a discrete, two-dimensional wavefront aberration map of a radiation beam in the pupil plane $PP_{PL}$. In particular, the sensitivity map is determined as an all orders (Zernike) analytical calculation and therefore does not suffer from truncation errors. It will be appreciated that a map in a pupil plane of the lithographic apparatus is intended to mean a two dimensional function, distribution or mapping in said pupil plane. It will be further appreciated that the inner product of two such maps is given by the product of the two maps integrated or summed over the pupil plane. It will be appreciated that a discrete, two-dimensional map comprises a two-dimensional array of pixels. For two discrete, two-dimensional maps in the pupil plane the inner product is given by the sum over all pixels of the product of the two maps.

That is, the discrete, two-dimensional sensitivity map $S(x,y)$ is determined in a pupil plane $PP_{PL}$ of the lithographic apparatus such that the lithographic effect is given by the inner product of said sensitivity map with the discrete, two-dimensional wavefront aberration map $W(x,y)$:

$$L=\Sigma_{x,y}S(x,y)\cdot W(x,y), \quad (3)$$

where the sum is over all pixels in the pupil plane $PP_{PL}$.

The method according to embodiments of the invention is particularly advantageous because it provides a novel method for factorizing the effect of aberrations on the lithographic quantity into two parts: (a) the sensitivity map $S(x,y)$, which contains process dependent information that characterizes how a wavefront aberration contributes to a specific lithographic effect; and (b) the wavefront aberration map $W(x,y)$, which contains information relating the to the aberrations introduced by the projection system. In particular, it allows this factorization in such a way that the two parts (the sensitivity map $S(x,y)$ and the wavefront $W(x,y)$) are both maps in the pupil plane $PP_{PL}$. The wavefront aberration map $W(x,y)$ describes the departures from a perfect spherical wavefront as a function of illumination angle (i.e. position in the pupil plane). The sensitivity map $S(x,y)$ describes how such wavefront aberrations contribute to the lithographic effect. The factorization of the effect of aberrations on the lithographic quantity by methods according to embodiments of the invention also separates the effect into a part which is process dependent (the sensitivity map $S(x,y)$) and therefore only needs to be calculated once for each process and a part which is dependent on lithographic apparatus (the wavefront aberration map $W(x,y)$).

Furthermore, since the sensitivity map $S(x,y)$ is determined as an all orders (Zernike) analytical calculation it does not suffer from truncation errors that prior art techniques do.

The present invention is formally equivalent to prior art methods, since the two-dimensional sensitivity map $S(x,y)$ could be expanded as a linear combination of Zernike polynomials:

$$S(x,y)=\Sigma_n S_n\cdot z_n(x,y), \quad (4)$$

where the coefficients are the prior art sensitivity coefficients $S_n$. Note that here, for simplicity, it is assumed that the Zernike polynomials are normalised such that the inner product of any Zernike polynomial with itself is 1.

Although formally equivalent to prior art methods, embodiments of the present invention provide an alternative description of the sensitivity of a lithographic effect to aberrations. Furthermore, embodiments of the present invention provide a description of the sensitivity of a lithographic effect to aberrations which is not affected by truncation errors due to only a finite number of Zernike orders being used.

The sensitivity map for a given process and a given lithographic effect can be determined, as now described. In general, the determination of the sensitivity map in the pupil plane comprises the determination of a plurality of pixels of the sensitivity map $S(x,y)$.

The sensitivity map $S(x,y)$ may be calculated with the same resolution as a wavefront aberration map $W(x,y)$ of the lithographic apparatus. The wavefront aberration map $W(x,y)$ of the lithographic apparatus may have, for example, of the order of 10,000 pixels. Therefore, in principle a full calculation of a sensitivity map $S(x,y)$ for a given process and a given lithographic effect may be computationally intensive, which may limit the usefulness of the method. However, as will be explained further below, some embodiments of the method employ steps that significantly speed up these calculations and which therefore increase the usefulness of the method.

In some embodiments, in order to determine the image in the image plane IP, light which originates from the same point in the illuminator pupil plane $PP_{IL}$ should be summed coherently whereas light which originates from the different points in the illuminator pupil plane $PP_{IL}$ should be summed incoherently. That is, the image is an incoherent sum of the contributions from all points in the illuminator pupil plane $PP_{IL}$ (intensity addition), where the contribution from each point in the illuminator pupil plane $PP_{IL}$ it is a coherent propagation from the object plane OP to the image plane (i.e. summing Electric fields). The coherent propagation for each point in the illuminator pupil plane $PP_{IL}$ one makes use of the Fourier transforms: a Fourier transform from the mask at the object plane OP to the pupil plane $PP_{PL}$, a truncation by the numerical aperture NA of the projection system PL, and an inverse Fourier transform from the pupil plane $PP_{PL}$ to the wafer in the image plane IP.

It will be appreciated that, in the following, any reference to a determined image or partial image is an image that would be formed on a surface of a substrate W (for example in a photoresist). The determined image may be referred to as an aerial image. It will however be appreciated that any reference to an "aerial image" may include images that are formed either in air of in any other medium (in particular, for example, water if the method is being applied to a lithographic apparatus with uses immersion lithography).

The determination of a pixel of the sensitivity map comprises determining an image that results from that pixel having an aberration (i.e. a non-nominal value) and all other pixels having no aberrations (i.e. nominal values). That is, the image is determined (as discussed above) in the image plane IP assuming that only one pixel in the pupil plane $PP_{PL}$ has been affected by an aberration and that all other pixels in the pupil plane $PP_{PL}$ are imaged perfectly. From this image, the lithographic effect is determined. For example, the image may be used to determine what the overlay error would be with such an aberration affecting only one pixel in the pupil plane $PP_{PL}$. The pixel of the sensitivity map S(x,y) is then determined from the determined lithographic effect and the aberration (or the non-nominal value of the pixel) using the definition of the sensitivity map given in Eq. (3). Note that since only one pixel contains an aberration, the wavefront aberration map W(x,y) will only be non-zero for that one pixel. Therefore, the right-hand side of Eq. (3) becomes the product of the sensitivity map pixel (which is to be determined) and the aberration which was introduced. The sensitivity map pixel may therefore be given by the ratio of the determined lithographic effect to the aberration which was introduced.

As explained above, the intensity of an image at a point in the image plane IP is given by a sum of radiation reaching that point and this sum may be a coherent sum, an incoherent sum or a combination of both. The image may therefore be considered to be a sum of a plurality of partial images. Each partial image may relate to a specific value of illumination angle, polarization and diffraction order. Subsets of the partial images may be summed coherently (i.e. those for which the radiation originates from a common point in the illuminator pupil plane $PP_{IL}$) and then each of these coherent sums may be summed incoherently. The image may be given by:

$$I=\Sigma_i I_i, \qquad (5)$$

where $I_i$ is the ith partial image and it will be appreciated that, in general, this sum is a combination of coherent sums and incoherent sums.

The sensitivity map S(x,y) may be calculated with the same resolution as a wavefront aberration map W(x,y) of the lithographic apparatus and may therefore have of the order of 10,000 pixels. Therefore, as already mentioned, a full calculation of a sensitivity map S(x,y) for a given process and a given lithographic effect may be computationally intensive: for each of these pixels, an image is determined. In principle, for each image a partial image from each pixel of the illuminator pupil plane $PP_{IL}$ is determined. In practice, due to diffraction from a mask in the object plane, a plurality of partial images from each pixel of the illuminator pupil plane $PP_{IL}$ (one for each diffraction order of the mask) is determined (and these are summed coherently). Therefore the calculation of each pixel of the sensitivity map S(x,y) involves the calculation of a significant number of partial images.

However, the inventor has realized that a significant fraction of the partial images that need to be determined in order to determine a pixel of the sensitivity map S(x,y) are unaffected by the introduced aberration. The image that needs to be determined in order to determine a pixel of the sensitivity map S(x,y) (i.e. the image that results from that pixel having an aberration and all other pixels having no aberrations) can be expressed as:

$$I=\Sigma_{\{i:aberrated\}} I'_i + \Sigma_{\{i:unaberrated\}} I_i. \qquad (6)$$

In Eq. (6), the first sum is over a first set of partial images which are affected by the introduced aberration and $I'_i$ is the affected partial image (which may be referred to as a non-nominal partial image), taking into account the aberration. The second sum is over a second set of the partial images which are unaffected by the introduced aberration and $I_i$ is the partial image (which may be referred to as a nominal partial image). The first set of the partial images may be significantly smaller than the second set of the partial images. Each of the second set of partial images is a partial image that contributes to an image that is not affected by any aberrations (i.e. a perfect image). In some embodiments, prior to determination of the plurality of pixels the method comprises determining a plurality of partial images that result from no pixels having aberrations (i.e. nominal partial images). The image with no aberrations is given by a sum of these partial images. In some embodiments the total image with no aberrations may also be determined and stored prior to determination of the plurality of pixels of the sensitivity map S(x,y).

The partial images that contribute to the image with no aberrations are stored such that they can be used during determination of the plurality of pixels. Storing the plurality of partial images such that they can be used during determination of the plurality of pixels may result in a significant reduction in the computation time for the sensitivity map S(x,y). Only those partial images that are affected by the introduced aberration (i.e. the first set of partial images, or non-nominal partial images) need to be re-calculated during the subsequent determination of a pixel of the sensitivity map S(x,y).

Accordingly, the determination of one of the pixels of the sensitivity map S(x,y) may comprise: for each of the first set of the partial images (to which that pixel contributes), determining an aberrated (non-nominal) partial image that results from that pixel having an aberration and all other pixels having no aberrations. That is, the aberrated partial images are only determined from those portions of light which pass through the aberrated pixel (in the pupil plane $PP_{PL}$).

Subsequently, the image that results from that pixel having an aberration and all other pixels having no aberrations (which is used to determine that pixel of the sensitivity map S(x,y)) may be determined as being the sum of all of these aberrated partial images and all of the second set of the partial images (to which that pixel does not contribute).

Particularly at high resolution with a large number of pixels, the fraction of all of the partial images to which a given pixel contributes can be small. That is, the first set of the partial images is significantly smaller than the second set of the partial images. Therefore, the majority of the calculation of a given image for the determination of a pixel of the sensitivity map S(x,y) contains elements which are common to that of the images for the determination of several other pixels of the sensitivity map S(x,y).

The image that results from a pixel having an aberration and all other pixels having no aberrations may be determined from the stored total image I (with no aberrations) by subtracting the unaberrated partial image $I_i$ for each of the first set of the partial images and adding the aberrated partial image $I'_i$ for each of the first set of the partial images:

$$I'=I-\Sigma_{\{i:aberrated\}} I_i + \Sigma_{\{i:aberrated\}} I'_i. \qquad (7)$$

In some embodiments the sensitivity map is determined only for a portion of pupil plane $PP_{PL}$ which contributes to an image formed by the lithographic apparatus. Advantageously, this avoids unnecessarily calculating pixels of the sensitivity map which do not contribute to an image. This results in a further reduction in the computation time for determining the sensitivity map. The portion of the pupil plane which contributes to an image formed by the lithographic apparatus may be determined based on an illumination mode and a pattern on a mask that is to be imaged.

It is known that for symmetric illumination modes (i.e. for which, in the illuminator pupil plane $PP_{IL}$, the Electric field strength satisfies the condition $I(x,y)=I(-x,-y)$) odd and even contributions to a wavefront aberration (in the pupil plane) of a projection system generally contribute to different lithographic effects (in the image plane) of the projection system. For this reason, a description in terms of a Zernike expansion of the wavefront aberration map (of the form of Eq. (1)) can be helpful (since each Zernike polynomial $z_n(x,y)$ has either odd or even pointwise symmetry). For example, for symmetric illumination modes only odd contributions to a wavefront aberration contribute to overlay errors whereas only even contributions to a wavefront aberration generally contribute to defocus.

Recall that the definition of the sensitivity map $S(x,y)$ is such that the lithographic effect L is given by the inner product of the sensitivity map $S(x,y)$ and the wavefront aberration map $W(x,y)$ and that this inner product is of the form of the product of the two maps integrated or summed over the pupil plane (see Eq. (3)). A definite integral of an odd function over a symmetric range vanishes whereas a definite integral of an even function over a symmetric range is, in general, non-zero. Therefore, only the even component of the product of the sensitivity map $S(x,y)$ and the wavefront aberration map $W(x,y)$ can contribute to a lithographic effect. Since only odd contributions to a wavefront aberration map $W(x,y)$ contribute to overlay errors, the sensitivity map $S(x,y)$ for overlay must also be odd (the product of two odd functions is even). Similarly, since only even contributions to a wavefront aberration map $W(x,y)$ contribute to defocus, the sensitivity map $S(x,y)$ for defocus must also be even (the product of two even functions is even).

Therefore, for lithographic effects for which it is known that only odd or even contributions to wavefront aberrations contribute, the sensitivity map $S(x,y)$ only needs to be determined for half of the pupil plane $PP_{PL}$. The other half can be determined from the known symmetry properties of the sensitivity map $S(x,y)$, in particular that $S(x,y)=\pm S(-x,-y)$ (depending on whether the sensitivity map is even or odd). That is, the sensitivity map $S(x,y)$ in a first portion of the pupil plane $PP_{PL}$ is determined and the sensitivity map $S(x,y)$ in a second portion of the pupil plane $PP_{PL}$ is determined from the sensitivity map $S(x,y)$ in the first portion of the pupil plane $PP_{PL}$.

Furthermore, the pattern on the mask can lead to additional symmetries which can mean that the sensitivity map $S(x,y)$ need only be determined in an even smaller first portion of the pupil plane $PP_{PL}$. For example, for a pattern consisting of lines in one direction, with a point-wise symmetric illumination mode, the sensitivity map $S(x,y)$ only needs to be determined for a quarter of the pupil plane $PP_{PL}$. For example, a pattern consisting of lines in the y direction (which may be referred to as vertical lines) will cause a diffraction pattern wherein the different diffraction orders are separated in the x direction. With such an arrangement, the sensitivity map $S(x,y)$ will be an odd function of x and an even function of y. That is, the sensitivity map $S(x,y)$ will satisfy $S(x,y)=-S(-x,y)$ and $S(x,y)=S(x,-y)$. Depending on which half of the pupil plane $PP_{PL}$ the sensitivity map $S(x,y)$ has been determined, one of these symmetry relations can be used to determine the other half.

Similarly, pattern consisting of lines in the x direction (which may be referred to as horizontal lines) will cause a diffraction pattern wherein the different diffraction orders are separated in the y direction. With such an arrangement, the sensitivity map $S(x,y)$ will be an even function of x and an odd function of y. That is, the sensitivity map $S(x,y)$ will satisfy $S(x,y)=S(-x,y)$ and $S(x,y)=-S(x,-y)$.

An example of a sensitivity map for specific lithographic effect and lithographic process is now discussed with reference to FIGS. 4A to 8.

Figure 4A:
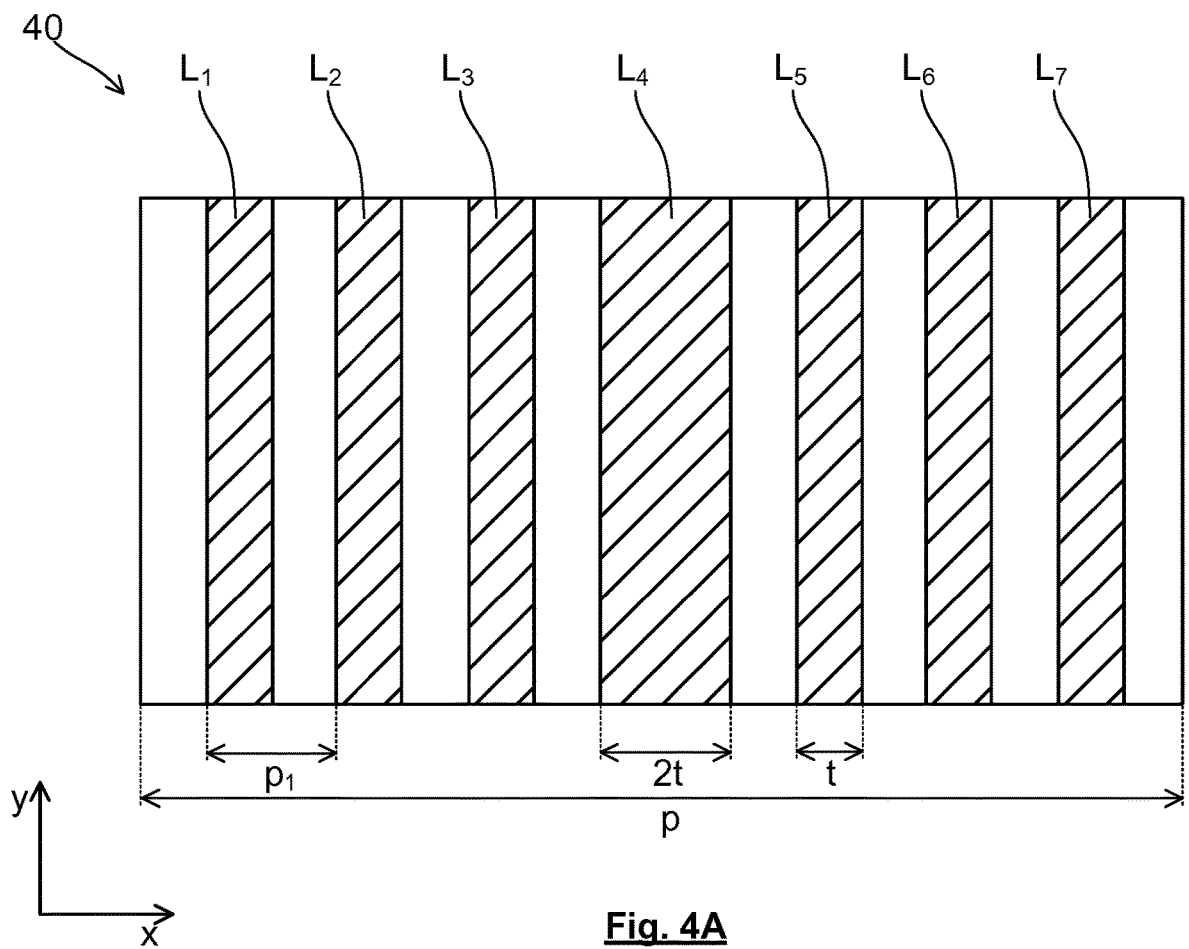
FIG. 4A shows a typical mask pattern for a Flash memory device comprises a plurality of lines extending in the y direction.
Figure 4B:
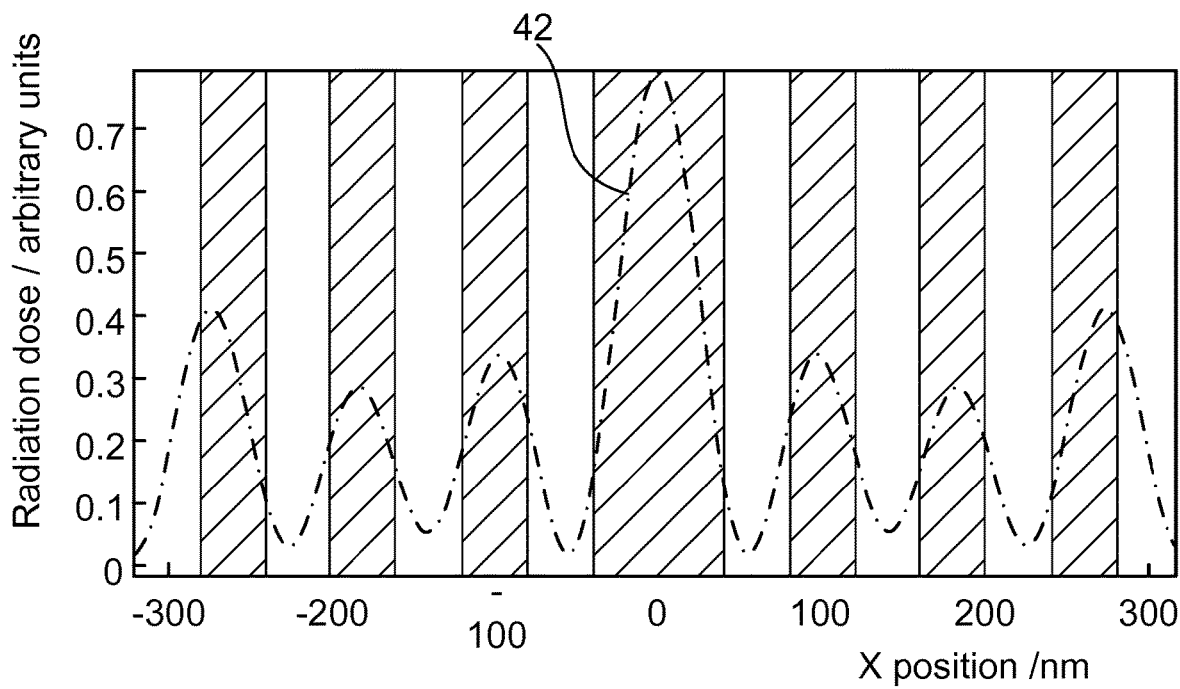
FIG. 4B shows the dose of radiation received by the wafer as a function of position in the x direction when imaging the pattern shown in FIG. 4A.

The lithographic process is for a typical pattern that may be imparted to a silicon wafer W in order to form a Flash memory device. The pattern 40 on the mask M is shown in FIG. 4A and comprises a plurality of lines extending in the y direction. The dose of radiation 42 received by the wafer W (in the absence of aberrations) as a function of position in the x direction is shown in FIG. 4B, with the pattern 40 on the mask M overlaid.

FIG. 4A shows the unit cell of a repeating pattern on the mask M. The pattern comprises seven lines $L_1$-$L_7$ (i.e. light transmitting portions of the mask M, depicted as cross hatched lines) and seven spaces in between (i.e. light blocking portions of the mask M). The spaces may be formed from a material that at least partially absorbs the light. For example, the spaces may be formed from a material such that the intensity of the radiation transmitted by the spaces has approximately 6% of the intensity of the radiation transmitted by the lines $L_1$-$L_7$. The unit cell shown in FIG. 4A has a pitch p of 640 nm. Six of the lines $L_1$-$L_3$, $L_5$-$L_7$ and six of the spaces have the same thickness t of 40 nm which form a higher resolution pattern with a pitch $p_1$ of 80 nm. However, one of the lines $L_4$ (the central line in FIG. 4A) and one of the spaces (the space formed by the space on the left hand side of FIG. 4A and the space formed by the space on the right hand side of FIG. 4A) has twice this thickness, i.e. a thickness of 80 nm.

It will be appreciated that the pattern 40 shown in FIG. 4A is provided on a mask M disposed in an object plane OP of a lithographic apparatus and is imaged onto a substrate (e.g. a silicon wafer) that has a layer of radiation-sensitive material (resist) and which is in an image plane IP of the lithographic apparatus. Regions of the resist which receive a dose of radiation which exceeds a threshold value undergo a transformation (they have been cured by the radiation). During subsequent processing of the wafer either the regions which have or have not been cured by the radiation can be selectively removed (e.g. by etching). It will therefore be appreciated that the thickness of the lines and spaces which are formed on the substrate W (after this subsequent processing of the substrate W) will be dependent on the energy dose 42 received by the wafer W and the threshold value (which will be a property of the resist).

Although six of the lines $L_1$-$L_3$, $L_5$-$L_7$ and six of the spaces have the same thickness t (40 nm), even in the absence of aberrations the thickness of the lines formed on the wafer W will, in general, vary. However, note that the dose of radiation 42 received by the wafer W (in the absence of aberrations) is symmetric about the center of the central line $L_4$. Therefore, in the absence of aberrations, the thickness of lines $L_3$ and $L_5$ (as formed on the substrate W) should be the same (similarly the thickness of lines $L_2$ and $L_6$ should be the same and the thickness of lines $L_1$ and $L_7$ should be the same). Furthermore, the thickness of the space between lines $L_3$ and $L_1$ (as formed on the substrate W) should be the same as the thickness of the space between lines $L_1$ and $L_5$ (as formed on the substrate W) (similarly the thickness of the space between lines $L_2$ and $L_3$ should be the same as the thickness of the space between lines $L_5$ and $L_6$ and the thickness of the space between lines $L_1$ and $L_2$ should be the same as the thickness of the space between lines $L_6$ and $L_7$).

However, aberrations in the projection system PL can affect these expected symmetries in the thickness of the lines in the image on the wafer W. For example, it can give rise to an asymmetry in the thickness of the two spaces either side of the thicker, central line in the image (i.e. the spaces either side of the image of line $L_4$). This lithographic effect in the image is therefore a distortion of the image and is known as left-right asymmetry (or top-bottom asymmetry).

For the pattern 40 shown in FIG. 4A, which consists essentially of lines in one direction, good imaging and a large process window can be obtained by the use of dipole illumination of the form of the dipole distribution 2 shown in FIG. 3A. In particular, the poles 8 may be arranged such that in the projection system pupil plane $PP_{PL}$, one of the first order diffracted beams deriving from each of the two poles 8 in the illumination system generally coincides with the zeroth order beam from the other pole caused by the high resolution pattern (i.e. with pitch $p_1$ of 80 nm). That is, the parameters of illumination mode are chosen such that the angular separation of the two poles $2\sigma$ ($\sigma$ being the radial position of each pole) is approximately equal to $\lambda/(p_1 \cdot NA)$, where $\lambda$ is the wavelength and NA is the numerical aperture. In this example, $\lambda$=193 nm, $p_1$=80 nm and NA=1.35 such that the normalized radial position of each pole in the illuminator pupil plane $PP_{IL}$ should be approximately 0.9. This is satisfied by the dipole distribution 2 shown in FIG. 3A and it shall be assumed in the following that the dipole distribution 2 shown in FIG. 3A is used.

The intensity distribution of radiation in the projection system pupil plane $PP_{PL}$, for this example process (imaging the pattern 40 shown in FIG. 4A with the dipole illumination mode 2 shown in FIG. 3A) is now discussed with reference to FIGS. 5A-5C.

Consider imaging the pattern 40 shown in FIG. 4A, which consists of a periodic structure a pitch of 640 nm (with a wavelength of 193 nm and the numerical aperture of 1.35). The lines $L_1$-$L_7$ on the mask will cause diffraction of the radiation such that radiation from each pole 8 in the illuminator pupil plane $PP_{IL}$ will map into a plurality of regions in the projection system pupil plane $PP_{PL}$. FIG. 5A shows the regions in the projection system pupil plane $PP_{PL}$ which receive radiation from a first one of the poles 8 (the left hand pole in FIG. 3A) and FIG. 5B shows the regions in the projection system pupil plane $PP_{PL}$ which receive radiation from a second one of the poles 8 (the right hand pole in FIG. 3A). Each of the two poles 8 illuminates a conjugate region 12 of the projection system pupil plane $PP_{PL}$ which corresponds to the zeroth order diffraction beam for that pole 8. In addition, the first pole 8 illuminates a plurality of regions 13-20, which correspond to the $\pm 1^{st}$ to $\pm 8^{th}$ diffraction orders respectively and the second pole 8 illuminates a plurality of regions 21-28, which correspond to the $-1^{st}$ to $-8^{th}$ diffraction orders respectively. Note that here the $\pm 1^{st}$ to $\pm 8^{th}$ diffraction orders relate to the entire pattern 40 shown in FIG. 4A (having a pitch of 640 nm) and therefore an angular separation between diffraction orders of $\lambda/p$.

It will be appreciated that in the projection system pupil plane $PP_{PL}$ only regions 12, 13-20 and 21-28 will receive radiation. Accordingly, only a central band region 30 (see FIG. 5C) of the projection system pupil plane $PP_{IL}$ receives radiation. Therefore, for this process (imaging the pattern 40 shown in FIG. 4A with the dipole illumination mode 2 shown in FIG. 3A) the sensitivity map S(x,y) only needs to be calculated for this central band region 30.

Figure 6:
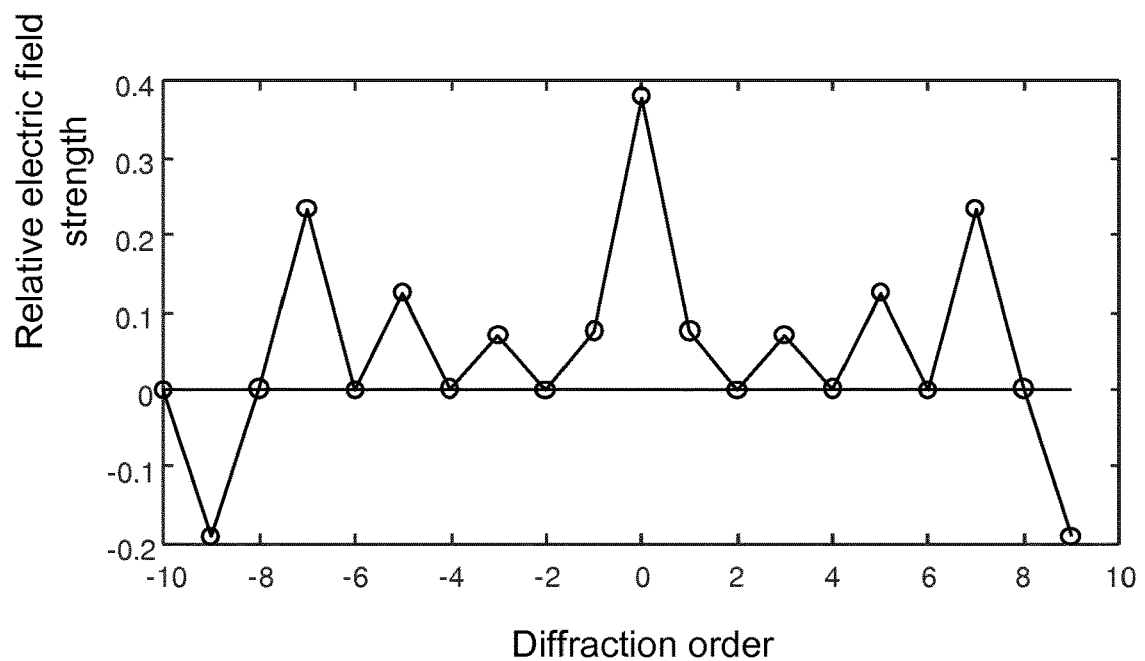
FIG. 6 shows the relative electric field strength of radiation received by each diffraction order for the pattern shown in FIG. 4A.

It will be appreciated that the intensity distribution of radiation across regions 12, 13-20 and 21-28 of the projection system pupil plane $PP_{PL}$ is dependent on the shape of the unit cell of the periodic structure. The relative electric field strength of radiation received by each diffraction order for the pattern 40 shown in FIG. 4A is shown in FIG. 6. Therefore, the electric field strength of the radiation beam in the projection system pupil plane $PP_{PL}$ is given by each of the regions 12, 13-20 and 21-28 weighted by the appropriate relative electric field strength (from FIG. 6). Note that due to symmetry of the pattern 40 in the x direction (the pattern 40 is the same as the inverted version of this pattern 40) all even diffraction orders (except the zeroth order) are absent. Furthermore, as the thickness of the central line $L_4$ and the space formed by the space on the left hand side of FIG. 4A and the space formed by the space on the right hand side of FIG. 4A tend towards the same thickness as the other lines and spaces (i.e. a thickness of 40 nm), the whole pattern tends towards seven identical lines and spaces. As this happens, the relative electric field strength of radiation received by each diffraction order will tend to zero except for the $\pm n \cdot 7^{th}$ diffraction orders, where n=0, $\pm 1$, $\pm 2$, . . . . These relate to the $\pm n^{th}$ diffraction orders of the higher resolution pattern comprising a single space and line of the same thickness (i.e. a higher resolution pattern with a pitch $p_1$ of 80 nm).

Figure 7:
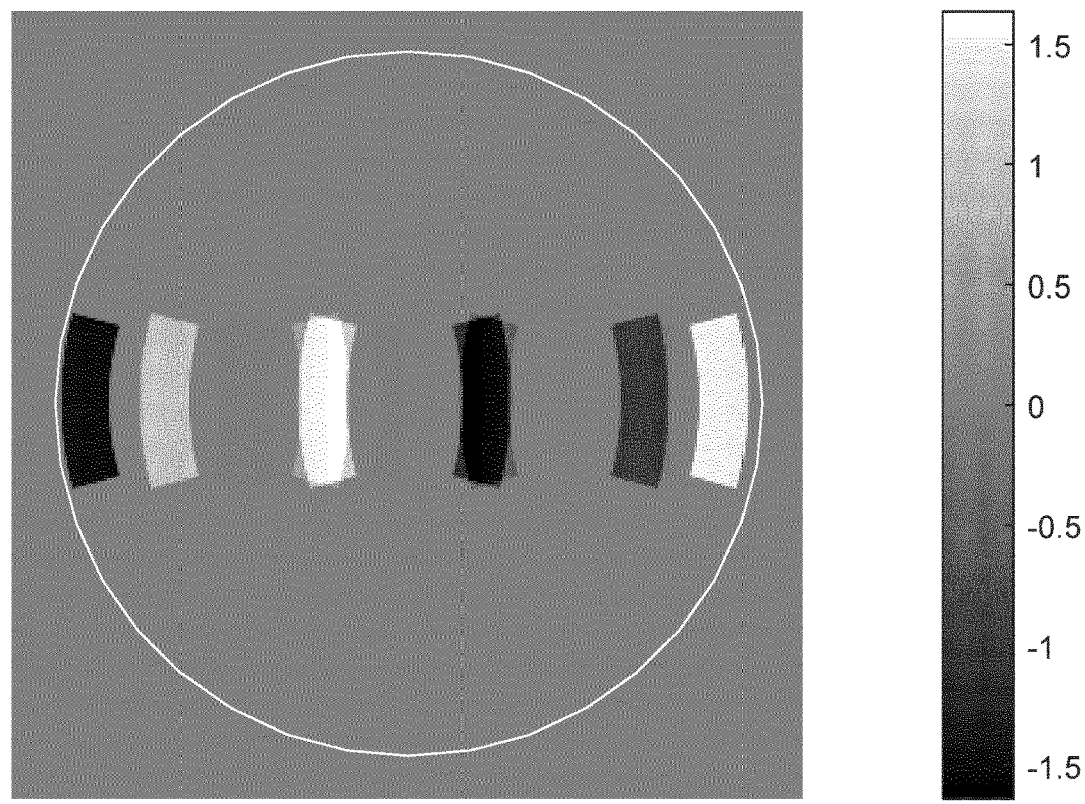
FIG. 7 shows the sensitivity map for a critical dimension difference L3–L5 for the process of imaging the pattern shown in FIG. 4A with the dipole illumination mode shown in FIG. 3A.

FIG. 7 shows the sensitivity map S(x,y) of the left-right asymmetry for the process of imaging the pattern 40 shown in FIG. 4A with the dipole illumination mode 2 shown in FIG. 3A. As can be clearly seen from FIG. 7, the sensitivity map only has non-zero values within the central band 30. Furthermore, the sensitivity map is clearly influenced by the shape of the dipole illumination mode 2 and the diffraction pattern caused by the pattern 40.

Figure 8:
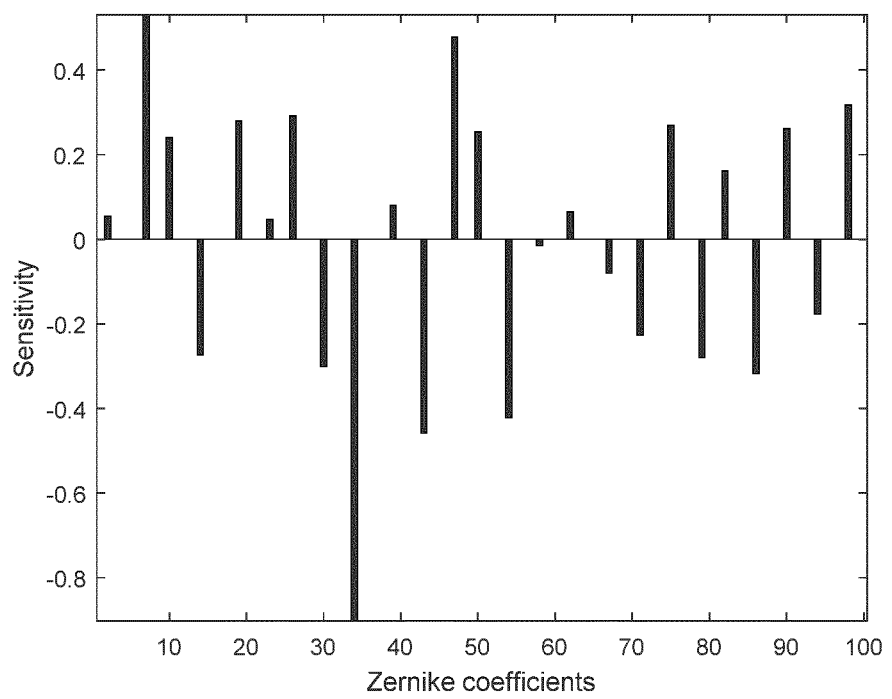
FIG. 8 shows the first 100 Zernike sensitivity coefficients for the sensitivity map shown in FIG. 7A.
Figure 9A:
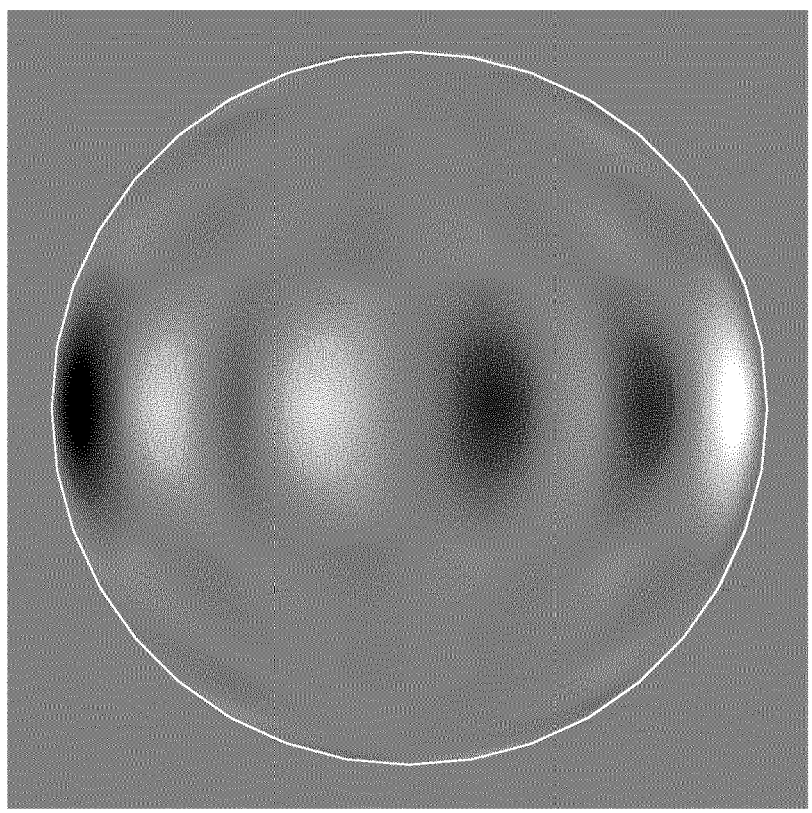
FIG. 9A shows an equivalent sensitivity map to the first 100 Zernike sensitivity coefficients for the sensitivity map shown in FIG. 7.

For comparison with prior art techniques, the equivalent Zernike sensitivities $S_n$ have been calculated for the sensitivity map shown in FIG. 7. The nth sensitivity $S_n$ coefficient may be determined by taking the inner product of the sensitivity map S(x,y) with the nth Zernike polynomial $z_n(x,y)$ is (and, if necessary, dividing by the square of the norm of the nth Zernike polynomial, see Eq. (4)). The first 100 Zernike $S_n$ coefficients have been determined and are shown in FIG. 8. These 100 Zernike $S_n$ coefficients, in combination with the Zernike polynomials $z_n(x,y)$, can be used to determine a sensitivity map that is equivalent to prior art techniques, which is shown in FIG. 9A. The difference between the sensitivity map S(x,y) shown in FIG. 7 and the equivalent prior art sensitivity map (based on the first 100 Zernike $S_n$ coefficients) is shown in FIG. 9B.

Figure 9B:
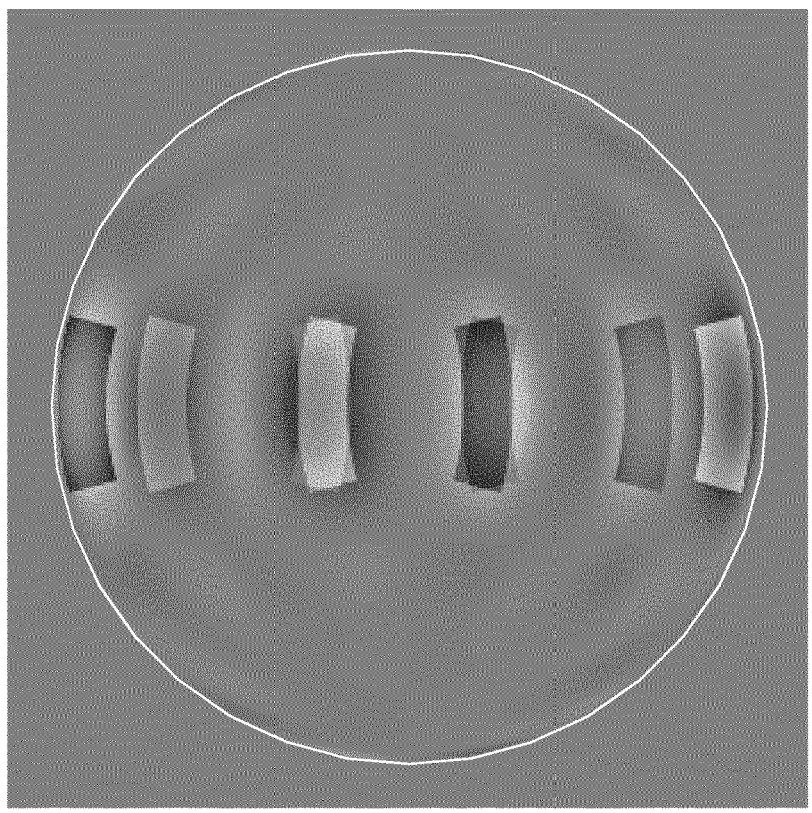
FIG. 9B shows an equivalent sensitivity map to the Zernike sensitivity coefficients above the 100th Zernike sensitivity coefficient for the sensitivity map shown in FIG. 7.

As can be seen from FIGS. 9A and 9B, even when taking into account 100 Zernike orders, the truncation error leads to some significant departures from the full sensitivity map S(x,y). It is worth noting that the truncation error also leads to the equivalent prior art sensitivity map (as shown in FIG. 9A) being non-zero in some regions of the projection system pupil plane $PP_{PL}$ where it should be zero.

Lithographic effects caused by lens aberrations can be measured directly. For example, a wafer may be exposed to radiation, processed and subsequently analysed (for example by being measured using a scanning electron microscope or the like). However, it is useful to have some mechanism for performing online determinations of these effects. The sensitivity $S_n$ coefficients of the prior art and the sensitivity map S(x,y) of the present invention can be used for this purpose. The wavefront aberration map can be determined, for example at multiple points in the field (at wafer level). From this, an expected value for some lithographic effect (defocus, overlay etc.) can be determined (using the sensitivity $S_n$ coefficients of the prior art or the sensitivity map $S(x,y)$ of the present invention). The projection system PL may comprise a plurality of lens elements and may further comprise adjusting means for adjusting the lens elements so as to correct for aberrations (phase variations across the pupil plane $PP_{PL}$ throughout the field). To achieve this, the adjusting means may be operable to manipulate lens elements within the projection system PL in one or more different ways. The projection system may have a co-ordinate system wherein its optical axis extends in the z direction. The adjusting means may be operable to do any combination of the following: displace one or more lens elements; tilt one or more lens elements; and/or deform one or more lens elements. Displacement of lens elements may be in any direction (x, y, z or a combination thereof). Tilting of lens elements is typically out of a plane perpendicular to the optical axis, by rotating about axes in the x or y directions although a rotation about the z axis may be used for non-rotationally symmetric aspherical lens elements. Deformation of lens elements may include both low frequency shapes (e.g. astigmatic) and high frequency shapes (e.g. free form aspheres). Deformation of a lens element may be performed for example by using actuators to exert force on sides of the lens element and/or by using heating elements to heat selected regions of the lens element.

It will be appreciated that the measurement of the wavefront aberration map provides an indirect measurement of the lithographic effect(s) caused by the projection system PL. This can then be used to as part of a feedback system to adjust the projection system PL so as to reduce the lithographic effect(s). Each lithographic effect may be assigned a different weight in this process since it may, for example, be more important for a given process to minimise one lithographic effect, potentially at the expense of increasing another lithographic effect. It will be appreciated that if the sensitivity map for a given lithographic effect and a given process is inaccurate, this will limit the accuracy the above-described feedback process. Therefore, by providing a sensitivity map $S(x,y)$ which is an all orders calculation (and therefore does not suffer from truncation errors) the quality of the image formed on the substrate W can be improved.

According to some embodiments of the present invention, the sensitivity map $S(x,y)$ as described above may be used to determine an illumination mode for a lithographic process, as now described. For example, an illumination mode may be selected in dependence on the sensitivity map $S(x,y)$ determined using the methods described above. The sensitivity map $S(x,y)$ is dependent on all of the parameters of a lithographic process, including an illumination mode. By selecting an illumination mode for a lithographic process in dependence on the sensitivity map it is possible to tune or optimize an illumination mode such that the lithographic process is more sensitive to one or more types of aberrations and less sensitive to one or more other types of aberrations.

The method may comprise selecting an illumination mode for the lithographic process such that a desired or target sensitivity map is achieved. The method may be an iterative one. For example, the method may comprise: choosing an initial illumination mode and determining the sensitivity map $S(x,y)$ for said initial illumination mode (for a lithographic effect and a particular mask pattern). If the sensitivity map is a desired or target sensitivity map or is within a tolerance thereof then the current illumination mode is selected. Otherwise, the illumination mode is changed and the sensitivity map $S(x,y)$ for the new illumination mode is determined and compared to the desired or target sensitivity map. The process may be repeated until the sensitivity map $S(x,y)$ is the desired or target sensitivity map or is within a tolerance thereof and then the current illumination mode is selected.

Note that this iterative process of selecting an illumination mode is made possible due to the features described above which speed up the determination of the sensitivity map $S(x,y)$.

This iterative method may, for example, use a non-linear least squares procedure. For example, the iterative method may involve the minimization of a merit function from a starting condition, the merit function having a set of tunable parameters. An example of a suitable algorithm is the Levenberg-Marquardt algorithm although it will be appreciated that other embodiments may use different algorithms.

As explained above, aberrations caused by the projection system PL result in distortions of the wavefront as it approaches the image plane IP from an ideal spherical wavefront. The wavefront aberration map $W(x,y)$ describes these aberrations and can be measured directly using an interferometer at wafer level. For example, for each wafer loaded onto the substrate table WT, the wavefront aberration map $W(x,y)$ may be measured, for example at a plurality of different points in the field of view in the image plane IP. As explained above, the wavefront aberration map $W(x,y)$ may be characterized by a finite set of Zernike coefficients $Z_i$ (see Eq. (1) above).

The lowest order Zernike contributions to the wavefront aberration map (Zernike coefficients $Z_2$, $Z_3$ and $Z_4$) are the most difficult to measure since they relate to the position of the image plane IP. As a result, these aberrations are typically not measured by a wavefront sensor, but by a resist exposure technique.

For example, Zernike coefficients $Z_2$ and $Z_3$ describe the tilt of the wavefront in the pupil plane $PP_{PL}$ in the x and y directions respectively, which relate to the position of the image plane IP in the x and y directions. For example, a tilt of the wavefront in the plane $PP_{PL}$ in the x direction results in a shift of the image formed in the image plane IP in the x direction. Similarly, a tilt of the wavefront in the plane $PP_{PL}$ in the y direction results in a shift of the image formed in the image plane IP in the y direction. That is, the lithographic effects of the aberrations described by the Zernike coefficients $Z_2$ and $Z_3$ are a shift in the position of the image in the x and y directions respectively. Zernike coefficient $Z_4$ describes a curvature of the wavefront in the plane $PP_{PL}$ and relates to the z position of the image plane. That is, the lithographic effect of this aberration (as described by the Zernike coefficient $Z_4$) is a shift in the z direction of the image plane (for example relative to a nominal image plane).

In order to measure these lowest order Zernike contributions to the wavefront aberration map ($Z_2$, $Z_3$ and $Z_4$) a mask is imaged onto a plurality of target regions C of a substrate W (a resist covered wafer). The target regions C are imaged with the substrate being disposed at a range of different z positions and orientations. The position and orientation of the substrate W is controlled by moving the substrate table WT. The substrate W is then removed from the lithography apparatus and processed, for example by selectively removing (e.g. by developing the resist) either the regions which have or have not been cured by the exposure. Each image can then be inspected (for example using a scanning electron microscope or overlay metrology) and the quality of each image can be assessed (for example by comparison to the image of the mask). The quality of each image may be assessed by determining one or more lithographic effects from each image. For example, the lithographic effect may be a position of a shift in the x or y direction of an image formed of a grating mark relative to a nominal position (for Zernike coefficients $Z_2$ and $Z_3$ respectively) or a shift in the z direction of the position of a plane of best focus relative to a nominal positon (for Zernike coefficient $Z_4$).

The position (both lateral position in the x and y directions and axial position in the z direction) of the plane of best focus relative to the nominal image plane can be determined and, from this, the values of the lowest order Zernike contributions to the wavefront aberration map ($Z_2$, $Z_3$ and $Z_4$) can be determined.

In order to limit the higher order aberration impact, the exposure is typically performed using an illumination mode which is predominantly sensitive to the low order coefficient being determined. For example, for determining Zernike coefficients $Z_2$, $Z_3$ the exposure is typically performed using a large conventional illumination mode whereas for determining Zernike coefficient $Z_4$ the exposure is typically performed using an annular illumination mode. However, this resist exposure technique for determining Zernike coefficients $Z_2$, $Z_3$ and $Z_4$ suffers from higher order aberrations as well.

As stated above, for determining Zernike coefficients $Z_2$, $Z_3$, in order to limit the higher order aberration impact, the exposure is typically performed using a large conventional illumination mode. For example, the intensity distribution may be uniform over the entire illuminator pupil plane $PP_{IL}$. However, despite this incoherent illumination, the measured lithographic effect (e.g. the position of centre of mass of an alignment marker) is still sensitive to the higher order aberrations. This is due to the fact that different parts of the pupil have a different amplitude to the image formation and a different contrast to the image formation.

As a first example, consider the determination of Zernike coefficients $Z_2$ and $Z_3$. For this example, the mask pattern is a grating structure comprising lines with a thickness of 1131.5 nm interspaced with spaces with a thickness of 1131.5 nm, i.e. a grating with a pitch of 2263 nm. For determination of Zernike coefficient $Z_2$ a grating structure with lines extending in the y direction (vertical lines) are used whereas for determination of Zernike coefficient $Z_3$ a grating structure with lines extending in the x direction (horizontal lines) are used. A single marker may be provided on a mask which comprises both vertical and horizontal lines, which may allow the Zernike coefficients $Z_2$ and $Z_3$ to be determined during the same exposure.

A $Z_2$ aberration is a tilt of the wavefront about the y axis, which results in a shift of the image in the x direction. Similarly a $Z_3$ aberration is a tilt of the wavefront about the x axis, which results in a shift of the image in the y direction. Therefore, the lithographic effects of interest are related to the x and y positions of the image respectively. In particular, the lithographic effects of interest are a shift in the x and y directions of the image respectively from a nominal position of the image (i.e. the position in which the image would be formed in the absence of aberrations). It is desirable to determine an illumination mode such that these shifts in the x and y directions are substantially only sensitive to the $Z_2$ aberration and $Z_3$ aberration respectively.

It may be desirable to choose a rotationally symmetric illumination mode, such that the intensity of radiation in illuminator pupil plane $PP_{IL}$ is only dependent on the radial coordinate σ. With such an arrangement the same illumination mode can be used for determining both the $Z_2$ aberration and the $Z_3$ aberration. Alternatively, a more optimized illumination mode may found for each of the $Z_2$ aberration and the $Z_3$ aberration measurements.

Figure 10:
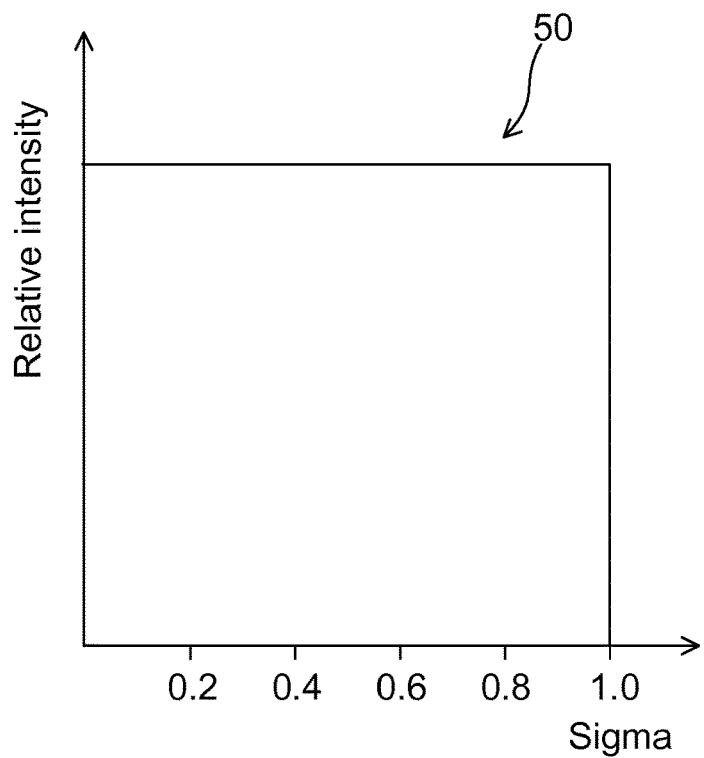
FIG. 10 shows the relative intensity of radiation in the illuminator pupil plane as a function of the radial coordinate for a large conventional illumination mode.
Figure 11:
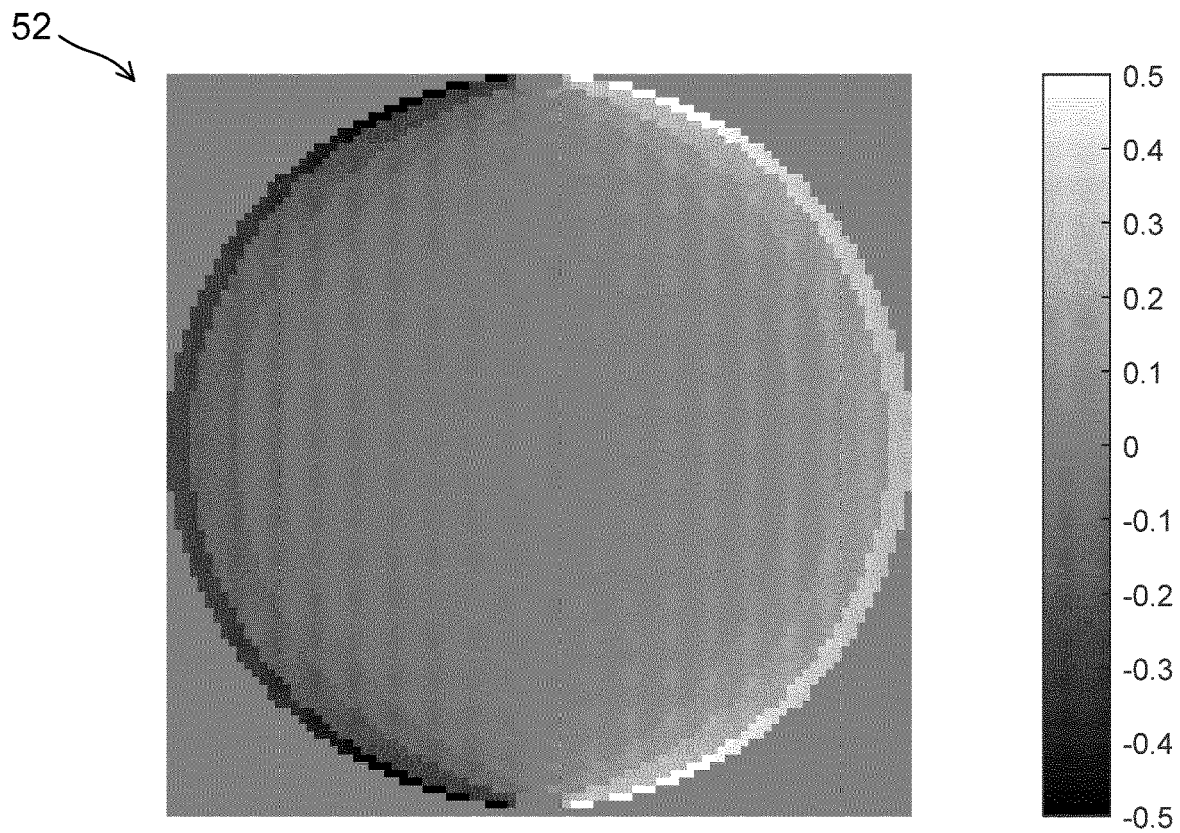
FIG. 11 shows the sensitivity map in the pupil plane for the x displacement for the illumination mode shown in FIG. 10.
Figure 14A:
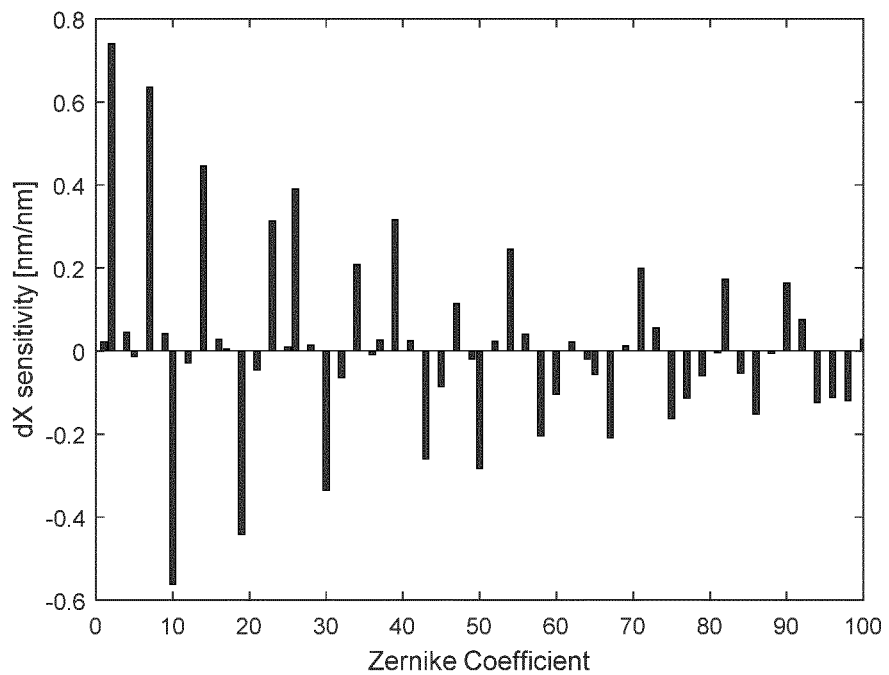
FIG. 14A shows the first 100 equivalent Zernike sensitivities for the sensitivity map shown in FIG. 11.

The large conventional illumination mode has an intensity distribution which is uniform over the entire illuminator pupil plane $PP_{IL}$. The distribution 50 of the relative intensity of radiation as a function of the radial coordinate σ is therefore constant, as shown in FIG. 10. With the illumination mode shown in FIG. 10, for this process the sensitivity map 52 in the pupil plane $PP_{PL}$ for the shift in the x direction is shown in FIG. 11. As can be seen from the sensitivity map 52 in FIG. 11, with this illumination mode this lithographic effect (shift in the x direction) is not only sensitive to the second Zernike contribution ($Z_2$). FIG. 14A shows the first 100 equivalent Zernike sensitivities $S_n$ which have been calculated for the sensitivity map 52 shown in FIG. 11. As can be seen from FIG. 14A, with this conventional illumination mode there are some significant contributions to the sensitivity map from higher order Zernike contributions.

It may be desirable to select a modified illumination mode for which this lithographic effect is (substantially) sensitive to only the second Zernike contribution ($Z_2$). Referring to Eq. (2), it can be seen that if the sensitivities $S_i$ are all zero except for one ($S_j \neq 0$ and $S_i = 0$ for all $i \neq j$) then the Zernike coefficient $Z_j$ for that lithographic effect is given by the ratio of L to $S_j$. Tailoring the sensitivity map S(x,y) in this way makes this measurement of the $Z_j$ component more accurate (no truncation error effects).

In order to select a suitable illumination mode, a non-linear least squares procedure (for example the Levenberg-Marquardt algorithm) was used. In the case of a shift in the x direction as lithographic effect, a pure tilt is used as a wavefront target. The difference between the sensitivity map and a tilted wavefront (i.e. a pure second order Zernike polynomial $z_2(x,y)$) is quadratically summed and minimized. In a first embodiment, a rotationally symmetric illumination mode was chosen wherein the intensity distribution I of radiation in the illuminator pupil plane $PP_{IL}$ is described as a radial polynomial expansion of the form:

$$I(r) = I_0 + I_2 \cdot r^2 + I_4 \cdot r^4 + I_6 \cdot r^6 + I_8 \cdot r^8 + \ldots, \quad (8)$$

where $I_0$, $I_2$, $I_4$, $I_6$ and $I_8$ are parameters of the algorithm. Note that only even orders are chosen in this polynomial expansion so as to ensure that the illumination mode is point wise symmetric. As a starting condition, $I_0 = 1$ & $I_x = 0$ ($x \neq 0$) was used.

Figure 13:
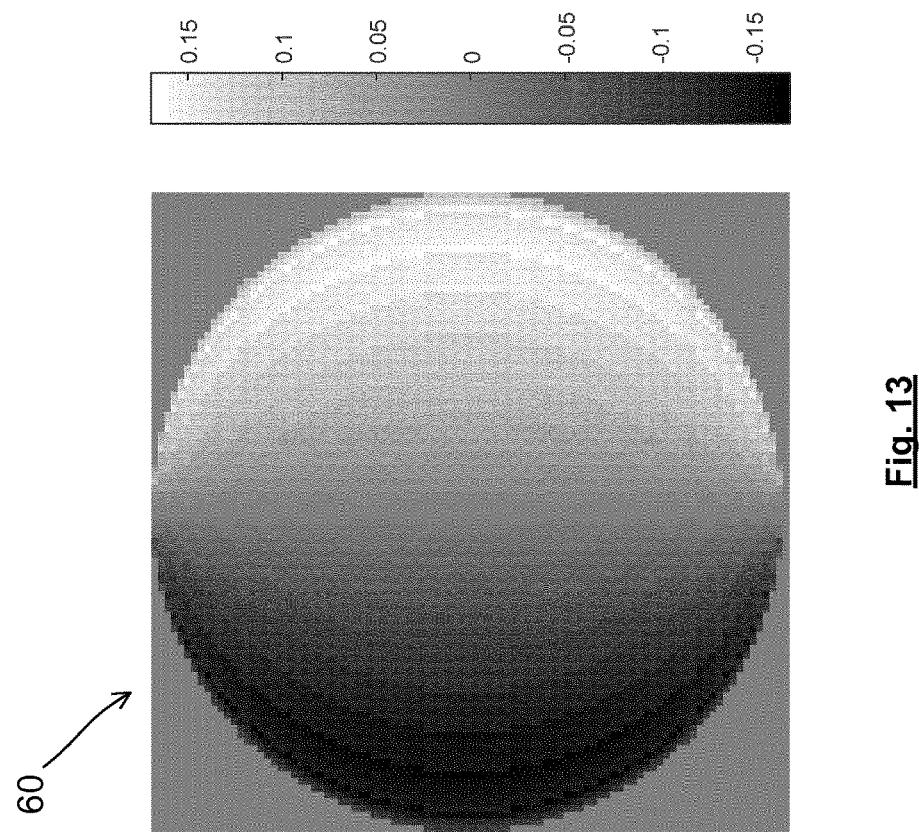
FIG. 13 shows the sensitivity map in the pupil plane for the x displacement for the illumination mode shown in FIG. 12.
Figure 12:
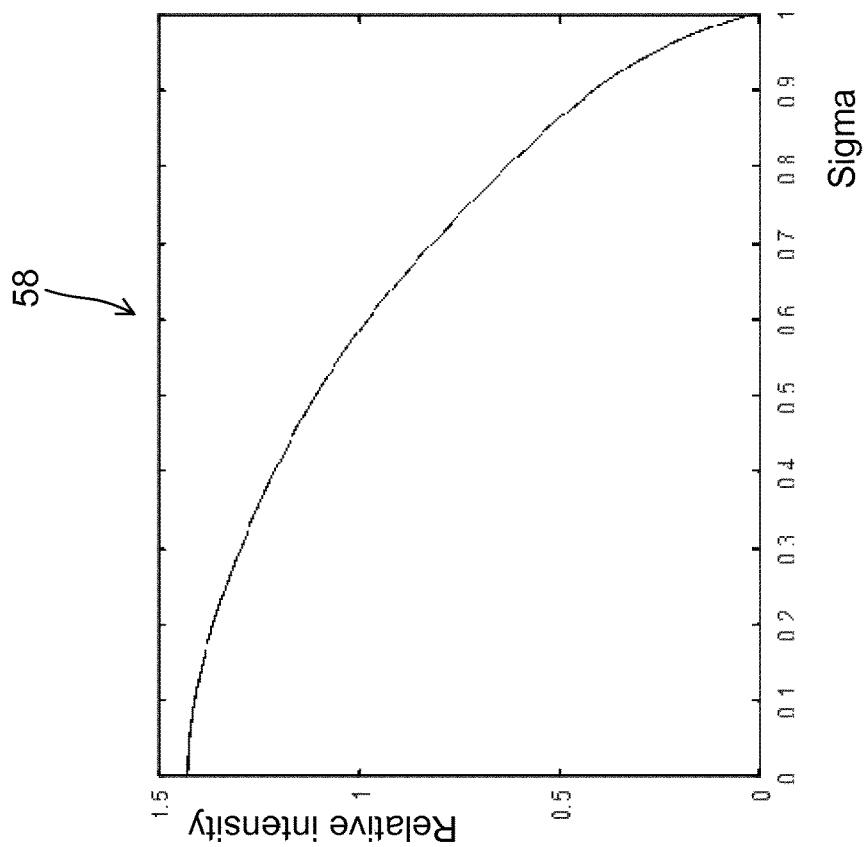
FIG. 12 shows the relative intensity of radiation in the illuminator pupil plane as a function of the radial coordinate for an optimized rotationally symmetric illumination mode.
Figure 14B:
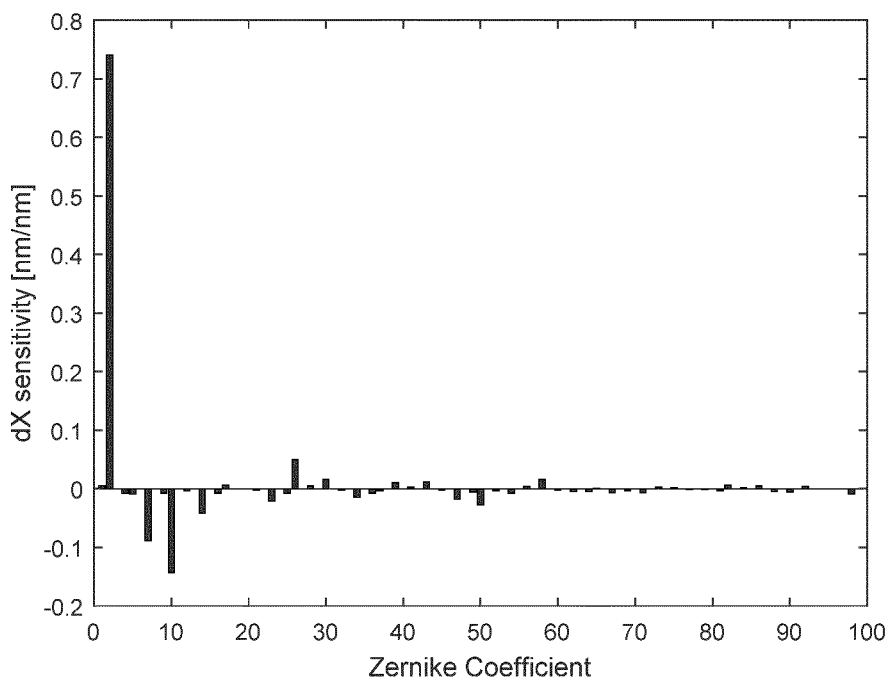
FIG. 14B shows the first 100 equivalent Zernike sensitivities for the sensitivity map shown in FIG. 13.

The distribution 58 of the relative intensity of radiation as a function of the radial coordinate σ determined by this algorithm is shown in FIG. 12. With the illumination mode shown in FIG. 12, for this process the sensitivity map 60 in the pupil plane $PP_{PL}$ for shift in the x direction is shown in FIG. 13. As can be seen from FIG. 13, the sensitivity map 60 is more like a pure tilt (i.e. less sensitive to higher order Zernike contributions) than the sensitivity map 52 for the conventional illumination mode shown in FIG. 10. FIG. 14B shows the first 100 equivalent Zernike sensitivities $S_n$ have been calculated for the sensitivity map 60 shown in FIG. 13. As can be seen from a comparison of FIGS. 14A and 14B, with this modified rotationally symmetric illumination mode the contributions to the sensitivity map from higher order Zernike contributions is significantly reduced. In turn, this improves the accuracy with which the low order aberration $Z_2$ can be determined.

Optionally, this algorithm can be refined by putting additional constraints on the illumination mode such as, for example, requiring only positive values and keeping the integral over all angles fixed.

Figure 14C:
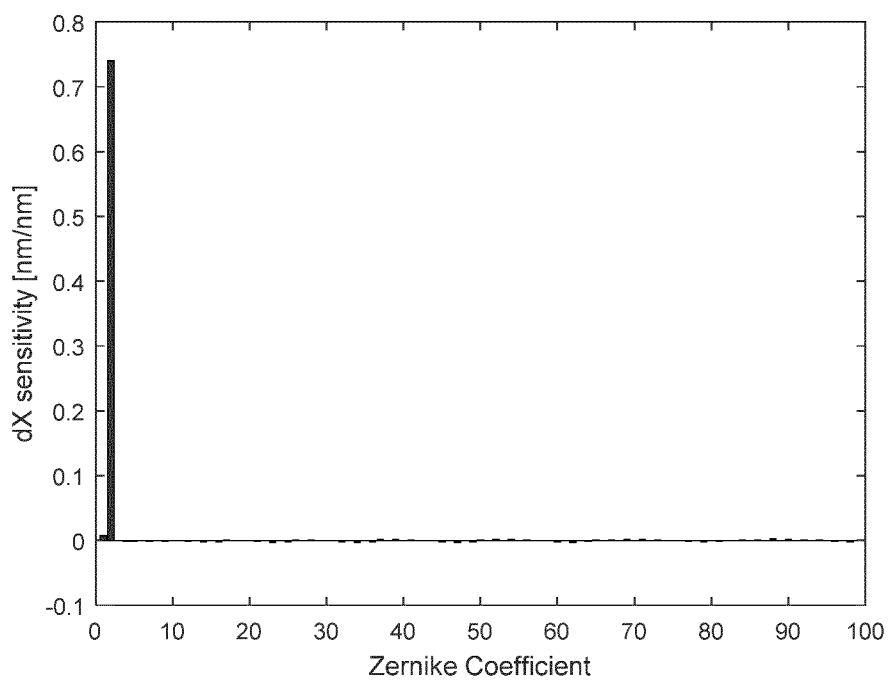
FIG. 14C shows the first 100 equivalent Zernike sensitivities for the sensitivity map shown in FIG. 15.
Figure 15A:
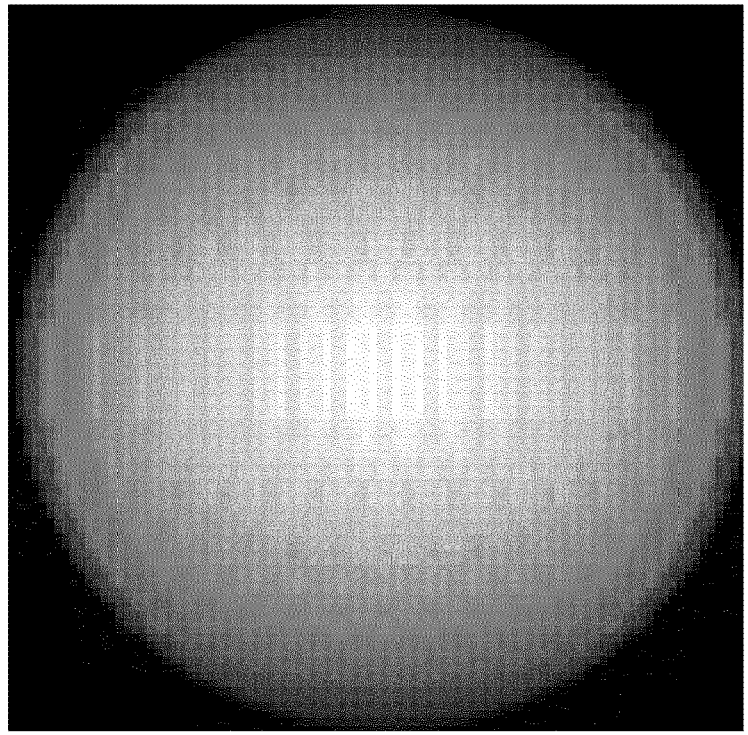
FIG. 15A shows an optimized non-rotationally symmetric illumination mode for x displacement.
Figure 15B:
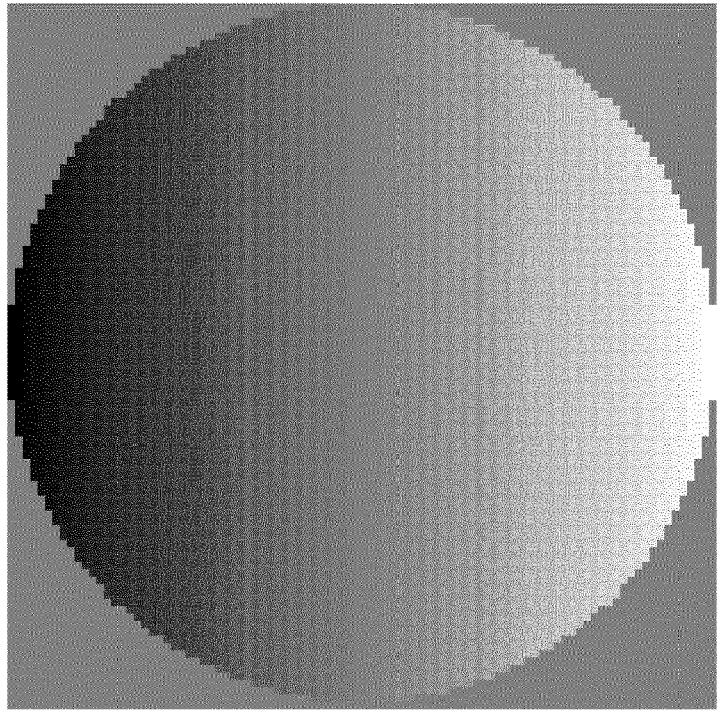
FIG. 15B shows the sensitivity map in the pupil plane for the x displacement for the optimized non-rotationally symmetric illumination mode shown in FIG. 15A.

Another embodiment of this method may allow for a non-rotationally symmetric illumination mode to be determined. In such an embodiment, each illumination point within the illuminator IL, i.e. each pixel in the illuminator pupil plane $PP_{IL}$ is a free parameter to be optimized. The value of each pixel in the illuminator pupil plane $PP_{IL}$ is constrained between 0 and 1 and the optimum illumination mode is found, again using a non-linear least squares procedure (for example the Levenberg-Marquardt algorithm). This embodiment gives a much larger optimization space and therefore the calculation takes more time. As a starting condition, the rotationally symmetric illumination mode (shown in FIG. 12) is used. The optimal non-rotationally symmetric illumination mode 61 (i.e. a map of the Electric field strength in the illuminator pupil plane) for this process is shown in FIG. 15A and the corresponding sensitivity map 62 in the pupil plane $PP_{PL}$ for the x position variable is shown in FIG. 15B. As can be seen from FIG. 15B, the sensitivity map 62 is more like a pure tilt (i.e. less sensitive to higher order Zernike contributions) than the sensitivity map 60 for the illumination mode shown in FIG. 12. FIG. 14C shows the first 100 equivalent Zernike sensitivities $S_n$ have been calculated for the sensitivity map 62 shown in FIG. 15B. As can be seen from a comparison of FIGS. 14A, 14B and 14C, with this modified non-rotationally symmetric illumination mode the contributions to the sensitivity map from higher order Zernike contributions is reduced even further. In turn, this further improves the accuracy with which the low order aberration $Z_2$ can be determined. It will be appreciated that a potential limitation of this non-rotationally symmetric illumination mode is that two the optimum illumination modes for the Zernike coefficients $Z_2$ and $Z_3$ are different. Therefore, different illumination modes should be used for determining the Zernike coefficients $Z_2$ and $Z_3$ and therefore with this embodiment these Zernike coefficients should be determined separately.

As a second example, consider the determination of Zernike coefficient $Z_4$. A $Z_4$ aberration is an even distortion of the wavefront, which results in a shift of the plane of best focus in the z direction. Contrast varies with focus and, therefore, best focus is defined as maximum contrast of an image (of a plurality of lines). In order to determine a plane of best focus, the image through focus is determined and the plane which results in the maximum contrast of the image is the plane of best focus. The lithographic effect is a shift in the z direction of the plane of best focus from a nominal best focal plane (i.e. the plane of best focus in the absence of aberrations).

Figure 16:
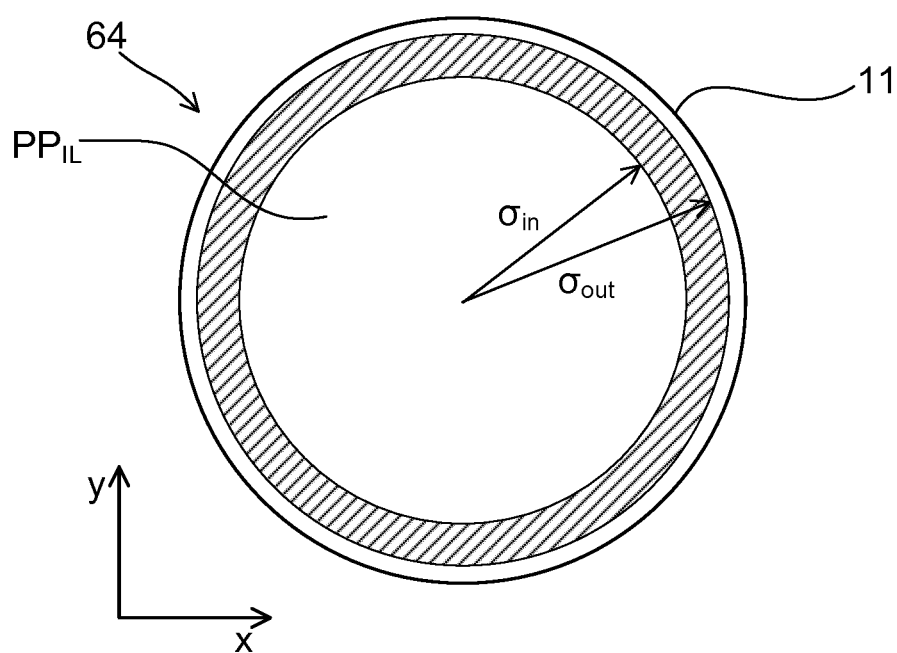
FIG. 16 shows an annular illumination mode.

For this example, the mask pattern is a grating structure comprising lines with a thickness of 100 nm interspaced with spaces with a thickness of 100 nm, i.e. a grating with a pitch of 200 nm. In this example, the lines extend in the y direction (vertical lines). Conventionally, an annular illumination mode and TE-polarization is chosen. For example, as shown in FIG. 16, the illumination mode may be an annular illumination mode 64 with a σ-inner of 0.79 and a σ-outer of 0.94. TE polarization mode may be such that the radiation is linearly polarized in a direction generally perpendicular to a radial direction in the pupil plane $PP_{IL}$.

Figure 17:
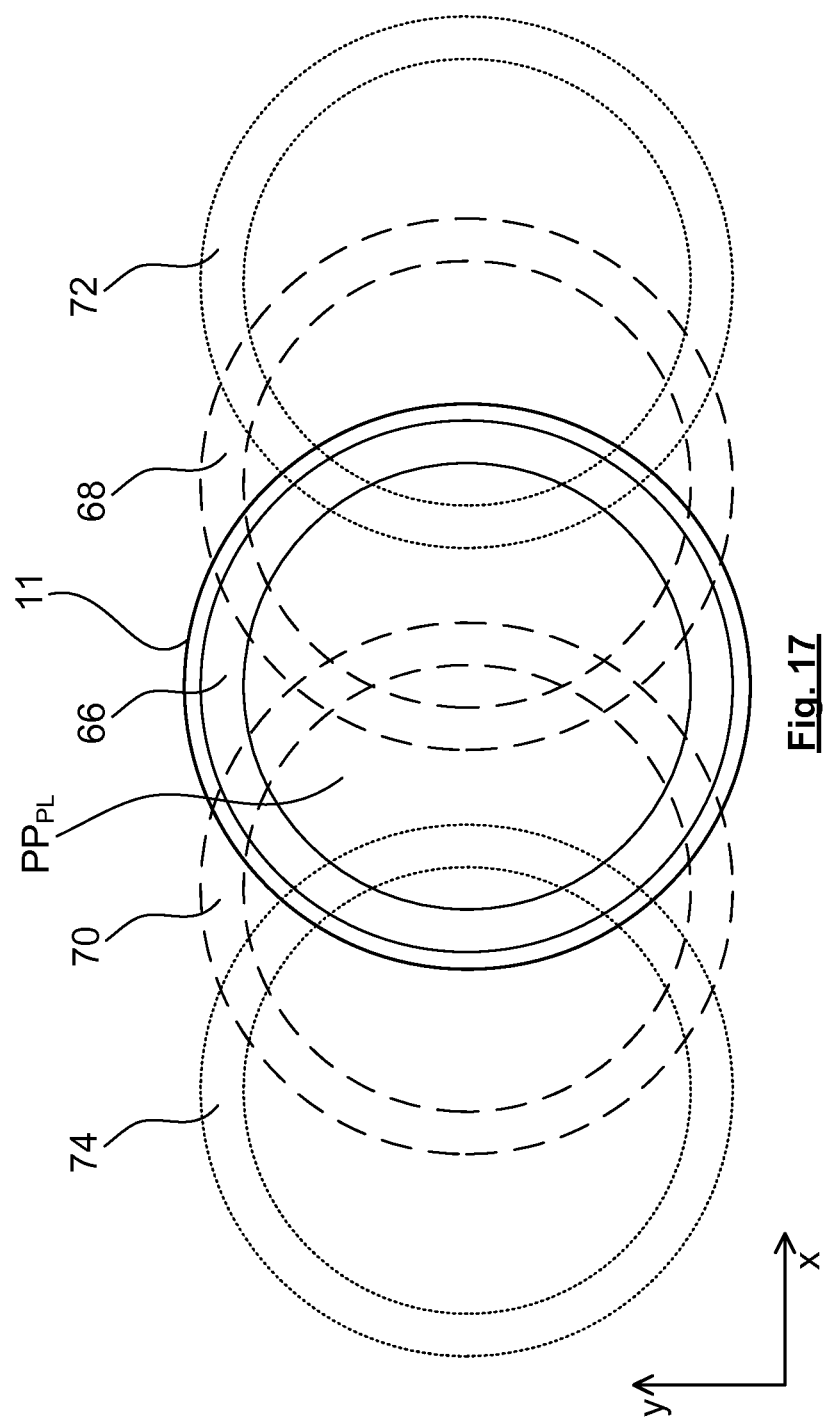
FIG. 17 shows the regions in the projection system pupil plane which receive radiation from the annular region of the annular illumination mode shown in FIG. 16 when imaging a pattern with a pitch of 200 nm (with a wavelength of 193 nm and the numerical aperture of 1.35)

Consider imaging a pattern with a pitch of 200 nm (with a wavelength of 193 nm and the numerical aperture of 1.35). The pattern will cause diffraction of the radiation such that radiation from each point in the illuminator pupil plane $PP_{IL}$ will map into a plurality of regions in the projection system pupil plane $PP_{PL}$. FIG. 17 shows the regions in the projection system pupil plane $PP_{PL}$ which receive radiation from the annular region of the annular illumination mode 64 shown in FIG. 16. A first region 66 of the projection system pupil plane $PP_{PL}$ corresponds to the zeroth order diffraction beam for that annular region. In addition, the regions 68, 70 which correspond to the $\pm 1^{st}$ diffraction orders and the regions 72, 74 which correspond to the $\pm 2^{nd}$ diffraction orders are also shown.

It will be appreciated that in the projection system pupil plane $PP_{PL}$ only these regions 66, 68, 70, 72, 74 will receive radiation. It will also be appreciated that only the overlap of these regions 66, 68, 70, 72, 74 with the circle 11 which represents the limit of what can physically be captured by the projection system PL and imaged onto the image plane IP (this represents the numerical aperture NA, or the sine of the maximum angle that can be captured by the projection system PL) will receive radiation. Therefore, for this process (imaging pattern with a pitch of 200 nm with the annular illumination mode 64 shown in FIG. 16) the sensitivity map S(x,y) only needs to be calculated for these regions.

In this example, the pattern being imaged comprises vertical lines and therefore has a diffraction pattern wherein the diffraction orders are separated in the x-direction. Therefore, the image formed in the image plane is formed by coherently summing a plurality of diffraction orders (up to five in this example) that are shifted relative to each other in the x-direction in the projection system pupil plane $PP_{PL}$. Therefore, the contrast of these vertical lines is sensitive to the curvature of the wavefront only the x-direction. The radial dependence of the Zernike coefficient $Z_4$ is $2r^2-1$, where the radial coordinate r of a point in the projection system pupil plane $PP_{PL}$ is normalised by the numerical aperture NA of the projections system PL. In terms of the x and y co-ordinates on the pupil plane, the radial dependence of the Zernike coefficient $Z_4$ is $2(x^2+y^2)-1$. Similarly, the radial dependence of the Zernike coefficient Z5 is $(x^2-y^2)$. Therefore, the curvature of the wavefront in the x-direction is proportional to a linear combination of these Zernike polynomials: $0.25 \cdot Z_4 + 0.5 \cdot Z^5$, which is proportional to $x^2$ (i.e. a curvature only in the x direction). It is desirable to determine an illumination mode such that the defocus as determined by a loss of contrast in the image of these vertical lines is substantially only sensitive to the Zernike coefficients $Z_4$ and $Z^5$.

Figure 18:
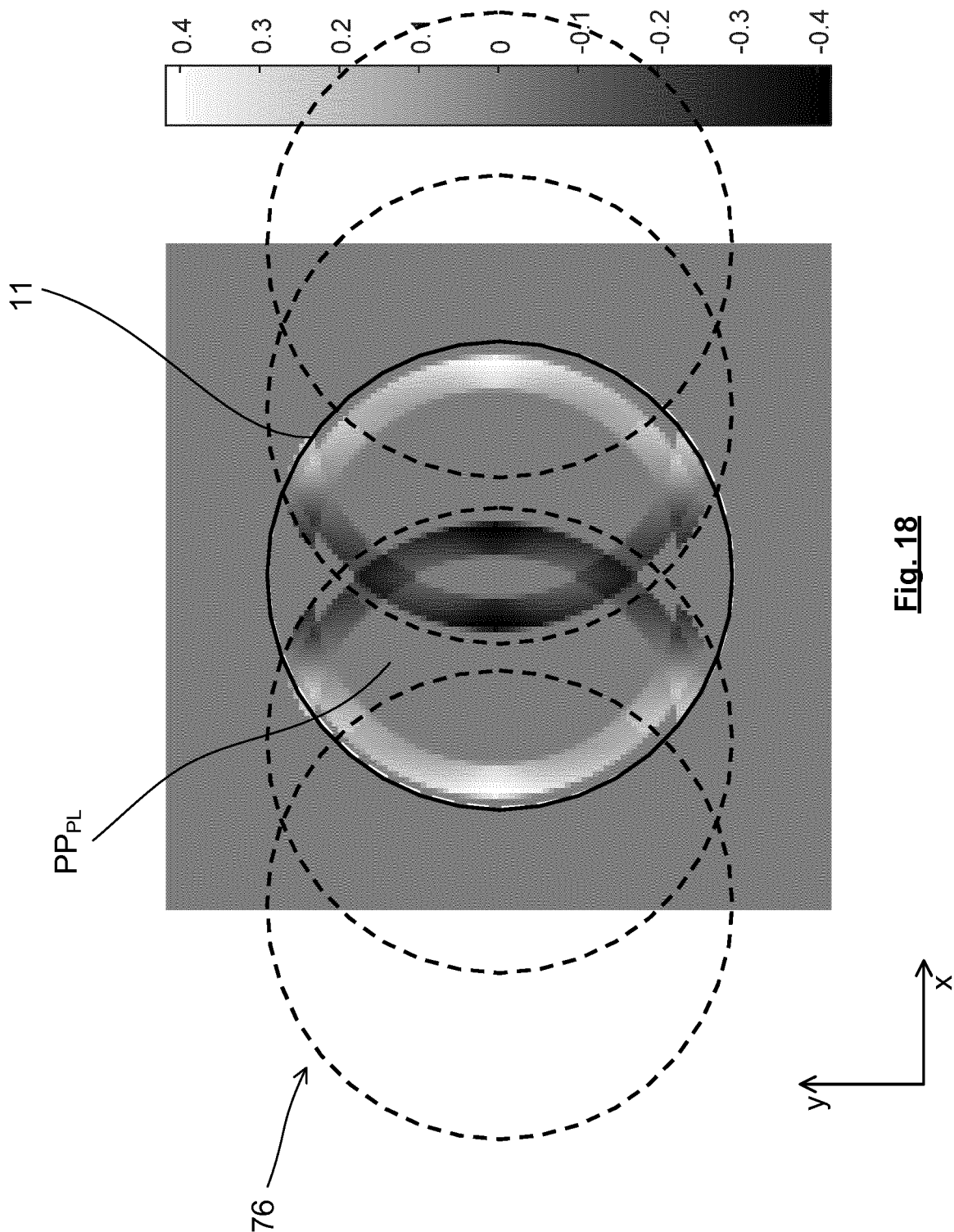
FIG. 18 shows the sensitivity map for defocus with the illumination mode shown in FIG. 16.
Figure 19A:
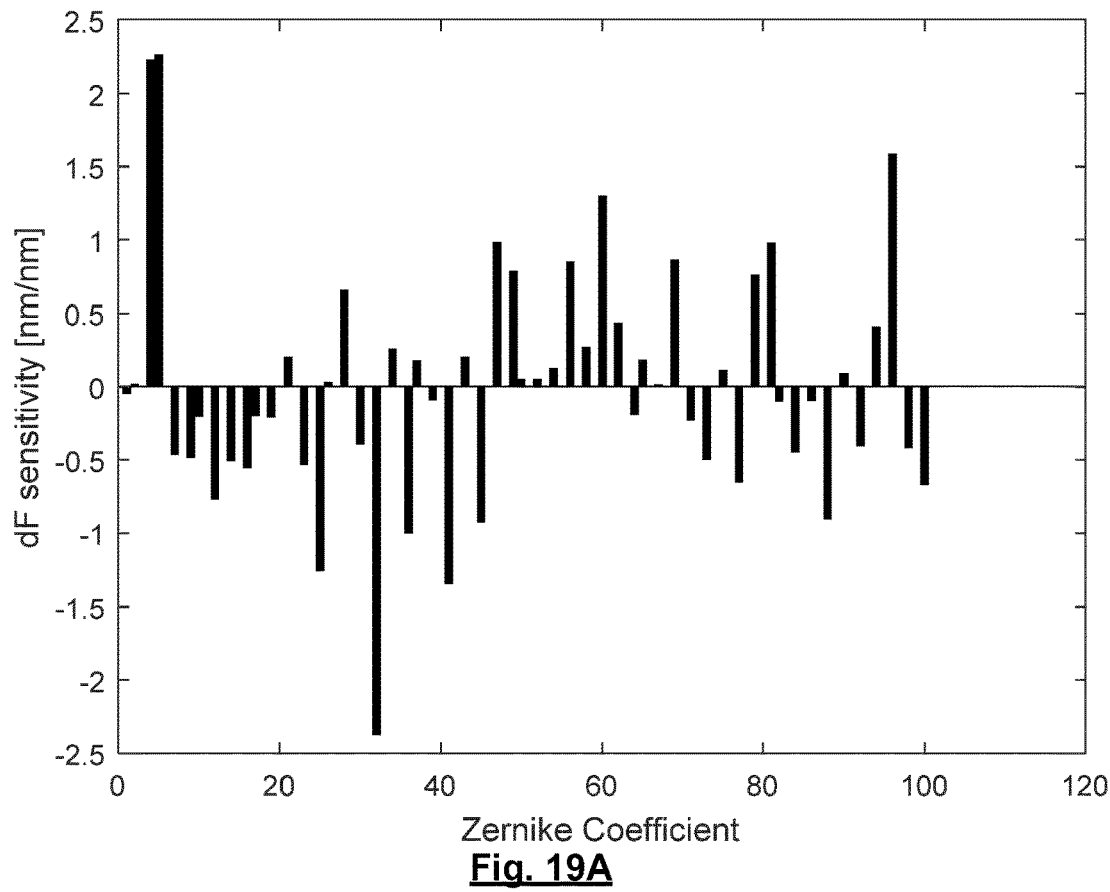
FIG. 19A shows the first 100 equivalent Zernike sensitivities have been calculated for the sensitivity map shown in FIG. 18.

With the illumination mode shown in FIG. 16, for this process the sensitivity map 76 in the pupil plane $PP_{PL}$ for the shift in the z direction of the plane of best focus is shown in FIG. 18. In particular, the sensitivity map 76 is for the shift in the z direction of the plane of best focus as defined by the plane which results in the maximum contrast of the image of the vertical lines. FIG. 19A shows the first 100 equivalent Zernike sensitivities $S_n$ have been calculated for the sensitivity map 76 shown in FIG. 18. As can be seen from FIG. 19A, with this conventional illumination mode there are some significant contributions to the sensitivity map from higher order Zernike contributions.

It may be desirable to select a modified illumination mode for which this lithographic effect is predominantly sensitive to the fourth and fifth Zernike contributions ($Z_4$ and $Z^5$), since these are the Zernike contributions which relate to curvature in the x direction which, in turn, can affect the contrast of vertical lines. Tailoring the sensitivity map S(x,y) in this way makes this measurement of the $Z_4$ component more accurate (no truncation error effects).

In one embodiment, a rotationally symmetric illumination mode was chosen wherein the intensity distribution I of radiation in the illuminator pupil plane $PP_{IL}$ is described as a radial polynomial expansion of the form of Eq. (8). As with the above-described example for the $Z_2$ aberration and $Z_3$ aberration measurements, in order to select a suitable illumination mode, a non-linear least squares procedure (for example the Levenberg-Marquardt algorithm) was used with a top-hat distribution as a starting condition (i.e. $I_0=1$ & $I_x=0$ ($x \neq 0$)).

Consider the coherent part of image formation in the image plane, which is the result of an interference between multiple diffraction orders. Due to diffraction from the mask in the object plane, each point of the illuminator pupil plane $PP_{IL}$ is imaged onto a plurality of points in the projection system pupil plane $PP_{PL}$ (one for each diffraction order of the mask). For example, as illustrated in FIG. 17, each point in the illuminator pupil plane $PP_{IL}$ is imaged onto five different points, one in each of regions 66, 68, 70, 72, 74 (although not all of these five different points will be captured by the projection system PL and imaged onto the image plane IP). All of the contributions which originate from the same point in the illuminator pupil plane $PP_{IL}$ sum coherently to form the image. Therefore, since the pattern comprises vertical lines (i.e. extending in the y direction) each pixel in the projection system pupil plane $PP_{PL}$ will interfere with other pixels that are shifted in the x direction. For example, a pixel with coordinates (x,y) will interfere with points (x',y), where $x'=x+k\lambda/p$, $\lambda$ being the wavelength of the radiation, p being the pitch of the pattern and k being an integer (i.e. $k=0, \pm 1, \pm 2, \ldots$). A wavefront description of focus is given by $\sqrt{1-\Delta r^2}$, where $\Delta r$ is the coordinate difference between different diffraction orders. That is, for a given curvature of the wavefront, the shift in the z direction of the plane of best focus is proportional to $\sqrt{1-\Delta r^2}$ (and proportional to the curvature).

As explained above, the position of the plane which maximizes the contrast of a pattern comprising vertical lines is independent of the curvature of the wavefront in the y-direction. Therefore, there is no restriction on the shape of the wavefront in the y direction. In the following it is assumed that the wavefront is flat in the y direction (i.e. there is no curvature in this direction). The wavefront sensitivity map was fitted to the following function:

$$S(x,y) = c_0(y) + df\sqrt{1-x^2}, \quad (9)$$

where $c_0(y)$ is a row dependent offset parameter and df is a global curvature. The difference between the sensitivity map and the target sensitivity map given in Eq. (9) is quadratically summed and minimized.

Figure 19B:
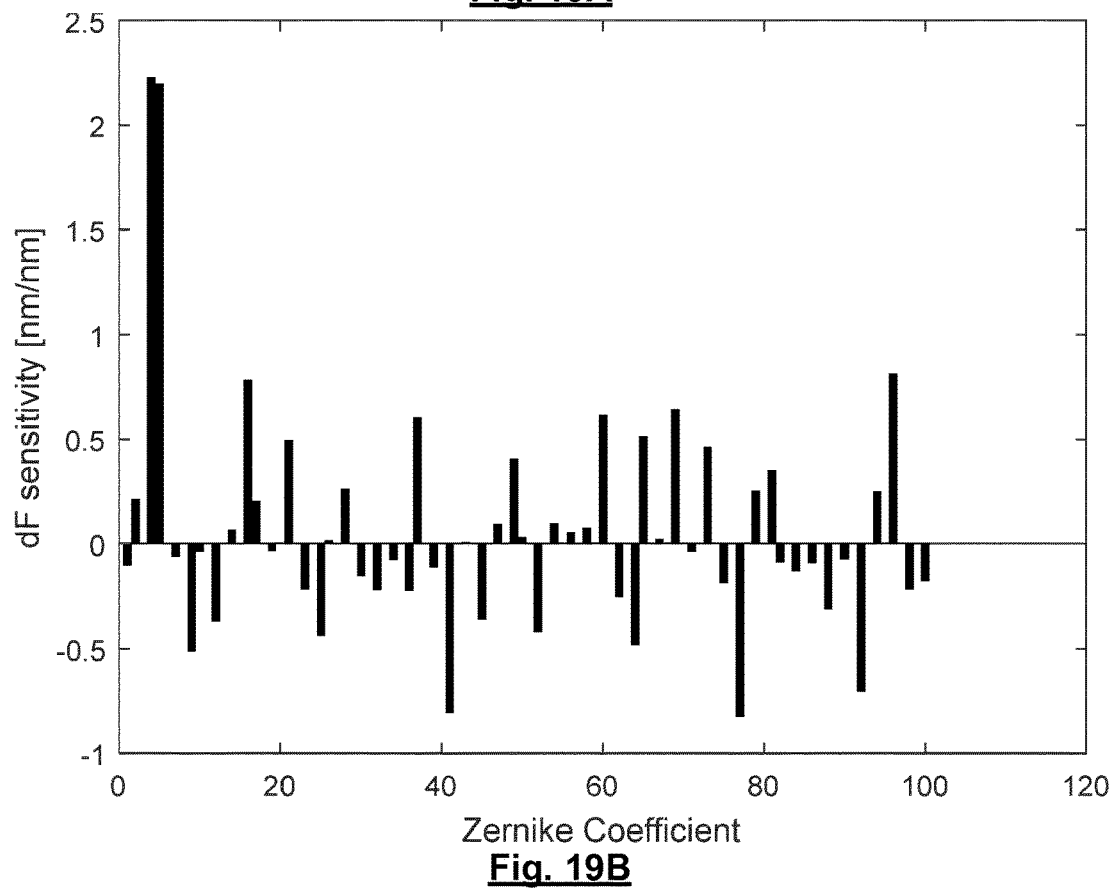
FIG. 19B shows the first 100 equivalent Zernike sensitivities have been calculated for the sensitivity map shown in FIG. 21.
Figure 20A:
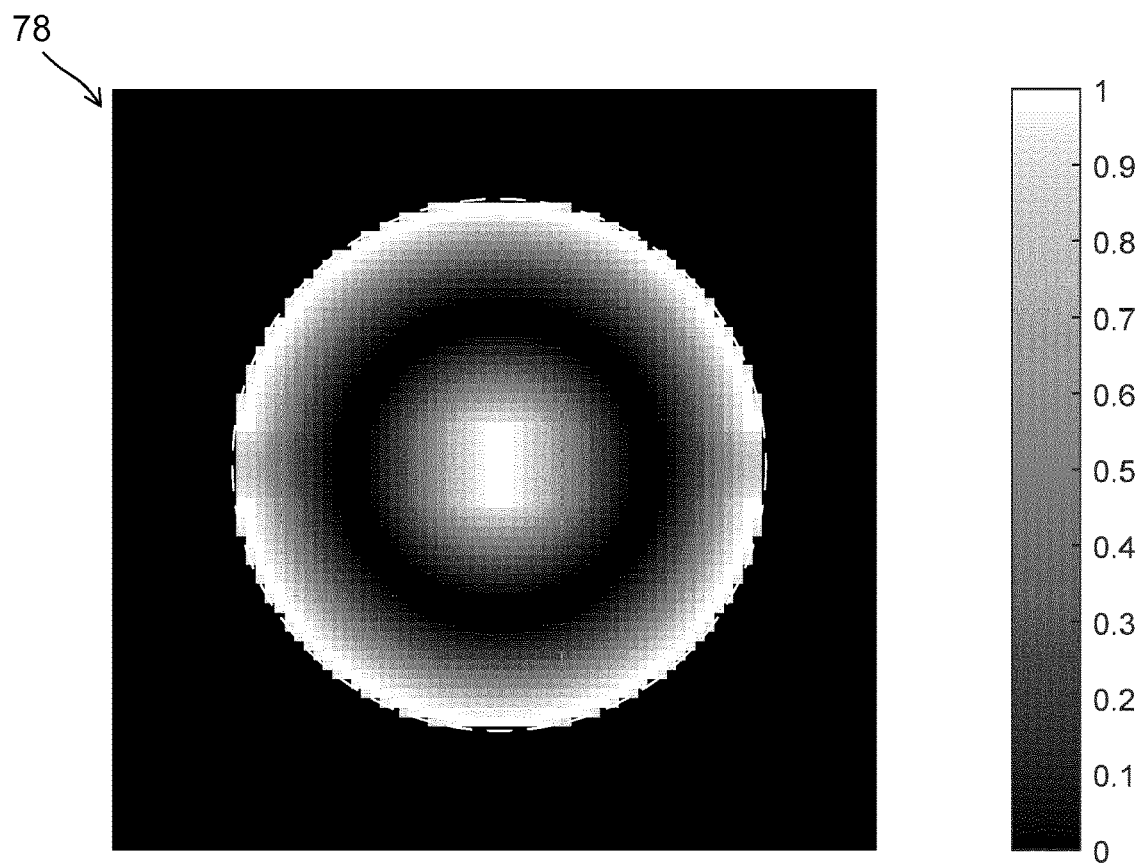
FIG. 20A shows an optimized rotationally symmetric illumination mode.
Figure 20B:
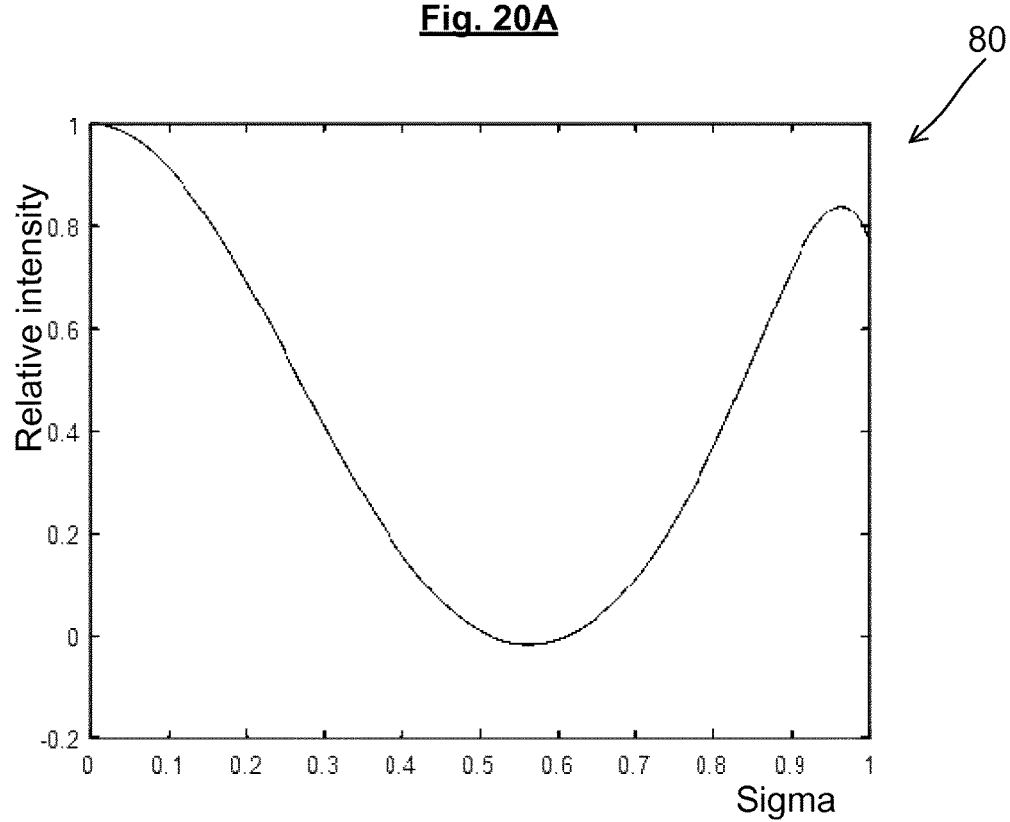
FIG. 20B shows the relative intensity of radiation in the illuminator pupil plane as a function of the radial coordinate for the optimized rotationally symmetric illumination mode shown in FIG. 20A.
Figure 21:
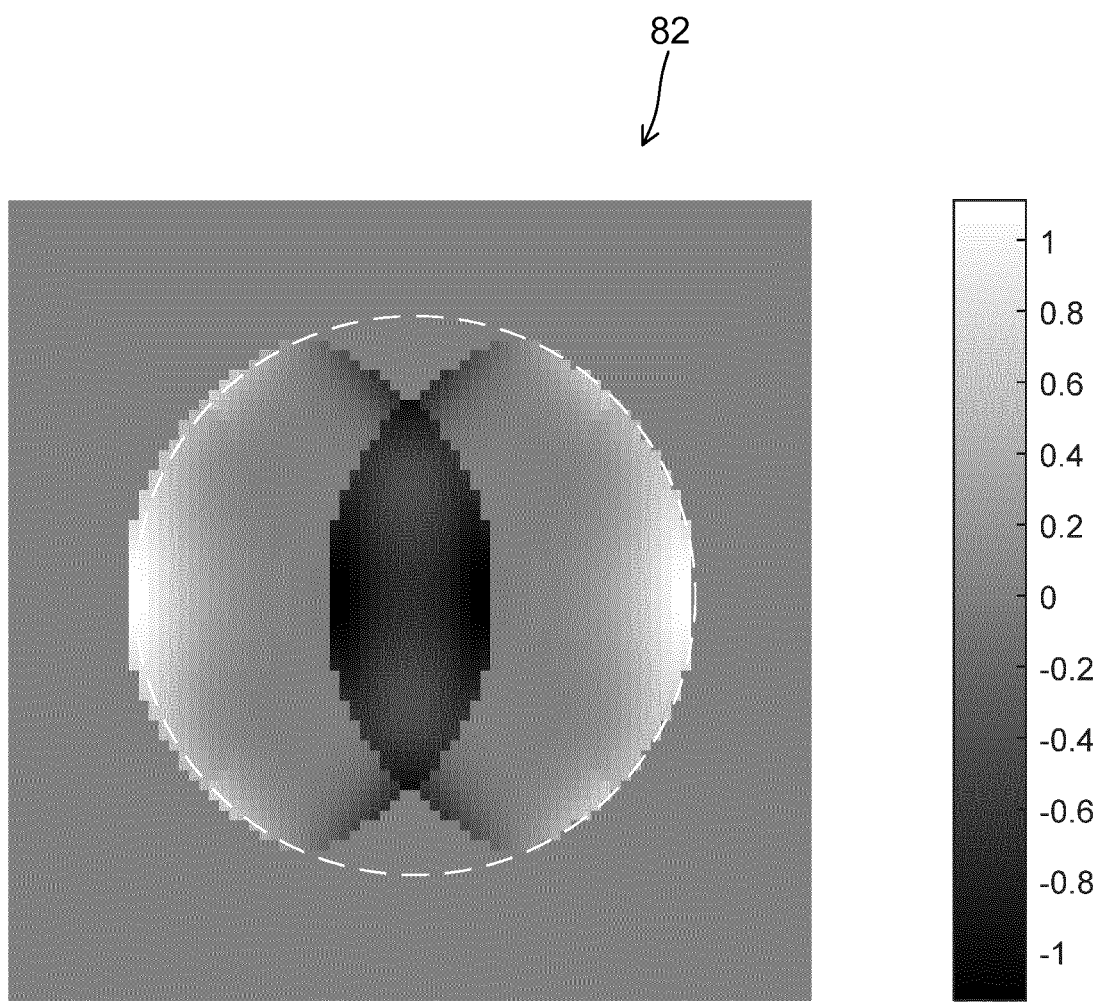
FIG. 21 shows the sensitivity map for defocus with the illumination mode shown in FIGS. 20A and 20B.

The optimised illumination mode 78 is shown in FIG. 20A and the distribution 80 of the relative intensity of radiation as a function of the radial coordinate σ determined by this algorithm is shown in FIG. 20B. With the illumination mode 78 shown in FIGS. 20A and 20B, for this process the sensitivity map 82 in the pupil plane $PP_{PL}$ for the shift in the z direction of the plane of best focus is shown in FIG. 21. FIG. 19B shows the first 100 equivalent Zernike sensitivities $S_n$ have been calculated for the sensitivity map 82 shown in FIG. 21. As can be seen from a comparison of FIGS. 19A and 19B, with this modified rotationally symmetric illumination mode the contributions to the sensitivity map from higher order Zernike contributions is significantly reduced. In turn, this improves the accuracy with which the low order aberration $Z_4$ can be determined.

As described above, the sensitivity map $S(x,y)$ according to embodiments of the present invention provides a useful tool for measuring, and controlling the effects of aberrations. The sensitivity map $S(x,y)$ is dependent on all of the parameters of a lithographic process, including an illumination mode. As explained above with reference to FIGS. 9 to 21, by selecting an illumination mode for a lithographic process in dependence on the sensitivity map it is possible to tune or optimize an illumination mode such that the lithographic process is more sensitive to one or more types of aberrations and less sensitive to one or more other types of aberrations. It will be appreciated that the sensitivity map $S(x,y)$ is dependent on all of the parameters of a lithographic process and that in alternative embodiments of the invention, the sensitivity map $S(x,y)$ may be used to determine other parameters of a lithographic process. For example, a mask pattern may be selected in dependence on the sensitivity map $S(x,y)$ determined using the methods described above.

Some aspects of the sensitivity map $S(x,y)$ according to embodiments of the present invention are now discussed with reference to FIGS. 22A to 27. In particular, the dependence of the sensitivity map $S(x,y)$ on a pupil fill factor or pupil fill ratio of the illumination mode used for an example pattern will now be discussed.

Figure 22A:
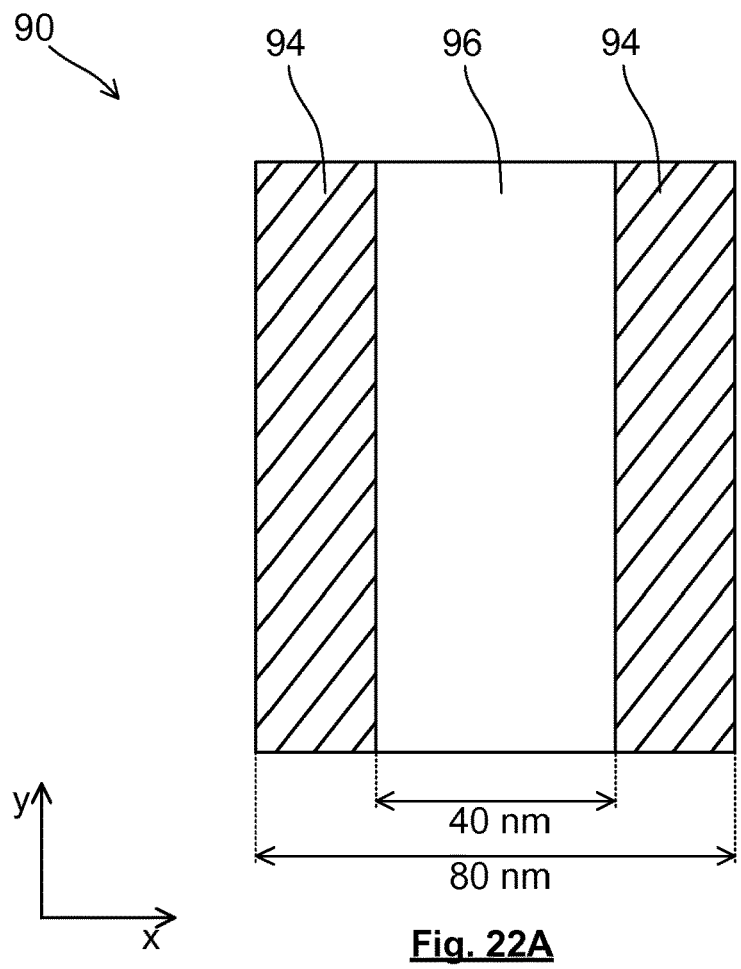
FIG. 22A another example mask pattern comprising lines extending in the y direction.
Figure 22B:
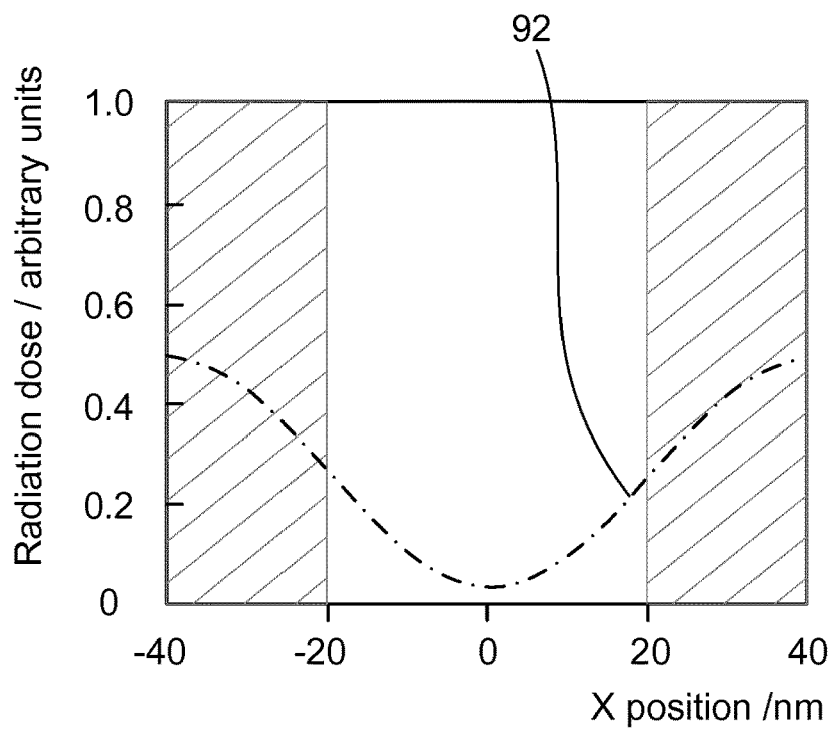
FIG. 22B shows the dose of radiation received by the wafer as a function of position in the x direction when imaging the pattern shown in FIG. 22A.
Figure 24C:
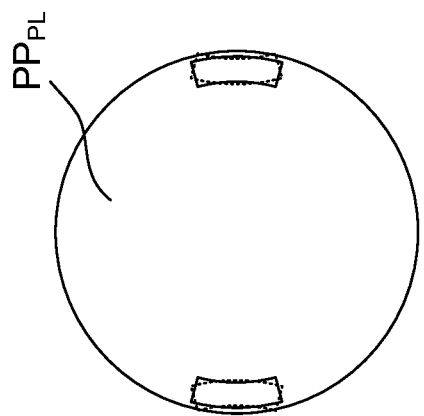
FIGS. 24A-24E illustrate the regions in the projection system pupil plane, which receive radiation when the pattern shown in FIG. 22A is imaged using the illumination modes shown in FIGS. 23A-23E respectively, zeroth order diffraction beams indicated by a solid line and $\pm 1^{st}$ order diffraction beams indicated by a dotted line.
Figure 24B:
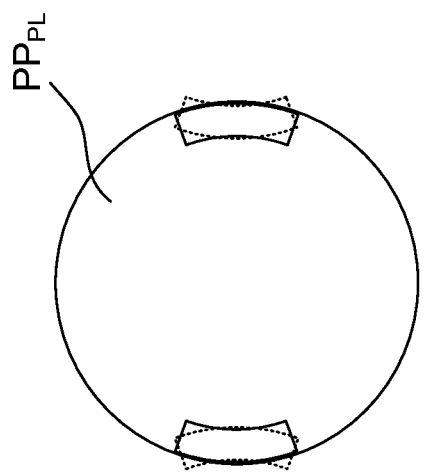
Figure 24E:
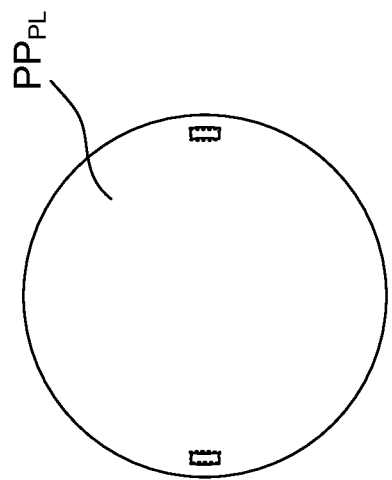
Figure 24A:
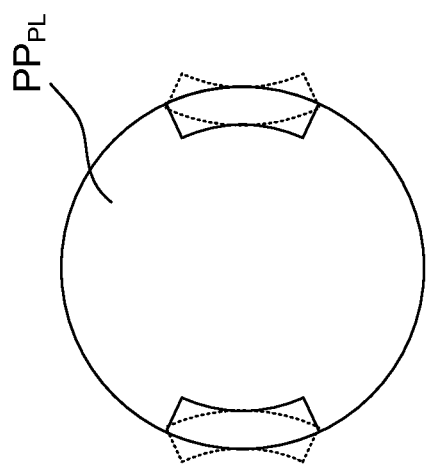
Figure 24D:
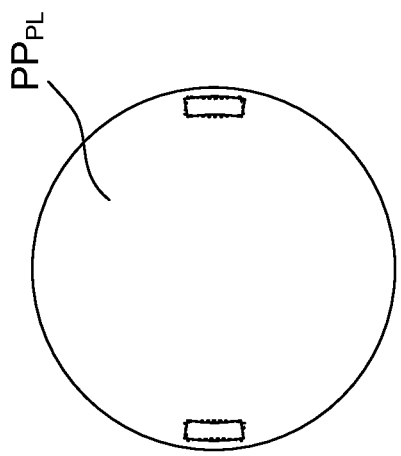

The example pattern 90 on the mask M as shown in FIG. 22A and comprises a plurality of lines extending in the y direction (which may be referred to as vertical lines). The dose of radiation 92 received by the wafer W (in the absence of aberrations) as a function of position in the x direction is shown in FIG. 22B, with the pattern 90 on the mask M overlaid.

FIG. 22A shows the unit cell of a repeating pattern on the mask M. The pattern comprises alternating lines 94 (i.e. light transmitting portions of the mask M, depicted as cross hatched lines) and spaces 96 in between (i.e. light blocking portions of the mask M). The spaces 96 may be formed from a material that at least partially absorbs the light. For example, the spaces 96 may be formed from a material such that the intensity of the radiation transmitted by the spaces 96 has approximately 6% of the intensity of the radiation transmitted by the lines 94. Each line 94 and each space 96 has a thickness of 40 nm such that the unit cell shown in FIG. 22A has a pitch of 80 nm.

It will be appreciated that the pattern 90 shown in FIG. 22A is provided on a mask M disposed in an object plane OP of a lithographic apparatus and is imaged onto a substrate (e.g. a silicon wafer) that has a layer of radiation-sensitive material (resist) and which is in an image plane IP of the lithographic apparatus. Regions of the resist which receive a dose of radiation which exceeds a threshold value undergo a transformation (they have been cured by the radiation). During subsequent processing of the wafer either the regions which have or have not been cured by the radiation can be selectively removed (e.g. by etching). It will therefore be appreciated that the thickness of the lines and spaces which are formed on the substrate W (after this subsequent processing of the substrate W) will be dependent on the energy dose 92 received by the wafer W and the threshold value (which will be a property of the resist).

As explained above, aberrations caused by the projection system PL result in distortions of the wavefront as it approaches the image plane IP from an ideal spherical wavefront. Furthermore, the lowest order Zernike contributions to the wavefront aberration map (Zernike coefficients $Z_2$, $Z_3$ and $Z_4$) relate to the position of the image plane IP. For example, Zernike coefficients $Z_2$ and $Z_3$ describe the tilt of the wavefront in the pupil plane $PP_{PL}$ in the x and y directions respectively, which relate to the position of the image in the x and y directions. Zernike coefficient $Z_4$ describes a curvature of the wavefront in the plane $PP_{PL}$ and relates to the z position of the image plane IP.

For the present example, two observation metrics, or lithographic effects, are considered. The first lithographic effect is the x-position of the image (for example a shift of the image in the x-direction relative to a nominal position), which, as explained above, is dependent on the aberrations described by the Zernike coefficient $Z_2$. The second lithographic effect is the z-position of the image plane (for example a shift in the z direction of plane of best focus relative to a nominal image plane), which, as explained above, is dependent on the aberrations caused by the Zernike coefficient $Z_4$.

For the pattern 90 shown in FIG. 22A, which consists essentially of lines in one direction, good imaging and a large process window can be obtained by the use of dipole illumination.

In particular, the poles may be arranged such that in the projection system pupil plane $PP_{PL}$, one of the first order diffracted beams deriving from each of the two poles in the illumination system generally coincides with the zeroth order beam from the other pole caused by the pattern (which has a pitch of 80 nm). That is, the parameters of the illumination mode are chosen such that the angular separation of the two poles 2σ (σ being the radial position of each pole) is approximately equal to $\lambda/(p \cdot NA)$, where $\lambda$ is the wavelength, p is the pitch of the pattern 90 and NA is the numerical aperture. In this example, $\lambda=193$ nm, p=80 nm and NA=1.35 such that the normalized radial position of each pole in the illuminator pupil plane $PP_{IL}$ should be approximately 0.9.

The sensitivity map S(x,y) for these lithographic effects (the x-position and z-position of the image plane), assuming this pattern 90 will now be discussed for five different illumination modes as shown in FIGS. 23A-23E. Each of the five illumination modes comprises a dipole distribution 100, 102, 104, 106, 108 that is similar in form to the dipole distribution 2 shown in FIG. 3A and described above. Also shown in FIGS. 23A-23E is a circle 11 which represents the limit of what can physically be captured by the projection system PL and imaged onto the image plane IP (this represents the numerical aperture NA, or the sine of the maximum angle that can be captured by the projection system PL). In coordinates that are normalized by the numerical aperture NA of the projection system PL, circle 11 has a radius σ=1.

The dipole distributions 100, 102, 104, 106, 108 each comprise two diametrically opposed pole regions 8 where the intensity is non-zero. Each pole region 8 is generally of the form of a sector of an annulus, defined by the intersection of an annulus and two diametrically opposed sectors of a circle. The annulus is defined by two concentric circles of radii $\sigma_{in}$ and $\sigma_{out}$ (commonly referred to as σ-inner and σ-outer respectively). The pole regions 8 of the dipole distributions 100, 102, 104, 106, 108 are different such that each dipole distribution 100, 102, 104, 106, 108 has a different pupil fill factor or pupil fill ratio. Here it will be appreciated that the pupil fill factor or pupil fill ratio is the ratio of the area of the illuminator pupil plane $PP_{IL}$ that receives radiation to the total area of the illuminator pupil plane $PP_{IL}$ (i.e. the ratio of the total area of the pole regions 8 to the area of the circle 11 which represents the numerical aperture NA of the projection system PL). This has been achieved by varying both the size of the annulus defined by the two concentric circles of radii $\sigma_{in}$ and $\sigma_{out}$ and the angular extent of the pole regions 8.

In the dipole distribution 100 shown in FIG. 23A, each pole region 8 subtends an angle at the centre 10 of the illuminator pupil plane $PP_{IL}$ of approximately 50° and each pole region 8 has a σ-inner of 0.79 and a σ-outer of 1.0 such that the average radial position of each pole is approximately 0.9.

In the dipole distribution 102 shown in FIG. 23B, each pole region 8 subtends an angle at the centre 10 of the illuminator pupil plane $PP_{IL}$ of approximately 40° and each pole region 8 has a σ-inner of 0.81 and a σ-outer of 0.99 such that the average radial position of each pole is approximately 0.9.

In the dipole distribution 104 shown in FIG. 23C, each pole region 8 subtends an angle at the centre 10 of the illuminator pupil plane $PP_{IL}$ of approximately 30° and each pole region 8 has a σ-inner of 0.83 and a σ-outer of 0.97 such that the average radial position of each pole is approximately 0.9.

In the dipole distribution 106 shown in FIG. 23D, each pole region 8 subtends an angle at the centre 10 of the illuminator pupil plane $PP_{IL}$ of approximately 20° and each pole region 8 has a σ-inner of 0.85 and a σ-outer of 0.95 such that the average radial position of each pole is approximately 0.9.

In the dipole distribution 100 shown in FIG. 23A, each pole region 8 subtends an angle at the centre 10 of the illuminator pupil plane $PP_{IL}$ of approximately 10° and each pole region 8 has a σ-inner of 0.87 and a σ-outer of 0.93 such that the average radial position of each pole is approximately 0.9.

For each of the dipole distributions 100, 102, 104, 106, 108, a line that bisects the two opposing pole regions 8 is generally in the x direction. With these illumination modes the radiation may be linearly polarized in the y direction.

Consider imaging the pattern 90 shown in FIG. 22A, which consists of a periodic structure with a pitch of 80 nm (with a wavelength of 193 nm and the numerical aperture of 1.35). The pattern 90 on the mask will cause diffraction of the radiation such that radiation from each pole 8 in the illuminator pupil plane $PP_{IL}$ will map into a plurality of regions in the projection system pupil plane $PP_{PL}$, as now described with reference to FIGS. 24A-24E. In particular, each of the two poles 8 illuminates a conjugate region of the projection system pupil plane $PP_{PL}$ which corresponds to the zeroth order diffraction beam for that pole 8 (shown in FIGS. 24A-24E with a solid line). In addition, at least part of one of the $\pm 1^{st}$ order diffraction beam from each pole region 8 will illuminate a region of the projection system pupil plane $PP_{PL}$ (shown in FIGS. 24A-24E with a dotted line) which overlaps with the zeroth order diffraction beam for the other pole 8.

FIGS. 25A-25E show the sensitivity maps 110, 112, 114, 116, 118 for the shift of the image in the x-direction relative to a nominal position for the pattern 90 using an illumination mode having a dipole distribution 100, 102, 104, 106, 108 as shown in FIGS. 23A-23E respectively.

It can be seen from FIGS. 25A-25E that, as discussed above with reference to FIGS. 5A-5C, only localized portions of the projection system pupil plane $PP_{PL}$ receive radiation. As can be seen from FIGS. 25A-25E, when imaging the pattern 90 shown in FIG. 22A (having a pitch of 80 nm) with a wavelength of 193 nm and a numerical aperture of 1.35, only two localized portions of the projection system pupil plane $PP_{PL}$ receive radiation. As explained above with reference to FIG. 24A-24E, each of these localized portions of the projection system pupil plane $PP_{PL}$ is defined by a zeroth order diffraction beam for one of the pole regions 8 and one of the $\pm 1^{st}$ order diffraction beam from the other pole region 8. Therefore, for this process (imaging the pattern 90 shown in FIG. 22A with the dipole illumination modes 100, 102, 104, 106, 108 shown in FIGS. 23A-23E) the sensitivity map S(x,y) only needs to be calculated for these localized portions. These two localized portions may be considered to contain pixels of the sensitivity map S(x,y) with non-zero values whereas all other pixels of the sensitivity map S(x,y) are zero.

The inventor has realized that, in general, only those part of the projection system pupil plane $PP_{PL}$ which contribute to the image formation (for example of a pattern 90) will have a non-zero value in the wavefront sensitivity map. As will be appreciated by the skilled person, in order for an image to be formed at least two diffraction orders formed by the pattern (for example pattern 90) should be (at least partially) within the numerical aperture of the projection system PL. In particular, it is radiation from those parts of the illuminator pupil plane $PP_{IL}$ which map onto a plurality of (i.e. at least two) regions in the projection system pupil plane $PP_{PL}$ which contribute to the image formation. This can be seen from FIGS. 25A-25E, as now discussed.

It can be seen from FIGS. 25A-25E that the localized portions of the projection system pupil plane $PP_{PL}$ which contain pixels of the sensitivity map S(x,y) with non-zero values are each generally defined by a portion of the projection system pupil plane $PP_{PL}$ that receives a zeroth order diffraction beam for one of the pole regions 8 and a portion that receives one of the ±1$^{st}$ order diffraction beam from the other pole region 8.

Figure 25C:
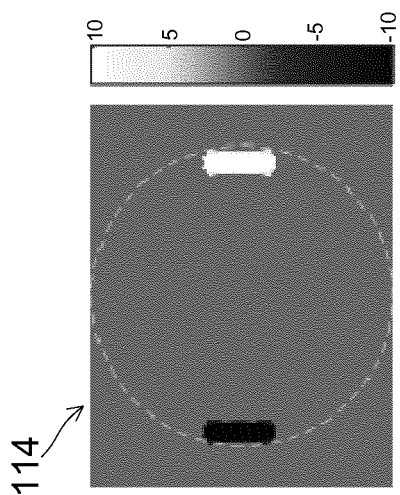
FIGS. 25A-25E show the sensitivity maps for the shift of the image in the x-direction relative to a nominal position when the pattern shown in FIG. 22A is imaged using the illumination modes shown in FIGS. 23A-23E respectively.
Figure 25B:
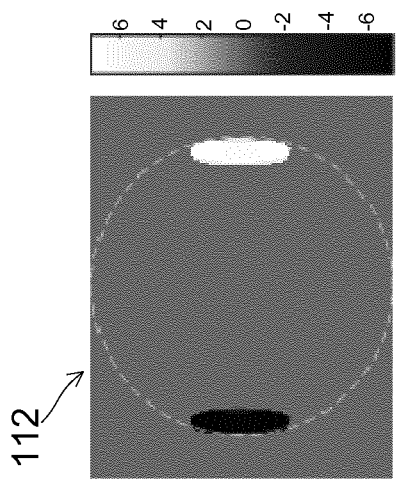
Figure 25E:
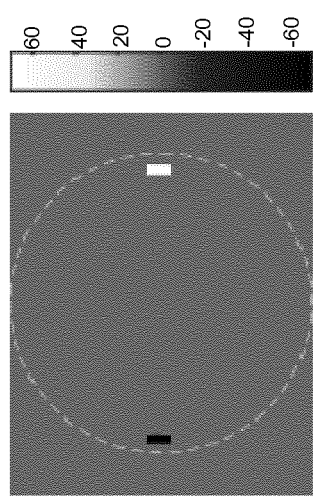
Figure 25A:
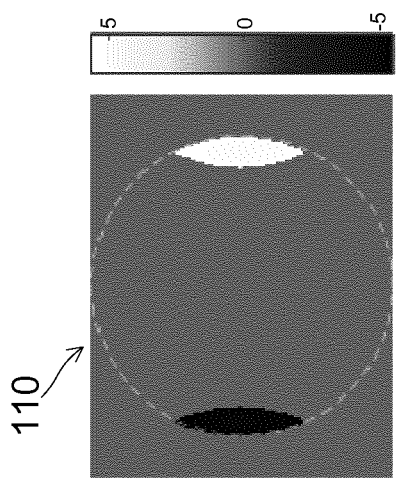

In particular, it can be seen from FIGS. 25A and 25B that for illumination modes wherein only part of one of the first order diffraction beams from each of the pole regions 8 falls within the numerical aperture of the projection system PP, the localized portions of the projection system pupil plane $PP_{PL}$ which contain pixels of the sensitivity map S(x,y) with non-zero values are generally given by: (a) the parts of the first order diffraction beams that fall within the numerical aperture of the projection system PL; and (b) the corresponding parts of the 0$^{th}$ order diffraction beams for those pole regions 8. In the extreme case of FIG. 25A, the localized portions of the projection system pupil plane $PP_{PL}$ which contain pixels of the sensitivity map S(x,y) with non-zero values are those parts of the projection system pupil plane $PP_{PL}$ that receive both a zeroth order diffraction beam for one of the pole regions 8 and one of the ±1$^{st}$ order diffraction beam from the other pole region 8 (i.e. the overlap between the zeroth order diffraction beam for one of the pole regions 8 and one of the ±1$^{st}$ order diffraction beam from the other pole region 8).

Figure 25D:
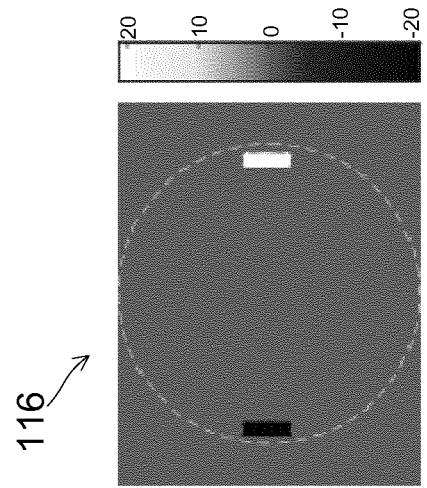

From FIGS. 25C-25E, it can be seen that for illumination modes wherein substantially all of one of the first order diffraction beams from each of the pole regions 8 falls within the numerical aperture of the projection system PP, the localized portions of the projection system pupil plane $PP_{PL}$ which contain pixels of the sensitivity map S(x,y) with non-zero values are generally given by the whole of said first order diffraction beam and the corresponding 0$^{th}$ order diffraction beam.

Figure 26:
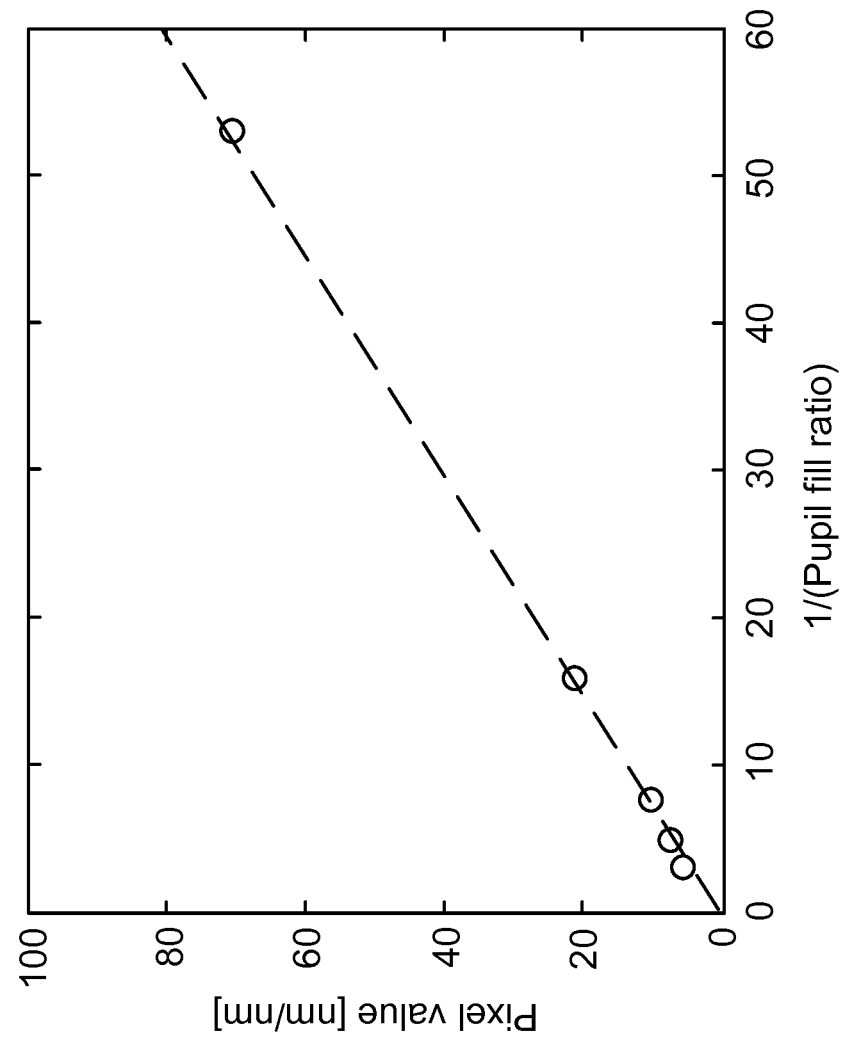
FIG. 26 shows a plot of the average value of the non-zero pixels of the sensitivity maps shown in FIGS. 25A-25E against the inverse of the pupil fill ratio of the corresponding illumination modes (shown in FIGS. 23A-23E respectively)

Furthermore, it can be seen from FIGS. 25A-25E that the overall scale of the non-zero pixels is inversely proportional to the pupil fill ratio of the illumination mode. For example, the dipole distribution 100 shown in FIG. 23A has the largest pupil fill ratio with the dipole distributions 100, 102, 104, 106, 108 shown in FIGS. 23A-23E having progressively smaller pupil fill ratios. FIG. 26 shows a plot 120 of the average value of the non-zero pixels of the sensitivity maps 110, 112, 114, 116, 118 against the inverse of the pupil fill ratio of the corresponding illumination modes 100, 102, 104, 106, 108 (shown in FIGS. 23A-23E). It can be seen from FIG. 26 that the average value of the non-zero pixels of the sensitivity maps 110, 112, 114, 116, 118 is linearly proportional to the inverse of the pupil fill ratio of the corresponding illumination modes 100, 102, 104, 106, 108 (shown in FIGS. 23A-23E). Furthermore, it can be seen from FIG. 26 constant of proportionality (i.e. the slope of the plot 120) is given by the numerical aperture of the projection system PL (i.e. 1.35). This can be understood as follows.

Recall (see equation (3)) that the lithographic effect L (for example the shift of the image in the x-direction relative to a nominal position) is given by the inner product of the sensitivity map S(x,y) with the wavefront aberration map W(x,y). Suppose the image is displaced in the x direction by an offset dx=1 nm. This is equivalent of a tilt of the wavefront in the x direction of −1/NA, where NA is the numerical aperture of the projection system PL. By considering the relative phase error (relative, for example, to a nominal phase) for a part of the wavefront where the radiation is at an angle α relative to an optical axis of the projection system, it can be shown that the relative phase error is given by the product of the offset dx with −sin(α). Furthermore, sin(α)=(NA·x)/n, where x is the x-position of the corresponding part of the projection system pupil plane plane $PP_{PL}$ and n is the index of refraction of the imaging medium. Therefore, the wavefront map is given by:

$$W(x, y) \sim -\frac{NA}{n} \cdot x \cdot dx. \tag{10}$$

The inner product of this wavefront map with the wavefront sensitivity map S(x,y) should equal dx, i.e. a displacement of 1 nm (cf. equation (3)). Since only the non-zero pixels of the wavefront sensitivity map S(x,y) contribute to this inner product, the average value of the non-zero pixels in the wavefront sensitivity map S(x,y) scale with the inverse of the pupil fill ratio of the corresponding illumination mode. Considering the case when the pupil fill ratio of the illumination mode equals 1, it can be seen that the constant of proportionality is given by the numerical aperture NA of the projection system PL.

Note that this example process (imaging pattern 90 with one of the dipole modes 100-108) is a relevant one since this is close to the resolution limit of the projection system PL. If the pitch of the pattern 90 is reduced (relative to the wavelength of the radiation) eventually only one diffraction order (the 0$^{th}$ order beams from the two poles 8) will be captured by the projection system PL, in which case no image will be formed (the 0$^{th}$ order beams only contain a constant offset value and do not contain any information about the lines 94, 96 in the pattern 90). In contrast, if the pitch 90 of the pattern 90 is increased (relative to the wavelength of the radiation) other, higher order diffraction orders may be captured by the projection system PL. For such larger pitch patterns, the scaling of the average value of the non-zero pixels in the wavefront sensitivity map S(x,y) with the inverse of the pupil fill ratio will no longer be linear. However, even for such larger pitch patterns the phenomenon is still observed: higher sensitivity is provided by using an illumination mode with lower pupil fill ratio.

It will be appreciated that as used herein the terms lithographic effect and lithographic quantity are synonymous. It will be further appreciated that the terms lithographic effect and lithographic quantity generally refer to an effect or quantity within an image formed by a lithographic apparatus.

FIGS. 27A-27E show the sensitivity maps 122, 124, 126, 128, 130 for the shift in the z direction of plane of best focus relative to a nominal image plane for the pattern 90 using an illumination mode having a dipole distribution 100, 102, 104, 106, 108 as shown in FIGS. 23A-23E respectively.

Figure 28:
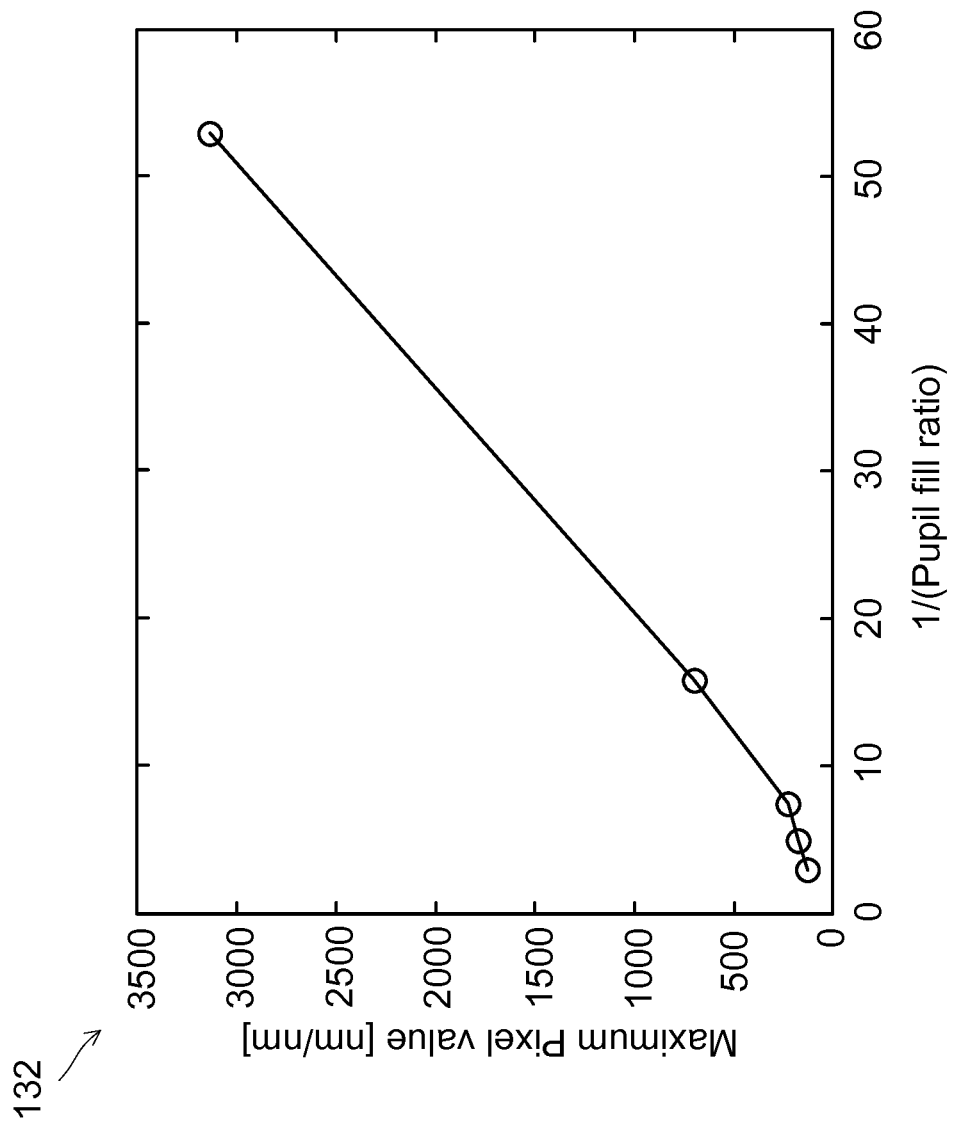
FIG. 28 shows a plot of the maximum value of the non-zero pixels of the sensitivity maps shown in FIGS. 27A-27E against the inverse of the pupil fill ratio of the corresponding illumination modes (shown in FIGS. 23A-23E respectively)

Again, it can be seen from FIGS. 27A-27E that only two localized portions of the projection system pupil plane PP$_{PL}$ receive radiation. The two localized portions which contain pixels of the sensitivity map S(x,y) with non-zero values are the same as those shown in FIGS. 25A-25E. Furthermore, it can be seen from FIGS. 27A-27E that again the overall scale of the non-zero pixels is inversely proportional to the pupil fill ratio of the illumination mode. FIG. 28 shows a plot 132 of the maximum value of the non-zero pixels of the sensitivity maps 122, 124, 126, 128, 130 against the inverse of the pupil fill ratio of the corresponding illumination modes 100, 102, 104, 106, 108 (shown in FIGS. 23A-23E). By considering the relative phase error (relative, for example, to a nominal phase) for a part of the wavefront where the radiation is at an angle α relative to an optical axis of the projection system, it can be shown that the relative phase error is proportional to a product of a defocus dz (the shift in the z direction of plane of best focus relative to a nominal image plane) with cos(α). Furthermore, sin(α)=(NA·r)/n, where r is the radial position of the corresponding part of the projection system pupil plane PP$_{PL}$ (r$^2$=x$^2$+y$^2$) and n is the index of refraction of the imaging medium. Therefore, for defocus, the wavefront map is given by:

$$W(x,y) \sim \sqrt{1 - \frac{NA^2}{n^2} \cdot (x^2 + y^2)}. \quad (11)$$

It can be seen from FIG. 28 that for this lithographic effect (focus) the scaling of the average value of the non-zero pixels of the sensitivity maps S(x,y) to the inverse of the pupil fill ratio of the corresponding illumination modes 100, 102, 104, 106, 108 (shown in FIGS. 23A-23E) is more complex (i.e. no longer linear).

In the above-described embodiments, the sensitivity map S(x,y) is defined (see equation (3)) such that the lithographic effect L is given by the inner product of the sensitivity map S(x,y) with a wavefront aberration map W(x,y). It will be appreciated that all of the above-described methods may also be applied to a sensitivity map that is defined such that the lithographic effect L is given by the inner product of the sensitivity map S(x,y) with a relative intensity map A(x,y). The relative intensity map A(x,y) may also be referred to as an apodization map A(x,y). In principle, as will be understood by the skilled person, the above described methods and techniques may be applied to any pupil function variations (either intensity or phase).

Figure 29:
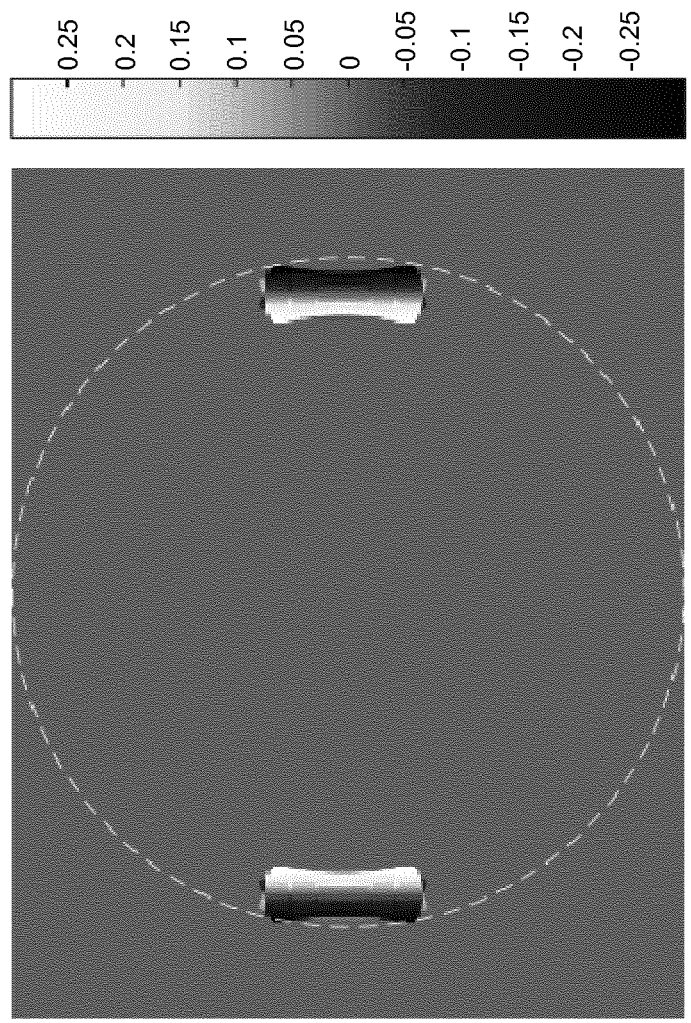
FIG. 29 shows an apodization sensitivity map for the printed critical dimension for the pattern shown in FIG. 22A imaged using the dipole illumination mode shown in FIG. 23C. That is, the printed critical dimension is given by the inner product of the sensitivity map with a relative intensity map.

FIG. 29 shows an apodization sensitivity map 134 for the printed critical dimension for the pattern 90 shown in FIG. 22A imaged using the dipole illumination mode 104 shown in FIG. 23C. That is, the printed critical dimension is given by the inner product of the sensitivity map 134 with a relative intensity map A(x,y).

While specific embodiments of the invention have been described above, it will be appreciated that the invention may be practiced otherwise than as described. The description is not intended to limit the invention.

The invention claimed is:

1. A method comprising:
   determining a discrete, two-dimensional sensitivity map in a pupil plane of a lithographic apparatus, wherein a lithographic effect within the lithographic apparatus is given by an inner product of the sensitivity map with a discrete, two-dimensional pupil function variation map of a radiation beam in the pupil plane, and wherein the determining the sensitivity map in the pupil plane comprises:
   determining a plurality of pixels comprising a pixel of the sensitivity map in the pupil plane, wherein determining the pixel of the sensitivity map in the pupil plane comprises:
      determining an image that results from a pixel of the pupil function variation map corresponding to the pixel of the sensitivity map in the pupil plane having a non-nominal value and all other pixels of the pupil function variation map having nominal values;
      determining the lithographic effect from the determined image; and
      determining the pixel of the sensitivity map in the pupil plane based on the determined lithographic effect and the non-nominal value.

2. The method of claim 1, wherein prior to the determination of the plurality of pixels, the method further comprises:
   determining nominal partial images that result from pixels of the of the pupil function variation map having nominal values, wherein an image with no pupil function variations is given by a sum of the nominal partial images; and
   storing the nominal partial images for use during determination of the plurality of pixels.

3. The method of claim 2, further comprising:
   determining a total image with no pupil function variations based on the nominal partial images; and
   storing the total image prior to determination of the plurality of pixels.

4. The method of claim 2, wherein:
   the determining the pixel of the pupil function variation map further comprises determining non-nominal partial images that result from the pixel of the pupil function variation map having the non-nominal value and all other pixels of the pupil function variation map having nominal values; and
   the determining the image that results from the one pixel of the pupil function variation map having the non-nominal value and all other pixels of the pupil function variation map having nominal values is based on a sum of the non-nominal partial images the partial images that result from the pixels of the pupil plane function variation map having nominal values.

5. The method of claim 4, wherein the determining the image that results from the pixel of the pupil function variation map having the non-nominal value and all other pixels of the pupil function variation map having nominal values comprises:
   subtracting the nominal partial images from a stored total image; and
   adding the non-nominal partial images to the stored total image.

6. The method of claim 1, wherein the sensitivity map is determined for a portion of the pupil plane which contributes to an image formed by the lithographic apparatus.

7. The method of claim 1, wherein the sensitivity map in a first portion of the pupil plane is determined and the sensitivity map in a second portion of the pupil plane is determined from the sensitivity map in the first portion of the pupil plane.

8. A method comprising:
selecting one or more parameters of a lithographic process in dependence on a sensitivity map determined by:
determining a discrete, two-dimensional sensitivity map in a pupil plane of a lithographic apparatus, wherein a lithographic effect within the lithographic apparatus is given by an inner product of the sensitivity map with a discrete, two-dimensional pupil function variation map of a radiation beam in the pupil plane, and wherein the determining the sensitivity map in the pupil plane comprises:
determining a plurality of pixels, the plurality of pixels comprising a pixel of the sensitivity map in the pupil plane, wherein determining the pixel of the sensitivity map in the pupil plane comprises:
determining an image that results from a pixel of the pupil function variation map corresponding to the pixel of the sensitivity map in the pupil plane having a non-nominal value and all other pixels of the pupil function variation map having nominal values;
determining the lithographic effect from the determined image; and
determining the pixel of the sensitivity map in the pupil plane based on the determined lithographic effect and the non-nominal value.

9. The method of claim 8, wherein the one or more parameters of the lithographic process comprises an illumination mode.

10. The method of claim 9, wherein a rotationally symmetric illumination mode is selected, such that an intensity of radiation in an illuminator pupil plane is dependent on a radial coordinate.

11. The method of claim 8, wherein the one or more parameters of the lithographic process comprises a reticle pattern.

12. The method of claim 8, wherein the method uses a non-linear least squares procedure which involves a minimization of a merit function from a starting condition, the merit function having a set of tunable parameters.

13. The method of claim 8, wherein the one or more parameters of the lithographic process are selected such that, for a selected lithographic effect, the sensitivity map is substantially sensitive to only one or more Zernike contributions to be measured.

14. A method comprising:
forming an image of a patterning device on at least one target region of a resist covered substrate;
processing the substrate;
inspecting the image formed on the at least one target region; and
determining one or more aberrations based on the inspecting,
wherein the image of the patterning device is formed using one or more parameters of a lithographic process selected by:
determining a discrete, two-dimensional sensitivity map in a pupil plane of a lithographic apparatus, wherein a lithographic effect within the lithographic apparatus is given by an inner product of the sensitivity map with a discrete, two-dimensional pupil function variation map of a radiation beam in the pupil plane, and wherein the determining the sensitivity map in the pupil plane comprises:
determining a plurality of pixels, the plurality of pixels comprising a pixel of the sensitivity map in the pupil plane, wherein determining the pixel of the sensitivity map in the pupil plane comprises:
determining an image that results from a pixel of the pupil function variation map corresponding to the pixel of the sensitivity map in the pupil plane having a non-nominal value and all other pixels of the pupil function variation map having nominal values;
determining the lithographic effect from the determined image; and
determining the pixel of the sensitivity map in the pupil plane based on the determined lithographic effect and the non-nominal value.

15. The method of claim 14, further comprising correcting for the one or more aberrations.

16. A lithographic apparatus configured to carry out a method for quantifying an effect of pupil function variations on a lithographic effect within a lithographic apparatus, the lithographic apparatus comprising:
an illumination system configured to illuminate a pattern of a patterning device; and
a projection system configured to project an image of the patterning device onto a substrate, wherein:
the lithographic apparatus is further configured to determine a discrete, two-dimensional sensitivity map in a pupil plane,
a lithographic effect within the lithographic apparatus is given by an inner product of the sensitivity map with a discrete, two-dimensional pupil function variation map of a radiation beam in the pupil plane, and
the determining the sensitivity map in the pupil plane comprises:
determining a plurality of pixels, the plurality of pixels comprising a pixel of the sensitivity map in the pupil plane, wherein determining the pixel of the sensitivity map in the pupil plane comprises:
determining an image that results from a pixel of the pupil function variation map corresponding to the pixel of the sensitivity map in the pupil plane having a non-nominal value and all other pixels of the pupil function variation map having nominal values;
determining the lithographic effect from the determined image; and
determining the pixel of the sensitivity map in the pupil plane based on the determined lithographic effect and the non-nominal value.

* * * * *

UNITED STATES PATENT AND TRADEMARK OFFICE
CERTIFICATE OF CORRECTION

| | |
|---|---|
| PATENT NO. | : 10,996,567 B2 |
| APPLICATION NO. | : 16/622250 |
| DATED | : May 4, 2021 |
| INVENTOR(S) | : Johannes Jacobus Matheus Baselmans, Bart Smeets and Cristina Ioana Toma |

Page 1 of 1

It is certified that error appears in the above-identified patent and that said Letters Patent is hereby corrected as shown below:

In the Claims

In Column 42, Line 26, replace "of the of the" with --of the--.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*